(12) United States Patent
Tran et al.

(10) Patent No.: US 8,614,924 B2
(45) Date of Patent: Dec. 24, 2013

(54) NON-VOLATILE MEMORY SYSTEMS AND METHODS

(71) Applicant: Silicon Storage Technology Inc., Sunnyvale, CA (US)

(72) Inventors: Hieu Van Tran, San Jose, CA (US); Sakhawat M. Khan, Fort Lauderdale, FL (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 13/866,966

(22) Filed: Apr. 19, 2013

(65) Prior Publication Data

US 2013/0235664 A1  Sep. 12, 2013

Related U.S. Application Data

(60) Division of application No. 12/961,458, filed on Dec. 6, 2010, now Pat. No. 8,432,750, which is a continuation of application No. 12/275,191, filed on Nov. 20, 2008, now Pat. No. 7,848,159, which is a division of application No. 11/726,913, filed on Mar. 22, 2007, now Pat. No. 7,471,581, which is a continuation of application No. 10/764,381, filed on Jan. 22, 2004, now Pat. No. 7,196,927, which is a division of application No. 10/211,886, filed on Aug. 1, 2002, now Pat. No. 6,865,099, which is a continuation-in-part of application No. 09/929,542, filed on Aug. 13, 2001, now Pat. No. 6,751,118, which is a division of application No. 09/231,928, filed on Jan. 14, 1999, now Pat. No. 6,282,145.

(51) Int. Cl.
*G11C 7/00* (2006.01)

(52) U.S. Cl.
USPC ............ 365/189.15; 365/189.14; 365/185.22; 365/210.1

(58) Field of Classification Search
USPC ................ 365/189.14, 189.15, 185.22, 210.1
See application file for complete search history.

(56) References Cited

U.S. PATENT DOCUMENTS 3,748,476 A   7/1973  Lippman et al.
4,054,864 A   10/1977 Audaire et al.
(Continued)

FOREIGN PATENT DOCUMENTS

EP   0 580 467 B1   9/1998
JP   10-214494      8/1998
(Continued)

OTHER PUBLICATIONS

"Japanese develop nondestructive analog semiconductor memory," *Electronics*, Jul. 11, 1974, pp. 29-30.
(Continued)

*Primary Examiner* — Son Dinh
(74) *Attorney, Agent, or Firm* — DLA Piper LLP (US)

(57) ABSTRACT

A high speed voltage mode sensing is provided for a digital multibit non-volatile memory integrated system. An embodiment has a local source follower stage followed by a high speed common source stage. Another embodiment has a local source follower stage followed by a high speed source follower stage. Another embodiment has a common source stage followed by a source follower. An auto zeroing scheme is used. A capacitor sensing scheme is used. Multilevel parallel operation is described.

20 Claims, 56 Drawing Sheets

(56) References Cited

U.S. PATENT DOCUMENTS

| | | | |
|---|---|---|---|
| 4,078,261 A | 3/1978 | Millhollan et al. | |
| 4,181,980 A | 1/1980 | McCoy | |
| 4,415,992 A | 11/1983 | Adlhoch | |
| 4,439,842 A | 3/1984 | Malaviya | |
| 4,448,400 A | 5/1984 | Harari | |
| 4,612,629 A | 9/1986 | Harari | |
| 4,622,656 A | 11/1986 | Kamiya et al. | |
| 4,627,027 A | 12/1986 | Rai et al. | |
| 4,667,217 A | 5/1987 | Janning | |
| 4,771,404 A | 9/1988 | Mano et al. | |
| 4,794,565 A | 12/1988 | Wu et al. | |
| 4,890,259 A | 12/1989 | Simko | |
| 4,989,179 A | 1/1991 | Simko | |
| 5,029,130 A | 7/1991 | Yeh | |
| 5,042,009 A | 8/1991 | Kazerounian et al. | |
| 5,043,940 A | 8/1991 | Harari | |
| 5,083,294 A | 1/1992 | Okajima | |
| 5,119,330 A | 6/1992 | Tanagawa | |
| 5,150,327 A | 9/1992 | Matsushima et al. | |
| 5,172,338 A | 12/1992 | Mehrotra et al. | |
| 5,198,380 A | 3/1993 | Harari | |
| 5,218,569 A | 6/1993 | Banks | |
| 5,218,571 A | 6/1993 | Norris | |
| 5,220,531 A | 6/1993 | Blyth et al. | |
| 5,222,047 A | 6/1993 | Matsuda et al. | |
| 5,237,533 A | 8/1993 | Papaliolios | |
| 5,241,494 A | 8/1993 | Blyth et al. | |
| 5,243,239 A | 9/1993 | Khan et al. | |
| 5,258,759 A | 11/1993 | Cauwenberghs et al. | |
| 5,258,949 A | 11/1993 | Chang et al. | |
| 5,268,870 A | 12/1993 | Harari | |
| 5,283,761 A | 2/1994 | Gillingham | |
| 5,289,411 A | 2/1994 | Jeng et al. | |
| 5,293,560 A | 3/1994 | Harari | |
| 5,294,819 A | 3/1994 | Simko | |
| 5,297,096 A | 3/1994 | Terada et al. | |
| 5,305,273 A | 4/1994 | Jinbo | |
| 5,313,421 A | 5/1994 | Guterman et al. | |
| 5,336,936 A | 8/1994 | Allen et al. | |
| 5,352,934 A | 10/1994 | Khan | |
| 5,357,476 A | 10/1994 | Kuo et al. | |
| 5,365,486 A | 11/1994 | Schreck | |
| 5,371,031 A | 12/1994 | Gill et al. | |
| 5,388,064 A | 2/1995 | Khan | |
| 5,394,362 A | 2/1995 | Banks | |
| 5,412,601 A | 5/1995 | Sawada et al. | |
| 5,422,842 A | 6/1995 | Cernea et al. | |
| 5,440,505 A | 8/1995 | Fazio et al. | |
| 5,440,518 A | 8/1995 | Hazani | |
| 5,450,360 A | 9/1995 | Sato | |
| 5,475,634 A | 12/1995 | Wang et al. | |
| 5,477,499 A | 12/1995 | Van Buskirk et al. | |
| 5,479,170 A | 12/1995 | Cauwenberghs et al. | |
| 5,485,422 A | 1/1996 | Bauer et al. | |
| 5,487,033 A | 1/1996 | Keeney et al. | |
| 5,508,958 A | 4/1996 | Fazio et al. | |
| 5,511,020 A | 4/1996 | Hu et al. | |
| 5,511,021 A | 4/1996 | Bergemont et al. | |
| 5,521,865 A | 5/1996 | Ohuchi et al. | |
| 5,521,878 A | 5/1996 | Ohtani et al. | |
| 5,523,972 A | 6/1996 | Rashid et al. | |
| 5,526,315 A | 6/1996 | Kaya et al. | |
| 5,539,688 A | 7/1996 | Yiu et al. | |
| 5,539,690 A | 7/1996 | Talreja et al. | |
| 5,546,341 A | 8/1996 | Suh et al. | |
| 5,555,519 A | 9/1996 | Takashima et al. | |
| 5,566,111 A | 10/1996 | Choi | |
| 5,566,125 A | 10/1996 | Fazio et al. | |
| 5,570,319 A | 10/1996 | Santoro et al. | |
| 5,572,054 A | 11/1996 | Wang et al. | |
| 5,590,076 A | 12/1996 | Hadad et al. | |
| 5,592,415 A | 1/1997 | Kato et al. | |
| 5,596,526 A | 1/1997 | Assar et al. | |
| 5,615,159 A | 3/1997 | Roohparvar | |
| 5,615,163 A | 3/1997 | Sakui et al. | |
| 5,627,784 A | 5/1997 | Roohparvar | |
| 5,629,890 A | 5/1997 | Engh | |
| 5,633,822 A | 5/1997 | Campardo et al. | |
| 5,652,450 A | 7/1997 | Hirano | |
| 5,657,332 A | 8/1997 | Auclair et al. | |
| 5,663,923 A | 9/1997 | Baltar et al. | |
| 5,671,176 A | 9/1997 | Jang et al. | |
| 5,677,885 A | 10/1997 | Roohparvar | |
| 5,687,114 A | 11/1997 | Khan | |
| 5,691,945 A | 11/1997 | Liou et al. | |
| 5,694,356 A | 12/1997 | Wong et al. | |
| 5,708,620 A | 1/1998 | Jeong | |
| 5,712,815 A | 1/1998 | Bill et al. | |
| 5,721,704 A | 2/1998 | Morton | |
| 5,729,492 A | 3/1998 | Campardo | |
| 5,761,109 A | 6/1998 | Takashima et al. | |
| 5,761,117 A | 6/1998 | Uchino et al. | |
| 5,764,586 A | 6/1998 | Vanco et al. | |
| 5,773,997 A | 6/1998 | Stiegler | |
| 5,774,395 A | 6/1998 | Richart et al. | |
| 5,801,989 A | 9/1998 | Lee et al. | |
| 5,815,439 A * | 9/1998 | Korsh et al. | 365/185.24 |
| 5,818,759 A | 10/1998 | Kobayashi | |
| 5,835,411 A | 11/1998 | Briner | |
| 5,847,994 A | 12/1998 | Motoshima et al. | |
| 5,862,073 A | 1/1999 | Yeh et al. | |
| 5,896,340 A | 4/1999 | Wong et al. | |
| 5,914,907 A | 6/1999 | Kobayashi et al. | |
| 5,930,169 A | 7/1999 | Iwata et al. | |
| 5,936,906 A | 8/1999 | Tsen | |
| 5,943,263 A | 8/1999 | Roohparvar | |
| 5,969,987 A | 10/1999 | Blyth et al. | |
| 5,973,956 A | 10/1999 | Blyth et al. | |
| 5,973,966 A | 10/1999 | Calligaro et al. | |
| 6,002,614 A | 12/1999 | Banks | |
| 6,016,276 A | 1/2000 | Fuji | |
| 6,172,908 B1 | 1/2001 | Capelletti et al. | |
| 6,208,575 B1 | 3/2001 | Proebsting | |
| 6,282,145 B1 | 8/2001 | Tran et al. | |
| 6,345,000 B1 | 2/2002 | Wong et al. | |
| 6,590,820 B2 | 7/2003 | Nakagawa | |
| 7,161,378 B2 | 1/2007 | Kang et al. | |
| 7,345,512 B2 | 3/2008 | Tran et al. | |
| 7,616,028 B2 | 11/2009 | Tran et al. | |
| 7,855,583 B2 | 12/2010 | Tran et al. | |
| 2008/0239834 A1 | 10/2008 | Tran et al. | |

FOREIGN PATENT DOCUMENTS

| | | |
|---|---|---|
| WO | WO 90/12400 | 10/1990 |
| WO | WO 95/20224 | 7/1995 |
| WO | WO 96/04658 | 2/1996 |
| WO | WO 97/13250 | 4/1997 |
| WO | WO 98/08337 | 2/1998 |

OTHER PUBLICATIONS

Heald et al., "Multilevel Random-Access Memory Using One Transistor Per Cell," *IEEE J. Solid-State Circuits* (1976) SC-11:519-528.

Alberts et al, "Multi-Bit Storage FET EAROM Cell," *IBM Tech. Disclosure Bulletin* (1981) 24:3311-3314.

Eitan et al., "Hot-Electron Injection into the Oxide in n-Channel MOS Devices," *IEEE Transactions on Electron Devices* (1981) ED-28:328-340.

Kamiya et al., "EPROM Cell with High Gate Injection Efficiency," *IEDM 82* (1982) pp. 741-744.

Tam et al., "Lucky-Electron Model of Channel Hot-Electron Injection in MOSFET's," *IEEE Transactions on Electron Devices* (1984) ED-31:1116-1125.

Baglee et al., "The Effects of Write/Erase Cycling on Data Loss in EEPROMs," *IEDM*, Dec. 1-4, 1985, pp. 624-626.

Bleiker et al., "A Four-State EEPROM Using Floating-Gate Memory Cells," *IEEE J. Solid-State Circuits* (1987) SC-22:357-360.

Verma et al., "Reliability Performance of ETOX Based Flash Memories," *1988 IEEE International Reliability Physics Symposium*, Apr. 11-13, 1988, pp. 158-166.

(56) References Cited

OTHER PUBLICATIONS

Naruke et al., "Stress Induced Leakage Current Limiting to Scale Down EEPROM Tunnel Oxide Thickness," *IEDM*, Dec. 11-14, 1988, pp. 424-427.

Horiguchi et al., "An Experimental Large-Capacity Semiconductor File Memory Using 16-Levels/Cell Storage," *IEEE J. Solid-State Circuits* (1988) 23:27-33.

Furuyama et al., "An experimental 2-bit/cell storage DRAM for macro cell or memory-on-logic application," *IEEE 1988 Custom Integrated Circuits Conference*, pp. 4.4.1-4.4.4.

Kirisawa et al., "A NAND Structured Cell with a New Programming Technology for Highly Reliable 5V-only Flash EEPROM," *1990 Symposium on VLSI Technology*, Jun. 4-7, 1990, pp. 129-130.

Blyth et al., "A Non-Volatile Analog Storage Device Using EEPROM Technology," *1991 IEEE International Solid-State Circuits Conference*, pp. 192-193 & 315.

Goodenough, "IC Holds 16 Seconds of Audio Without Power," *Electronic Design*, Jan. 31, 1991, pp. 39-44.

Horio et al., "Analog Memories for VLSI Neurocomputing," *Analog Memory*, Paper 2.21, pp. 344-363.

Onoda et al., "A Novel Cell Structure Suitable for a 3 Volt Operation, Sector Erase Flash Memory," *IEDM*, Dec. 13-16, 1992, pp. 599-602.

Bergemont et al., "NOR Virtual Ground (NVG)—A New Scaling Concept for Very High Density Flash EEPROM and Its Implementation in a 0.5αm Process," *IEDM*, Dec. 3-8, 1993, pp. 15-18.

Ong et al., "Erratic Erase in ETOX Flash Memory Array," *1993 VLSI Symposium on Technology*, May 17-19, 1993, pp. 83-84.

Kobayashi et al., "Memory Array Architecture and Decoding Scheme for 3 V Only Sector Erasable Dinor Flash Memory," *IEEE J. Solid-State Circuits* (1994) 29:454-460.

Kato et al., "Read-Disturb Degradation Mechanism due to Electron Trapping in the Tunnel Oxide for Low-Voltage Flash Memories," *IEDM*, Dec. 11-14, 1994, pp. 45-48.

Peng et al., "Flash EPROM Endurance Simulation Using Physics-Based Models," *IEDM*, Dec. 11-14, 1994, pp. 295-298.

Cappelletti et al., "Failure Mechanisms of Flash Cell in Program/Erase Cycling," *IEDM*, Dec. 11-14, 1994, pp. 291-294.

Ria Au et al., "Neuron-MOS Multiple-Valued Memory Technology for Intelligent Data Processing," *1994 IEEE International Solid-State Circuits Conference*, pp. 270-271 & 351.

Kim et al., "A Novel Dual String NOR (DuSNOR) Memory Cell Technology Scalable to the 256 Mbit and 6 Gbit Flash Memories," *IEDM*, Dec. 10-13, 1995, pp. 263-266.

Yamauchi et al., "A New Cell Structure for Sub-quarter Micron High Density Flash Memory," *IEDM*, Dec. 10-13, 1995, pp. 267-270.

Van Houdt et al., "An Analytical Model for the Optimization of Source-Side Injection Flash EEPROM Devices," *IEEE Transactions on Electron Devices* (1995) 42:1314-1320.

Bauer et al., "A Multilevel Cell 32Mb Flash Memory," *1995 IEEE ISSCC*, Feb. 16, 1995, pp. 132-133 & 351.

Atsumi et al., "A 16Mb Flash EEPROM with a New Self-Data-Refresh Scheme for a Sector Erase Operation," *IEEE J. Solid-State Circuits* (1995) 29:461-469.

Shirota et al., "A New Programming Method and Cell Architecture and for Multi-Level NAND Flash Memories," *The 14th Annual IEEE Nonvolatile Semiconductor Memory Workshop*, Aug. 1995, Paper 2.7.

Jung et al., "A 3.3V 128Mb Multi-Level NAND Flash Memory for Mass Storage Applications," *1996 IEEE ISSCC*, Feb. 8, 1996, pp. 32-33 & 412.

Ohkawa et al., "A 98mm 3.3V 64Mb Flash Memory with FN-NOR Type 4-level Cell," *1996 IEEE ISSCC* Feb. 8, 1996, pp. 36-37 & 413.

* cited by examiner

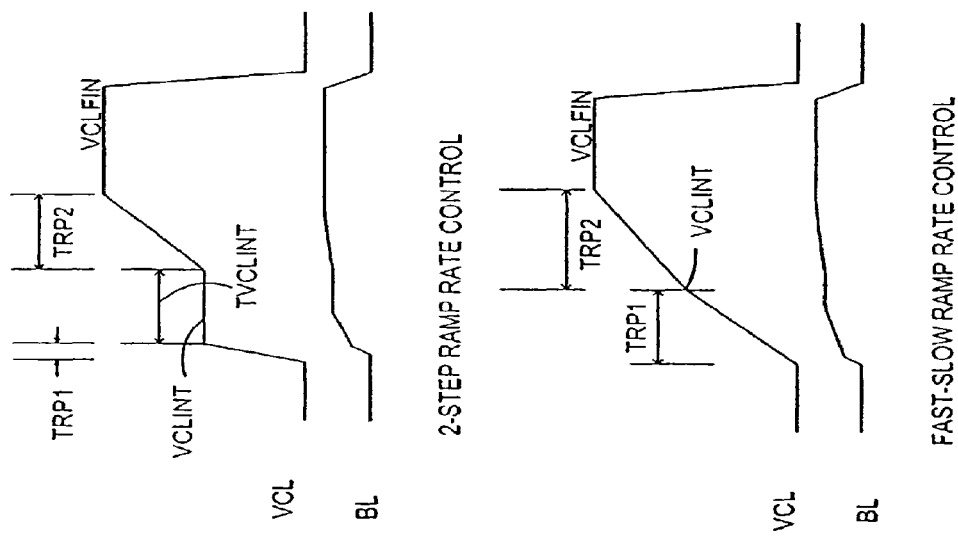

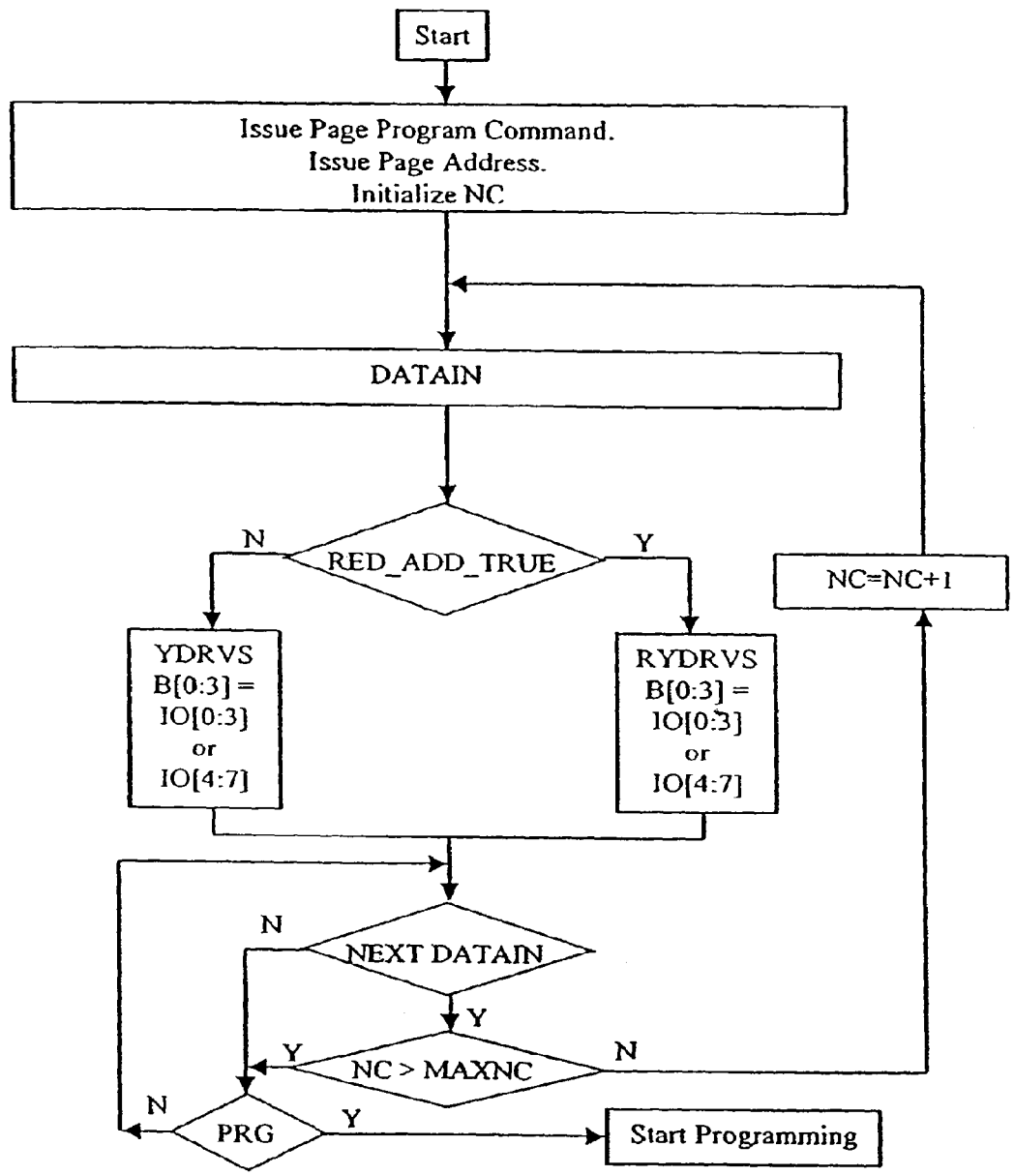
*FIG._20*

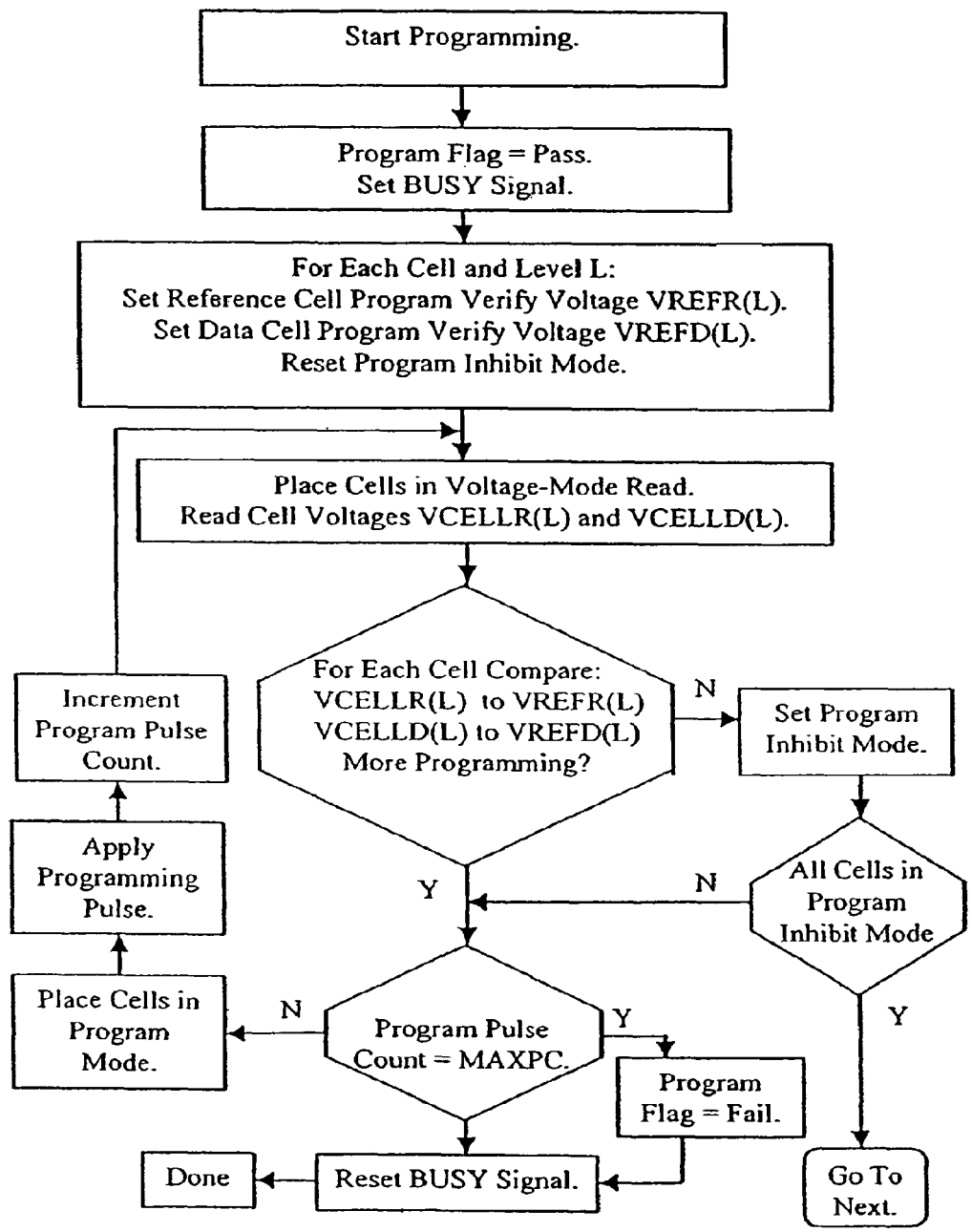
FIG._21

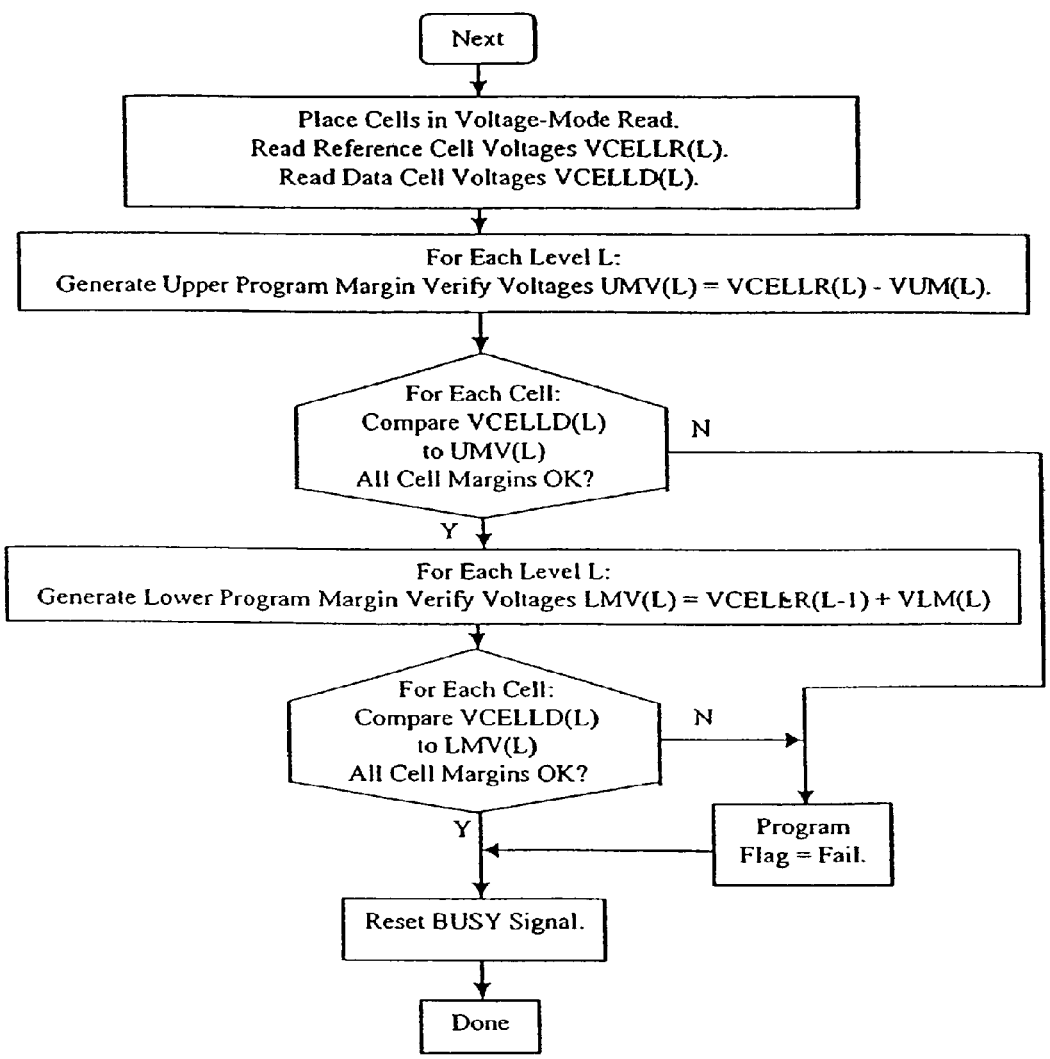
Fig._22A

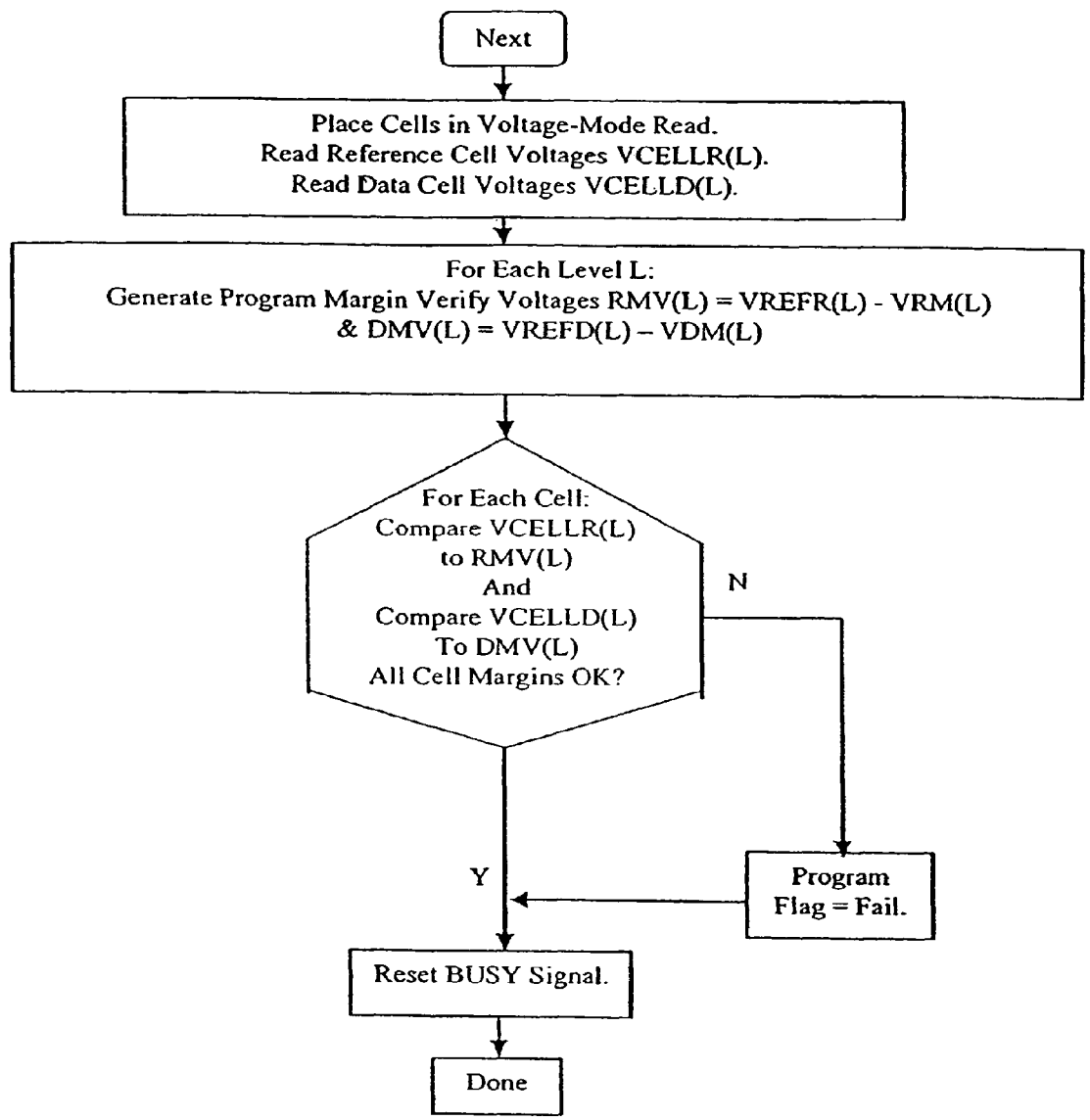
Fig._22B

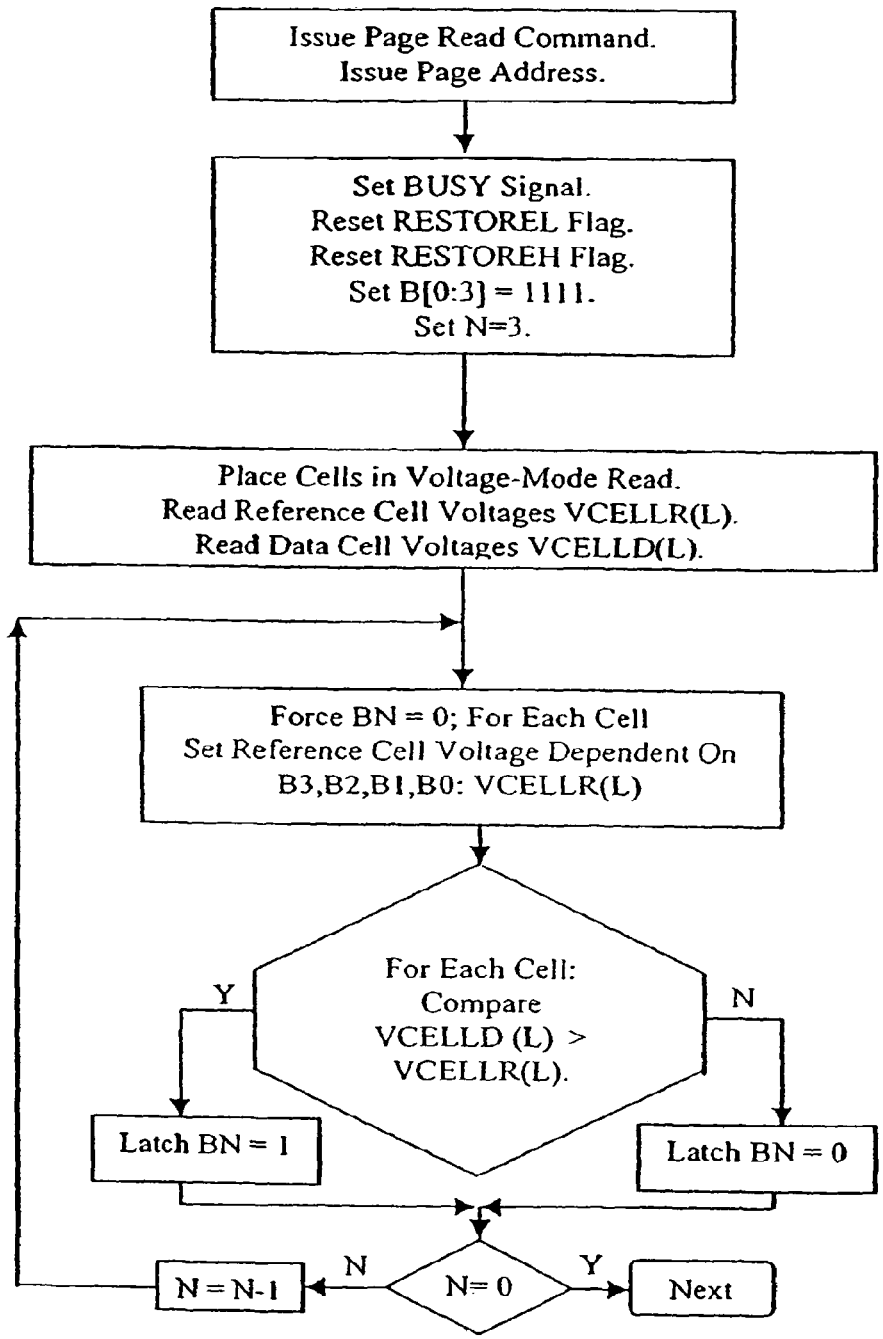
FIG._23

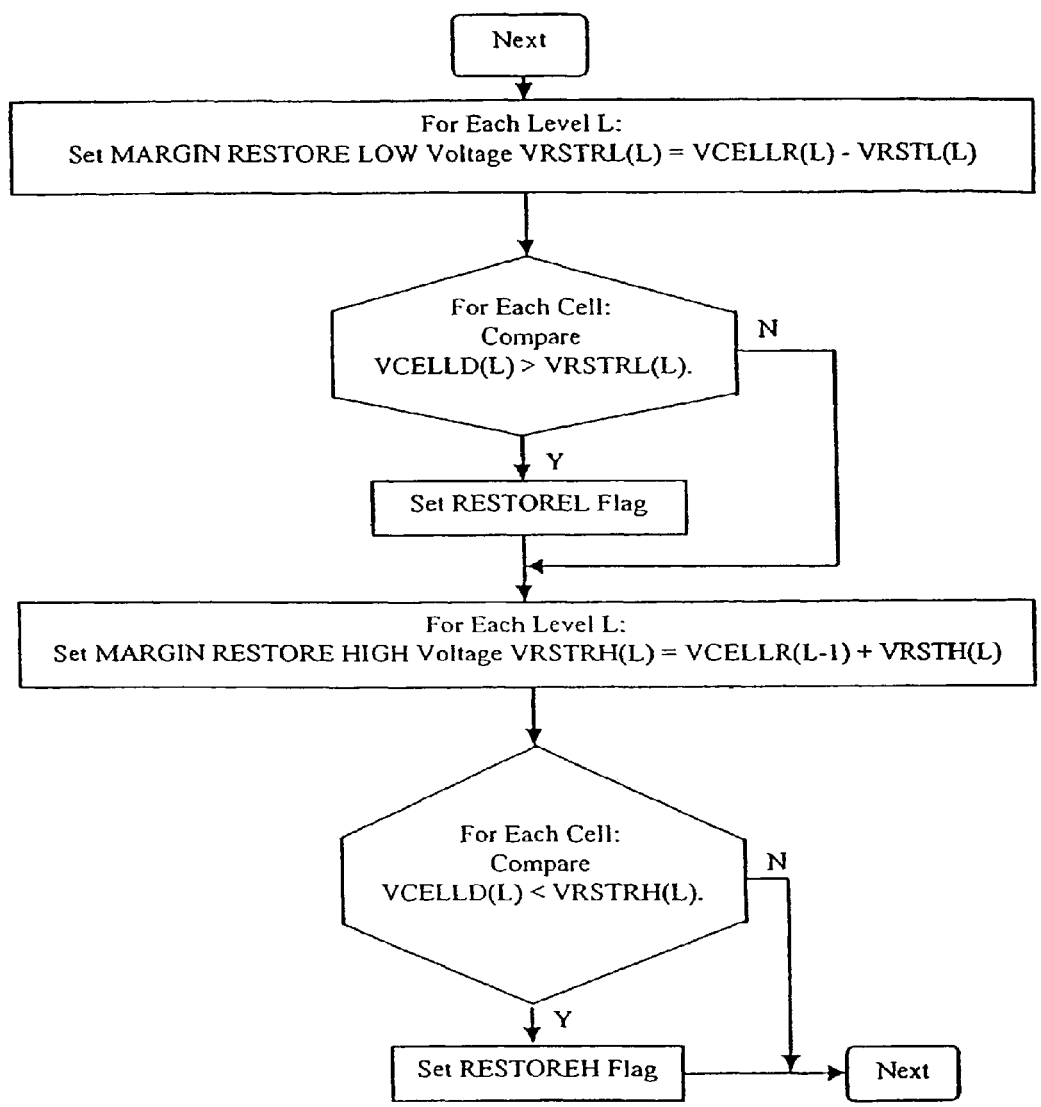
FIG._24

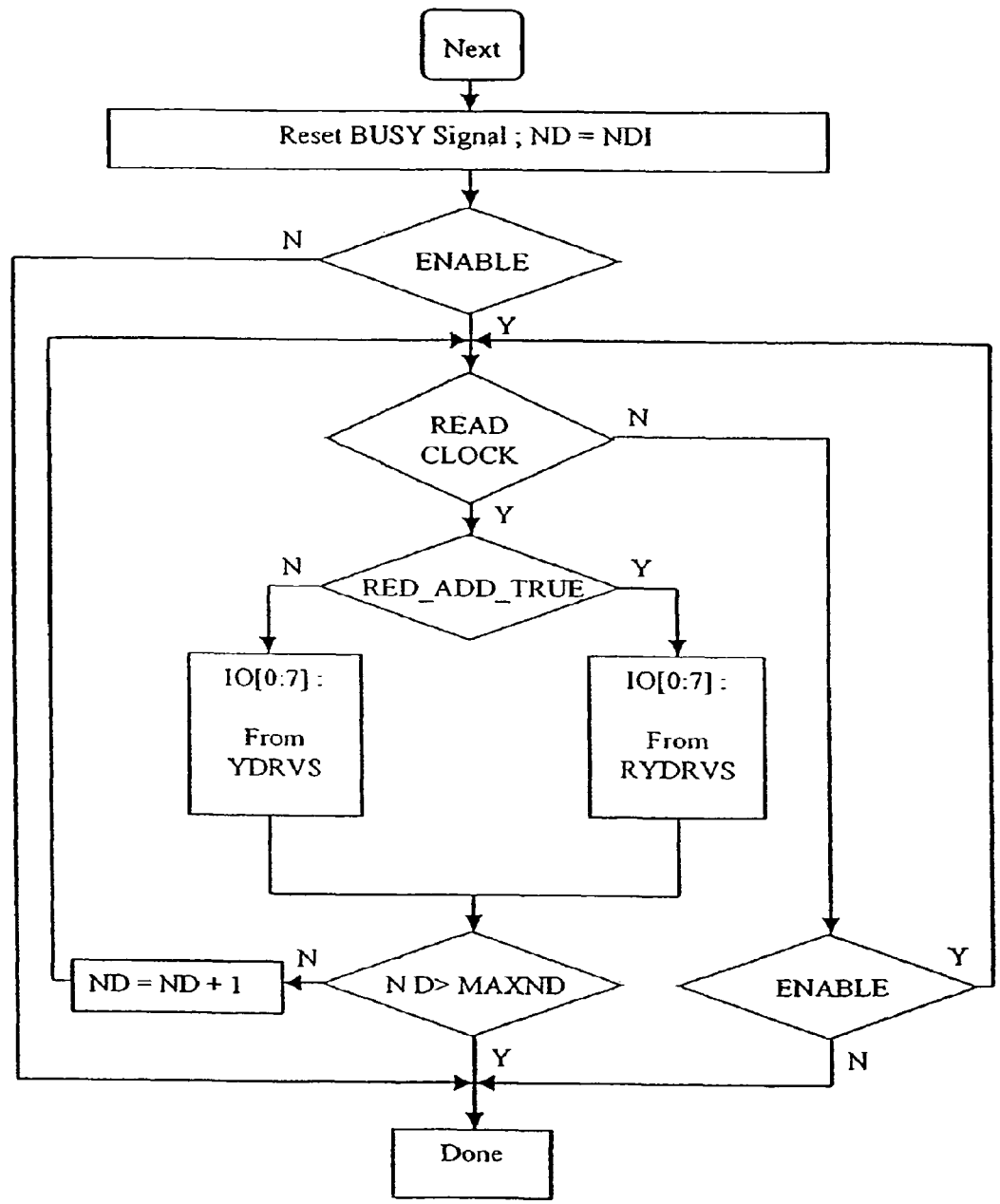
FIG._25

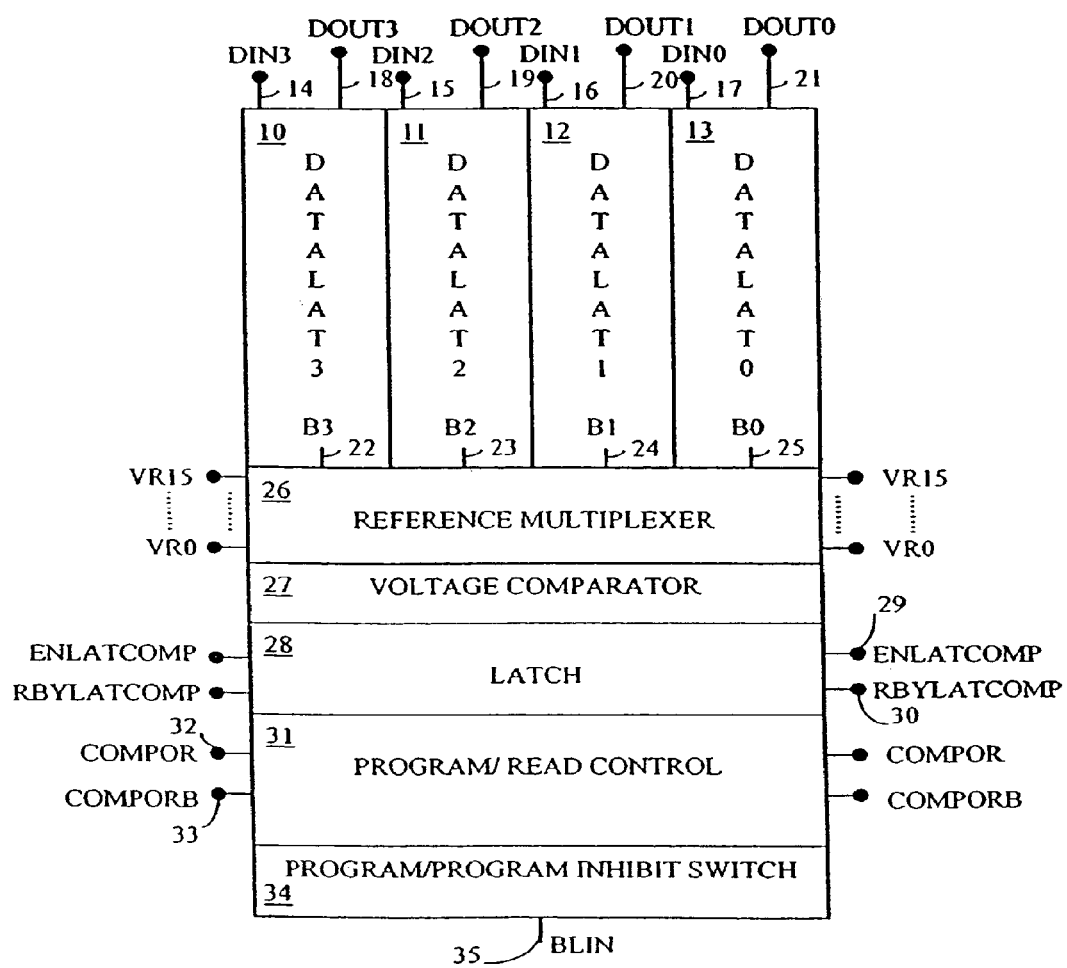
Fig. _26

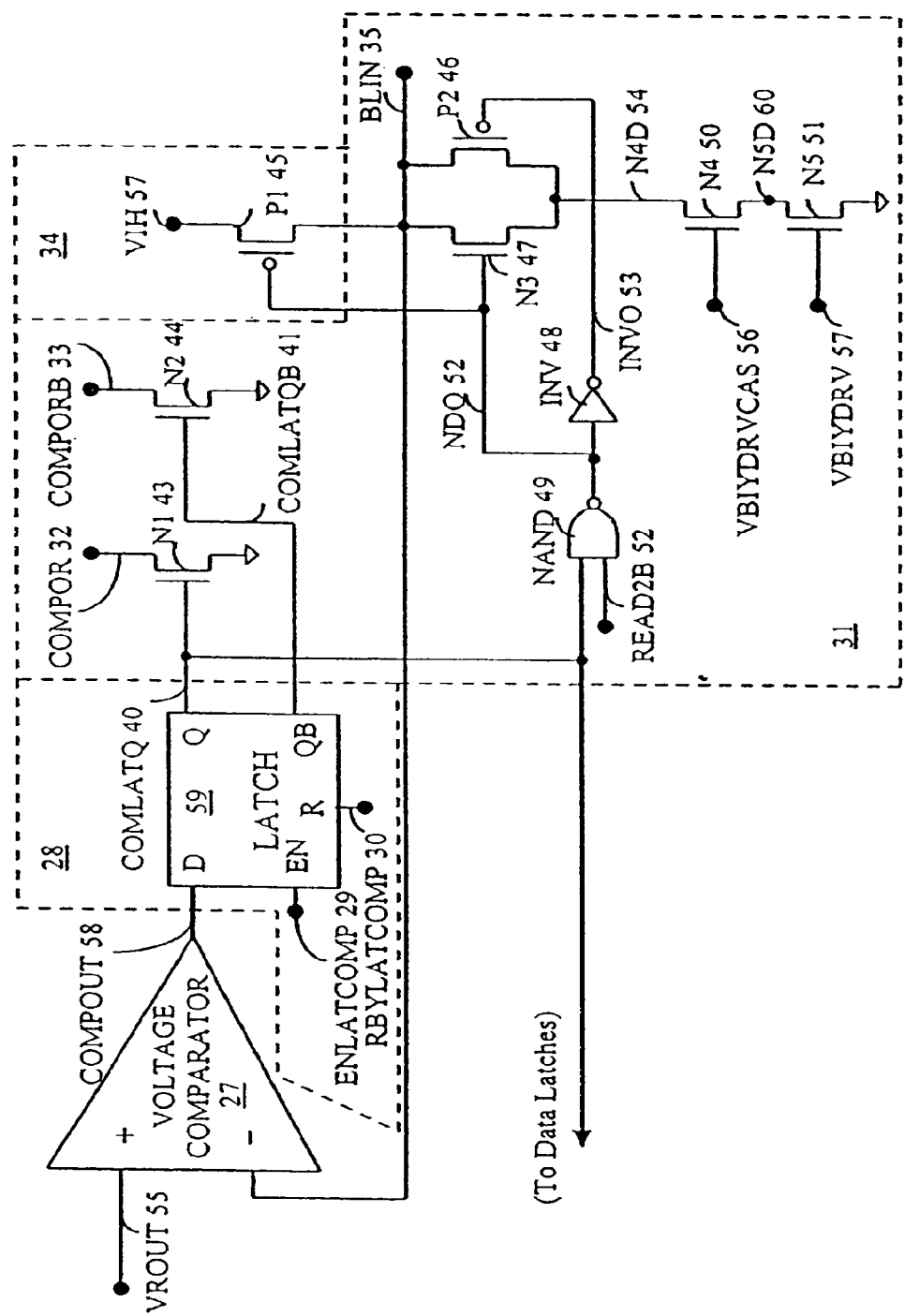
Fig._27

NON-VOLATILE MEMORY SYSTEMS AND METHODS

CROSS-REFERENCE TO RELATED APPLICATIONS

This is a division of Ser. No. 12/961,458, filed Dec. 6, 2010, published as US2011/0110170 A1, now U.S. Pat. No. 8,432,750, which is a continuation of Ser. No. 12/275,191, filed Nov. 20, 2008, now U.S. Pat. No. 7,848,159, which is a division of application Ser. No. 11/726,913, filed Mar. 22, 2007, published as US2007/0159904 A1, now U.S. Pat. No. 7,471,581, which is a continuation of application Ser. No. 10/764,381, filed Jan. 28, 2002, now U.S. Pat. No. 7,196,927, which is a division of application Ser. No. 10/211,886, filed Aug. 1, 2002, now U.S. Pat. No. 6,865,099, which is a continuation-in-part of application Ser. No. 09/929,542, filed Aug. 13, 2001, now U.S. Pat. No. 6,751,118, which is a division of application Ser. No. 09/231,928, filed Jan. 14, 1999, now U.S. Pat. No. 6,282,145, all of which are incorporated herein by reference in entirety.

BACKGROUND

1. Field

This invention relates in general to semiconductor memories, and, in particular, to the design and operation of multi-level nonvolatile semiconductor memories.

2. Description of Related Information

As the information technology progresses, the demand for high density giga bit and tera bit memory integrated circuits is insatiable in emerging applications such as data storage for photo quality digital film in multi-mega pixel digital camera, CD quality audio storage in audio silicon recorder, portable data storage for instrumentation and portable personal computers, and voice, data, and video storage for wireless and wired phones and other personal communicating assistants.

The nonvolatile memory technology such as ROM (Read Only Memory), EEPROM (Electrical Erasable Programmable Read Only Memory), or FLASH is often a technology of choice for these application due to its nonvolatile nature, meaning it still retains the data even if the power supplied to it is removed. This is in contrast with the volatile memory technology, such as DRAM (Dynamic Random Access Memory), which loses data if the power supplied to it is removed. This nonvolatile feature is very useful in saving the power from portable supplies, such as batteries. Until battery technology advances drastically to ensure typical electronic systems to function for a typical operating lifetime, e.g., 10 years, the nonvolatile technology will fill the needs for most portable applications.

The FLASH technology, due to its smallest cell size, is the highest density nonvolatile memory system currently available. The advance of the memory density is made possible by rapidly advancing the process technology into the realm of nano meter scale and possibly into the atomic scale and electron scale into the next century. At the present sub-micro meter scale, the other method that makes the super high-density memory system possible is through the exploitation of the analog nature of a storage element.

The analog nature of a flash or nonvolatile storage element provides, by theory, an enormous capability to store information. For example, if one electron could represent one bit of information then, for one typical conventional digital memory cell, the amount of information is equal to the number of electrons stored, or approximately a few hundred thousands. Advances in device physics exploring the quantum mechanical nature of the electronic structure will multiply the analog information manifested in the quantum information of a single electron even further.

The storage information in a storage element is hereby defined as a discrete number of storage levels for binary digital signal processing with the number of storage levels equal to $2^N$ with N equal to the number of digital binary bits. The optimum practical number of discrete levels stored in a nonvolatile storage element depends on the innovative circuit design method and apparatus, the intrinsic and extrinsic behavior of the storage element, all within constraints of a definite performance target, such as product speed and operating lifetime, with a certain cost penalty.

At the current state of the art, all the multilevel systems are only suitable for medium density, i.e. less than a few tens of mega bits, and only suitable for a small number of storage levels per cell, i.e., less than four levels or two digital bits.

As can be seen, memories having high storage capacity and fast operating speed are highly desirable.

SUMMARY OF THE INVENTION

This invention describes the design method and apparatus for a super high density nonvolatile memory system capable of giga to tera bits as applied to the array architecture, reference system, and decoding schemes to realize the optimum possible number of storage levels within specified performance constraints. Method and apparatus for multilevel program and sensing algorithm and system applied to flash memory is also described in this invention. Details of the invention and alternative embodiments will be made apparent by the following descriptions.

The invention provides array architectures and operating methods suitable for a super high density, in the giga to tera bits, for multilevel nonvolatile "green" memory integrated circuit system. "Green" refers to a system working in an efficient and low power consumption manner. The invention solves the issues associated with super high density multi-level memory system, such as, precision voltage control in the array, severe capacitive loading from MOS transistor gates and parasitics, high leakage current due to memory cells and from cells to cells, excessive power consumption due to large number of gates and parasitics, and excessive memory cell disturbances due to large memory density.

An aspect of the invention provides an Inhibit and Select Segmentation Scheme that makes use of a truly-floating-bitline scheme to greatly reduce the capacitance from junctions and parasitic interconnects to a small value.

The invention also provides a Multilevel Memory Decoding scheme which is capable of greater than 10-bit multilevel operation. The Multilevel Memory Decoding Scheme includes the Power Supply Decoded Decoding Scheme, the Feedthrough-to-Memory Decoding Scheme, and the Feedthrough-to-Driver Decoding Scheme. The Multilevel Memory Decoding scheme also includes a "winner-take-all" Kelvin Decoding Scheme, which provides precise bias levels for the memory at a minimum cost. The invention also provides a constant-total-current-program scheme. The invention also provides fast-slow and 2-step ramp rate control programming. The invention also presents reference system method and apparatus, which includes the Positional Linear Reference System, Positional Geometric Reference System, and the Geometric Compensation Reference System. The invention also describes apparatus and method of multilevel programming, reading, and margining.

A sense amplifier system includes local sense amplifiers coupled to memory subarrays and global sense amplifiers coupled to groups of local sense amplifiers.

Method and apparatus described herein are applicable to digital multilevel as well as analog multilevel system.

The foregoing, together with other aspects of this invention, will become more apparent when referring to the following specification, claims, and accompanying drawings.

BRIEF DESCRIPTION OF THE DRAWINGS

FIG. 5C is a 2-step ramp rate control and fast-slow ramp rate control.

FIG. 20 shows an embodiment of flow diagram of the page programming cycle.

FIG. 21 shows an embodiment of flow diagram after page programming begins.

FIG. 22A shows a continuation of flow diagram after page programming begins.

FIG. 22B shows an alternative embodiment of continuation of flow diagram after page programming begins shown in FIG. 22A.

FIG. 23 shows an embodiment of flow diagram of the page read cycle.

FIG. 24 shows a continuation of flow diagram of the page read cycle in FIG. 23.

FIG. 25 shows a continuation of flow diagram of the page read cycle in FIG. 24.

FIG. 26 shows details of an embodiment of a single y-driver YDRVS 110S.

FIG. 27 shows details of a latch block, a program/read control block, and program/program inhibit block included in the single y-driver YDRVS 110S.

DESCRIPTION OF THE SPECIFIC EMBODIMENTS

Memory Cell Technology

To facilitate the understanding of the invention, a brief description of a memory cell technology is described below.

In an embodiment the invention applies to Source Side Injection (SSI) flash memory cell technology, which will be referred to as SSI flash memory cell technology. The invention is equally applicable to other technologies such as drain-side channel hot electron (CHE) programming (ETOX), P-channel hot electron programming, other hot electron programming schemes, Fowler-Nordheim (FN) tunneling, ferroelectric memory, and other types of memory technology.

Figure 1B:
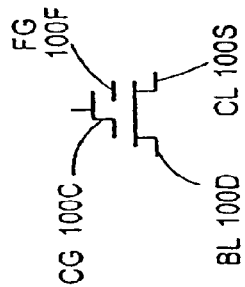
FIG. 1B is a transistor symbol corresponding to the source side injection flash memory cell shown in FIG. 1A.
Figure 1A:
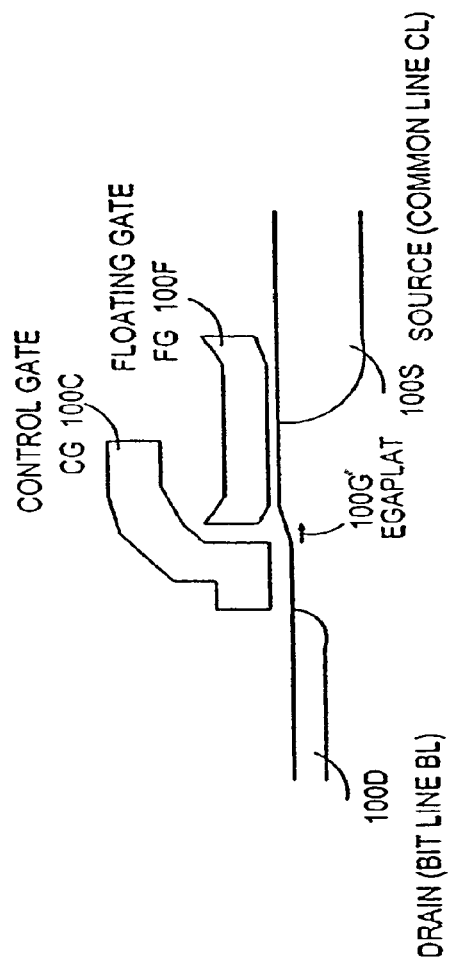
FIG. 1A is a cross section of a source side injection flash memory cell.

A cell structure of one typical SSI flash cell is symbolically shown in FIG. 1A. Its corresponding transistor symbol is shown in FIG. 1B. The cell is made of two polysilicon gates (abbreviated as poly), a floating gate poly FG 100F and a control gate poly CG 100C. The control gate CG 100C also acts as a select gate that individually select each memory cell. This has the advantage of avoiding the over erase problem which is typical of stacked gate CHE flash cell. The floating gate has a poly tip structure that points to the CG 100C, this is to enhance the electric field from the FG 100F to the CG 100C which allows a much lower voltage in FN erase without using a thin interpoly oxide.

The thicker interpoly oxide leads to a higher reliability memory cell. The cell is also fabricated such that a major portion of the FG 100F overlaps the source junction 100S. This is to make a very high coupling ratio from the source 100S to FG 100F, which allows a lower erase voltage and is advantageous to the SSI programming, which will be described shortly. A structural gap between the FG 100F and at CG 100C is also advantageous for the efficient SSI programming.

The SSI flash memory cell enables low voltage and low power performance due to its intrinsic device physics resulting from its device structure. The SSI flash cell uses efficient FN tunneling for erase and efficient SSI for programming. The SSI flash cell programming requires a small current in hundreds of nano amps and a moderate voltage range of ~8 to 11 volts. This is in contrast to that of a typical drain-side channel hot electron memory cell programming which requires current in hundreds of microamp to milliamp range and a voltage in the range of 11 to 13 volts.

The SSI flash memory cell erases by utilizing Fowler-Nordheim tunneling from the floating gate poly to the control gate poly by applying a high erase voltage on the control gate CG 100C, e.g., 8-13 volts, and a low voltage on the source 100S, e.g., 0-0.5 volts. The high erase voltage together with high coupling from the source to the floating gate creates a localized high electric field from the FG 100F tip to the CG 100C and causes electrons to tunnel from the FG 100F to the CG 100C near the tip region. The resulting effect causes a net positive charge on the FG 100F.

The SSI flash memory cell programs by applying a high voltage on the source 100S (herein also known as common line CL), e.g., 4-13 V, a low voltage on the CG 100C, e.g., 0.7-2.5 V, and a low voltage on the drain 100D (herein also known as the bitline BL), e.g., 0-1V. The high voltage on the source 100S strongly couples to the FG to strongly turn on the channel under the FG (it will be equivalently referred to as the FG channel). This in turn couples the high voltage on the source 100S toward the gap region. The voltage on the CG 100C turns on the channel directly under the CG 100C (it will be equivalently referred to as the CG channel). This in turn couples the voltage on the drain 100D toward the gap region. Hence, the electrons flow from the drain junction 100D through the CG channel, through the gap channel, through the FG channel, and finally arrive at the source junction.

Due to the gap structure between the CG 100C and the FG 100F, in the channel under the gap, there exists a strong lateral electric field (EGAPLAT) 100G. As the EGAPLAT 100G reaches a critical field, electrons flowing across the gap channel become hot electrons. A portion of these hot electrons gains enough energy to cross the interface between the silicon and silicon dioxide into the silicon dioxide. And as the vertical field Ev is very favorable for electrons to move from the channel to the FG 100F, many of these hot electrons are swept toward the FG 100F, thus, reducing the voltage on the FG 100F. The reduced voltage on the FG 100F reduces electrons flowing into the FG 100F as programming proceeds.

Due to the coincidence of favorable Ev and high EGAPLAT 100G in the gap region, the SSI memory cell programming is more efficient over that of the drain-side CHE programming, which only favors one field over the other. Programming efficiency is measured by how many electrons flow into the floating gate as a portion of the current flowing in the channel. High programming efficiency allows reduced power consumption and parallel programming of multiple cells in a page mode operation.

Multilevel Memory Integrated Circuit System:

The challenges associated with putting together a billion transistors on a single chip without sacrificing performance or cost are tremendous. The challenges associated with designing consistent and reliable multilevel performance for a billion transistors on a single chip without sacrificing performance or cost are significantly more difficult. The approach taken here is based on the modularization concept. Basically everything begins with a manageable optimized basic unitary block. Putting appropriate optimized unitary blocks together makes the next bigger optimized block.

A super high density nonvolatile multilevel memory integrated circuit system herein described is used to achieve the performance targets of read speed, write speed, and an operating lifetime with low cost. Read speed refers to how fast data could be extracted from a multilevel memory integrated circuit system and made available for external use such as for the system microcontroller 2001 shown in FIG. 1C which is described later. Write speed refers to how fast external data could be written into a multilevel memory integrated circuit system. Operating lifetime refers to how long a multilevel memory integrated circuit system could be used in the field reliably without losing data.

Speed is modularized based on the following concept, $T=CV/I$, where switching time T is proportional to capacitance C multiplied by the voltage swing V divided by the operating current I. Methods and apparatuses are provided by the invention to optimize C, V, and I to achieve the required specifications of speed, power, and optimal cost to produce a high performance high-density multilevel memory integrated circuit system. The invention described herein makes the capacitance independent of memory integrated circuit density, to the first order, and uses the necessary operating voltages and currents in an optimal manner.

Figure 1C:
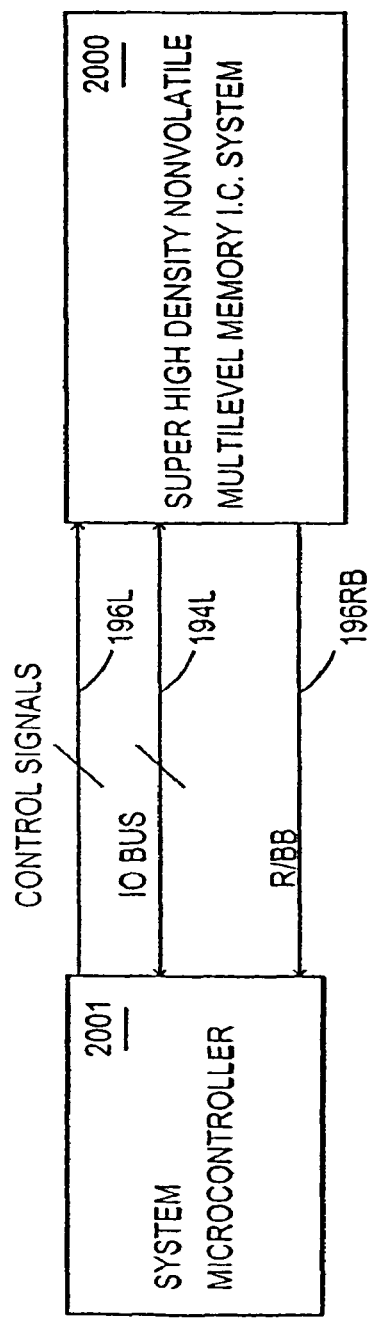
FIG. 1C is a block diagram of a nonvolatile multilevel memory system.

A nonvolatile multilevel memory system is shown in FIG. 1C. A super high density nonvolatile multilevel memory integrated circuit (IC) system 2000 is a digital multilevel nonvolatile flash memory integrated circuit capable of storing $2^N$ storage levels per one memory cell, with N=number of digital bits. A system microcontroller 2001 is a typical system controller used to control various system operations. Control signals (CONTROL SIGNALS) 196L, input/output bus (IO BUS) 194L, and ready busy signal (R/BB) 196RB are for communication between the system microcontroller 2001 and the super high density nonvolatile multilevel memory integrated circuit system 2000.

Figure 1D:
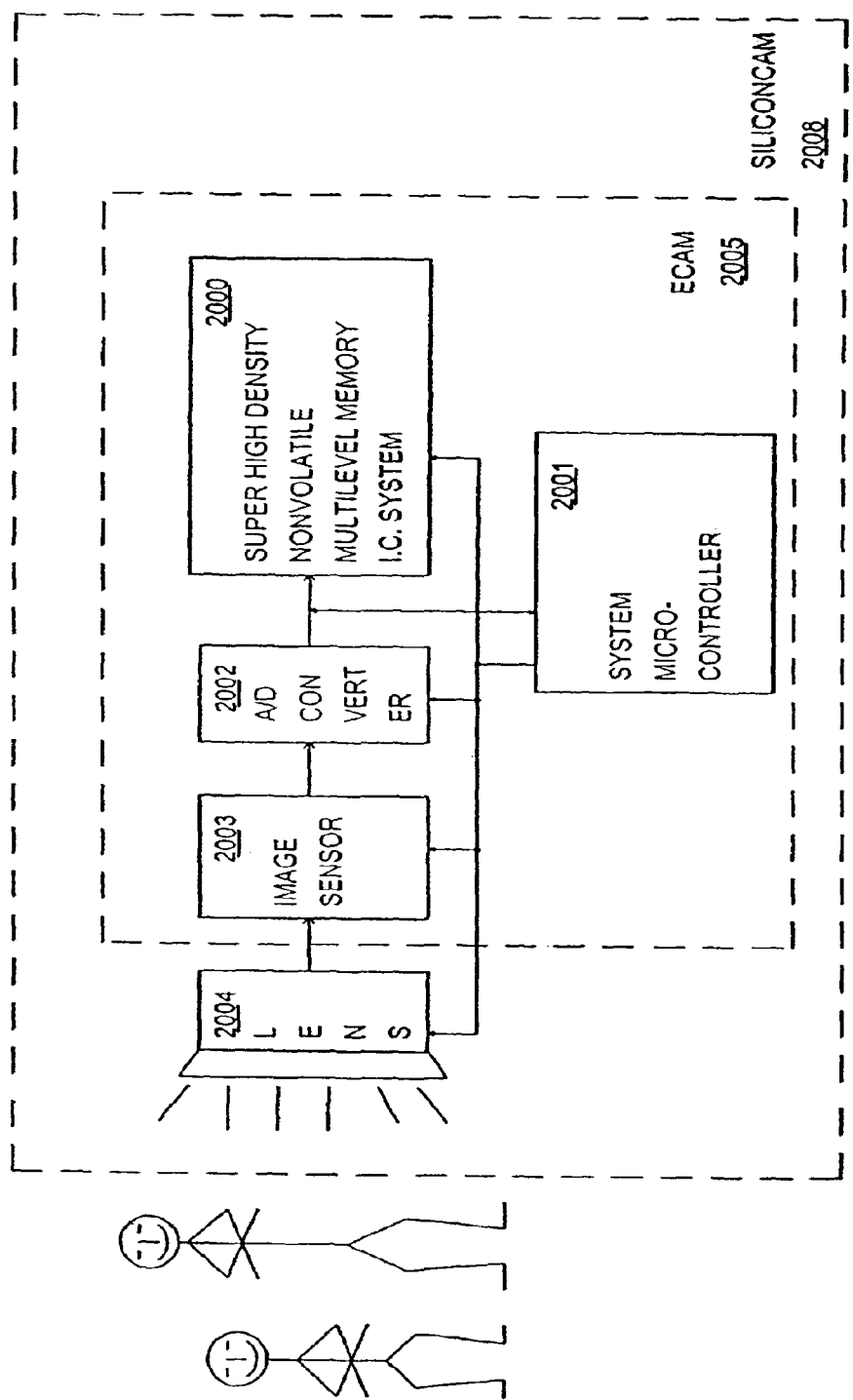
FIG. 1D is a block diagram of an electronic camera system utilizing a nonvolatile multilevel memory system.

An electronic camera system (SILICONCAM) 2008 utilizing super high density nonvolatile multilevel memory IC system 2000 is shown in FIG. 1D. The system (SILICON- CAM) 2008 includes an integrated circuit system (ECAM) 2005 and an optical lens block (LENS) 2004. The integrated circuit system (ECAM) 2005 includes an image sensor (IMAGE SENSOR) 2003, an analog to digital converter block (A/D CONVERTER) 2002, a system microcontroller 2001, and the multilevel memory IC system 2000. The optical lens block (LENS) 2004 is used to focus light into the IMAGE SENSOR 2003, which converts light into an analog electrical signal. The IMAGE SENSOR 2003 is a charge coupled device (CCD) or a CMOS sensor. The block (A/D CONVERTER) 2002 is used to digitize the analog electrical signal into digital data. The microcontroller 2001 is used to control various general functions such as system power up and down, exposure time and auto focus. The microcontroller 2001 is also used to process image algorithms such as noise reduction, white balance, image sharpening, and image compression. The digital data is stored in the multilevel memory IC system 2000. The digital data can be down loaded to another storage media through wired or wireless means. Future advances in process and device technology can allow the optical block (LENS) 2004 to be integrated in a single chip with the ECAM 2005.

Figure 1E:
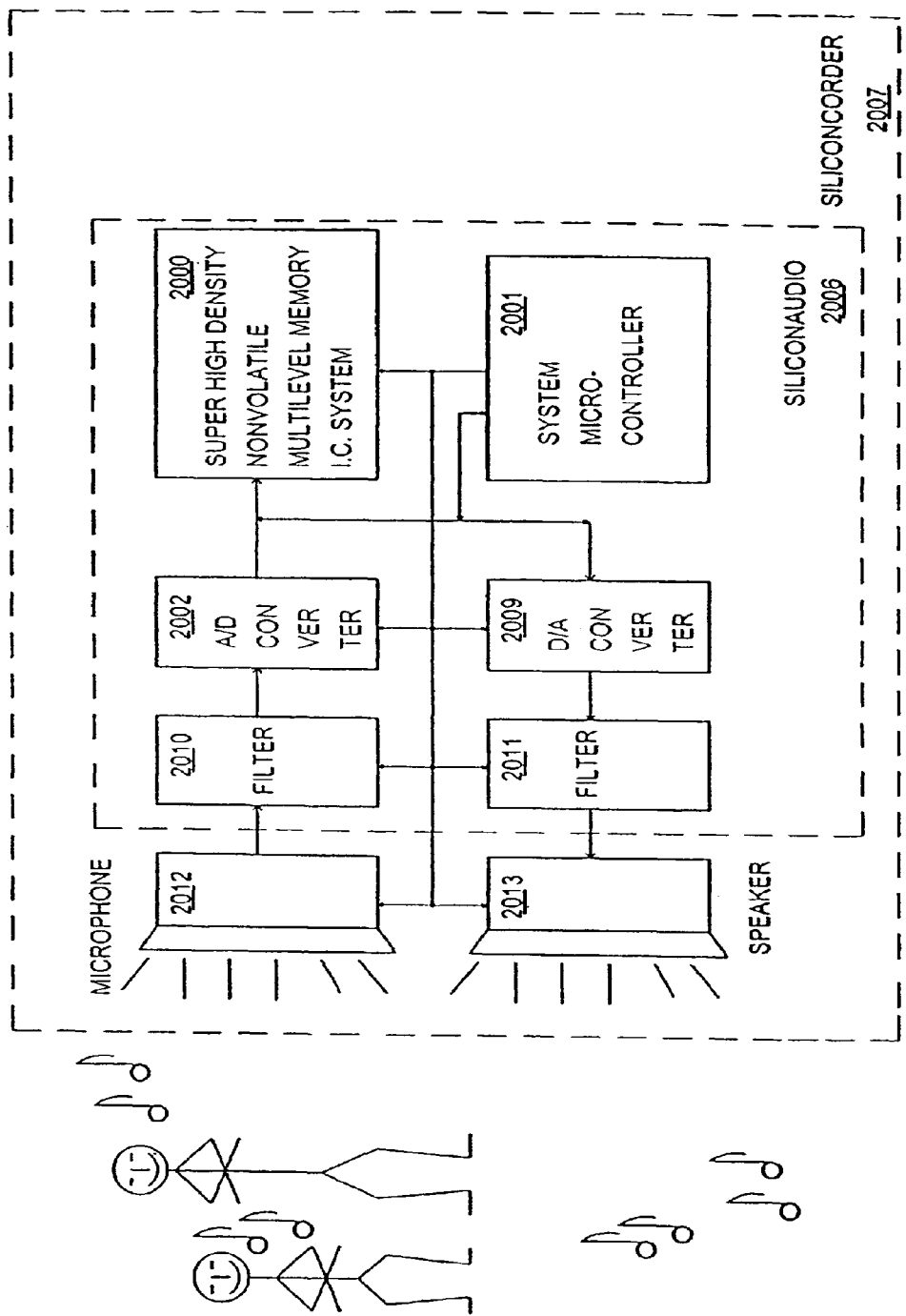
FIG. 1E is a block diagram of an electronic audio system utilizing a nonvolatile multilevel memory system.

An electronic audio system (SILICONCORDER) 2007 utilizing super high density nonvolatile multilevel memory IC system 2000 is shown in FIG. 1E. The SILICONCORDER 2007 includes an integrated circuit system (SILICONAUDIO) 2006, a MICROPHONE 2012, and a SPEAKER 2013. The system (SILICONAUDIO) 2006 includes an anti-alias FILTER 2010, an A/D CONVERTER 2002, a smoothing FILTER 2011, a D/A CONVERTER 2009, a system microcontroller 2001, and the multilevel memory IC system 2000. The FILTER 2010 and the FILTER 2011 can be combined into one filter block if the signals are multiplexed appropriately. The microcontroller 2001 is used to control various functions such as system power up and down, play, record, message management, audio data compression, and voice recognition. In recording a sound wave, the MICROPHONE 2012 converts the sound wave into an analog electrical signal, which is filtered by the FILTER 2010 to reduce non-audio signals. The filtered analog signal is then digitized by the A/D CONVERTER 2002 into digital data. The digital data is then stored in compressed or uncompressed form in the multilevel memory IC system 2000. In playing back the stored audio signal, the microcontroller 2001 first uncompresses the digital data if the data is in compressed form. The D/A CONVERTER 2009 then converts the digital data into an analog signal which is filtered by a smoothing filter (FILTER) 2011. The filtered output analog signal then goes to the SPEAKER 2013 to be converted into a sound wave. The signal filtering can be done by digital filtering by the microcontroller 2001. External digital data can be loaded into the multilevel memory IC system 2000 through wired or wireless means. Future advances in process and device technology can allow the MICROPHONE 2012 and the SPEAKER 2013 to be integrated in a single chip with the SILICONAUDIO 2006.

Figure 2A:
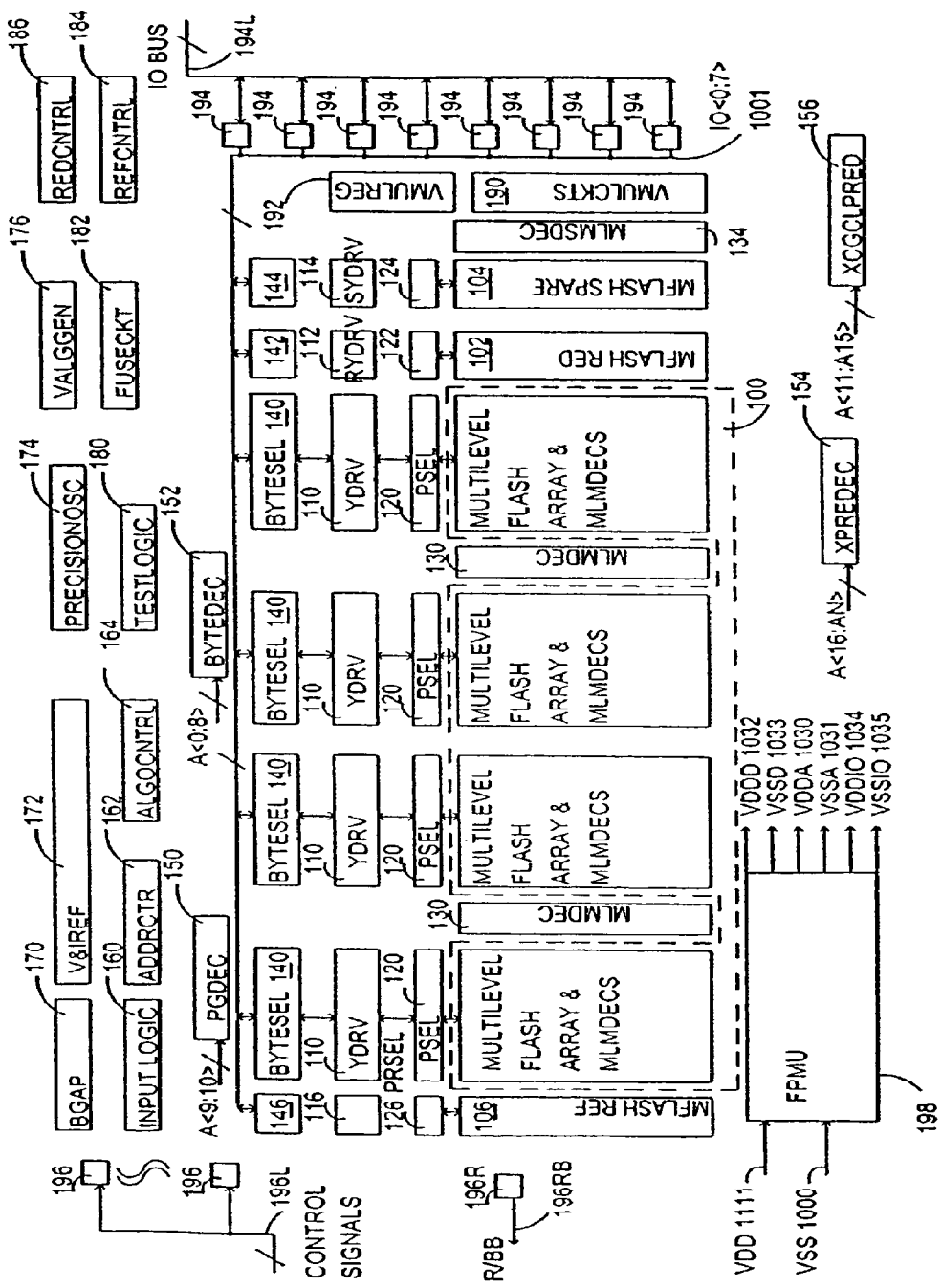
FIG. 2A is a block diagram of super high-density nonvolatile multilevel memory integrated circuit system.

A circuit block diagram of the super high density nonvolatile multilevel memory integrated circuit system 2000 based on the concepts described above and also on ideas described below, is shown in FIG. 2A. For the purpose of discussion, a giga bit nonvolatile multilevel memory chip is described.

A circuit block 100 includes a regular memory array.

It includes a total of for example, 256 million nonvolatile memory cells for a 4-bit digital multilevel memory cell technology or 128 million cells for a 8-bit digital multilevel memory cell technology. An N-bit digital multilevel cell is defined as a memory cell capable of storing $2^N$ levels. A reference array (MFLASHREF) 106 is used for the reference system. A redundancy array (MFLASHRED) 102 is used to increase production yield by replacing bad portions of the regular memory array of the circuit block 100. An optional spare array (MFLASHSPARE) 104 can be used for extra data overhead storage such as for error correction.

A y-driver block (YDRV) 110 including a plurality of single y-drivers (YDRVS) 110S is used for controlling the bitlines during write, read, and erase operation. Block YDRVS 110S will be described in detail below in the description of the multilevel algorithm. Multiples of y-driver block (YDRV) 110 are used for parallel multilevel page writing and reading to speed up the data rate during write to and read from the multilevel memory IC system 2000. A reference y-driver block (REFYDRV) 116 including a plurality of single reference y-drivers (REFYDRVS) 116S is used for the reference array block (MFLASHREF) 106. A redundant y-driver block (RYDRV) 112 including a plurality of single redundant y-drivers (RYDRVS) 112S is used for the redundant array (MFLASHRED) 102. The function of block (RYDRVS) 112S is similar to that of block (YDRVS) 110S. A spare y-driver block (SYDRV) 114 including a plurality of single spare y-drivers (SYDRVS) 114S is used for the spare array (MFLASHSPARE) 104. The function of block (SYDRVS) 114S is similar to that of block (YDRVS) 110S. A page select block (PSEL) 120 is used to select one bitline out of multiple bitlines for each single y-driver (YDRVS) 110S inside the block (YDRV) 110. Corresponding select circuit blocks for reference array, redundant array, and spare array are a reference page select block (PRSEL) 126, a redundant page select block 122, and a spare page select block 124. A byte select block (BYTESEL) 140 is used to enable one byte data in or one byte data out of the blocks (YDRV) 110 at a time. Corresponding blocks for reference array, redundant array, and spare array are a reference byte select block 146, a redundant byte select block 142, and a spare byte select block 144. The control signals for circuit blocks 116, 126, 146, 112, 122, 142, 114, 124, and 144 are in general different from the control signals for circuit blocks 110, 120, and 140 of the regular memory array of the circuit block 100. The control signals are not shown in the figures.

A multilevel memory precision decoder block (MLMDEC) 130 is used for address selection and to provide precise multilevel bias levels over temperature, process corners, and power supply as required for consistent multilevel memory operation for the regular memory array of the circuit block 100 and for the redundant array 102. A multilevel memory precision decoder block (MLMSDEC) 134 is used for address selection and to provide precise multilevel bias levels over temperature, process corners, and power supply as required for consistent multilevel memory operation for the spare array 104.

An address pre-decoding circuit block (XPREDEC) 154 is used to provide decoding of addresses A<16:AN>. The term AN denotes the most significant bit of addresses depending on the size of the memory array. The outputs of block (XPREDEC) 154 couple to blocks (MLMDEC) 130 and block (MLMSDEC) 134. An address pre-decoding block (XCGCLPRED) 156 is used to provide decoding of addresses A<11:15>. The outputs of block 156 also couple to blocks (MLMDEC) 130 and block (MLMSDEC) 134.

A page address decoding block (PGDEC) 150 is used to provide decoding of addresses A<9:10>. The outputs of block (PGDEC) 150 couple to blocks (PSEL) 120. A byte address decoding block (BYTEDEC) 152 is used to provide decoding of addresses A<0:8>. The outputs of block (BYTEDEC) 152 couple to blocks (BYTESEL) 140. An address counter block (ADDRCTR) 162 provides addresses A<ll:AN>, A<9:10>, and A<0:8> for row, page, and byte addresses, respectively. The outputs of the block (ADDRCTR) 162 couple to blocks (XPREDEC) 154, (XCGCLPRED) 156, (PGDEC) 150, and (BYTEDEC) 152. The inputs of the block (ADDRCTR) 162 are coupled from the outputs of an input interface logic block (INPUTLOGIC) 160.

The input interface logic block (INPUTLOGIC) 160 is used to provide external interface to systems off-chip such as the microcontroller 2001. Typical external interface for memory operation are read, write, erase, status read, identification (ID) read, ready busy status, reset, and other general purpose tasks. Serial interface can be used for the input interface to reduce pin counts for high-density chip due to a large number of addresses. Control signals 196L are used to couple the INPUTLOGIC 160 to the system microcontroller 2001. The INPUTLOGIC 160 includes a status register that is indicative of the status of the memory chip operation such as pass or fail in program or erase, ready or busy, write protected or unprotected, cell margin good or bad, restore or no restore, etc. The margin and restore concepts are described more in detail in the multilevel algorithm description.

An algorithm controller block (ALGOCNTRL) 164 is used to handshake the input commands from the block (INPUTLOGIC) 160 and to execute the multilevel erase, programming and sensing algorithms as needed for multilevel nonvolatile operation. The ALGOCNTRL 164 is also used to algorithmically control the precise bias and timing conditions as required for multilevel precision programming.

A test logic block (TESTLOGIC) 180 is used to test various electrical features of the digital circuits, analog circuits, memory circuits, high voltage circuits, and memory array. The inputs of the block (TESTLOGIC) 180 are coupled from the outputs of the INPUTLOGIC 160. The block (TESTLOGIC) 180 also provides timing speed-up in production testing such as faster write/read and mass modes. The TESTLOGIC 180 is also used to provide screening tests associated with memory technology such as various disturb and reliability tests. The TESTLOGIC 180 also allows an off-chip memory tester to directly take over the control of various on-chip logic and circuit bias blocks to provide various external voltages and currents and external timing. This feature permits, for example, screening with external voltage and external timing or permits accelerated production testing with fast external timing.

A fuse circuit block (FUSECKT) 182 is a set of nonvolatile memory cells configured at the external system level, at the tester, at the user, or on chip on-the-fly to achieve various settings. These settings can include precision bias levels, precision on-chip oscillator, programmable logic features such as write-lockout feature for portions of an array, redundancy fuses, multilevel erase, program and read algorithm parameters, or chip performance parameters such as write or read speed and accuracy.

A reference control circuit block (REFCNTRL) 184 is used to provide precision reference levels for precision voltage levels as required for multilevel programming and sensing.

A redundancy controller block (REDCNTRL) 186 is for redundancy control logic.

A voltage algorithm controller block (VALGGEN) 176 provides various specifically shaped voltage signals of amplitude and duration as required for multilevel nonvolatile operation and to provide precise voltage levels with tight tolerance, as required for precision multilevel programming, erasing, and sensing.

A circuit block (BGAP) 170 is a bandgap voltage generator based on the bandgap circuit principle to provide a precise voltage level over process, temperature, and supply as required for multilevel programming and sensing.

A voltage and current bias generator block (V&IREF) 172 is an on-chip programmable bias generator. The bias levels are programmable by the settings of the control signals from the FUSECKT 182 and also by various metal options. A precision oscillator block (PRECISIONOSC) 174 provides accurate timing as required for multilevel programming and sensing.

Input buffer blocks 196 are typical input buffer circuits, for example, TTL input buffers or CMOS input buffers. Input/output (IO) buffer blocks 194 includes typical input buffers and typical output buffers. A typical output buffer is, for example, an output buffer with slew rate control, or an output buffer with level feedback control. A circuit block 196R is an open drained output buffer and is used for ready busy handshake signal (R/BB) 196RB.

A voltage multiplier (also known as charge pump) block (VMULCKT) 190 provides voltage levels above the external power supply required for erase, program, read, and production tests. A voltage multiplying regulator block (VMULREG) 192 provides regulation for the block (VMULCKT) 190 for power efficiency and for transistor reliability such as to avoid various breakdown mechanisms.

A flash power management block (FPMU) 198 is used to efficiently manage power on-chip such as powering up only the circuit blocks in use. The FPMU 198 also provides isolation between sensitive circuit blocks from the less sensitive circuit blocks by using different regulators for digital power (VDDD) 1032/(VSSD) 1033, analog power (VDDA) 1030/(VSSA) 1031, and IO buffer power (VDDIO) 1034/(VSSIO) 1035. The FPMU 198 also provides better process reliability by stepping down power supply VDD to lower levels required by transistor oxide thickness. The FPMU 198 allows the regulation to be optimized for each circuit type. For example, an open loop regulation could be used for digital power since highly accurate regulation is not required; and a closed loop regulation could be used for analog power since analog precision is normally required. The flash power management also enables creation of a "green" memory system since power is efficiently managed.

Figure 2B:
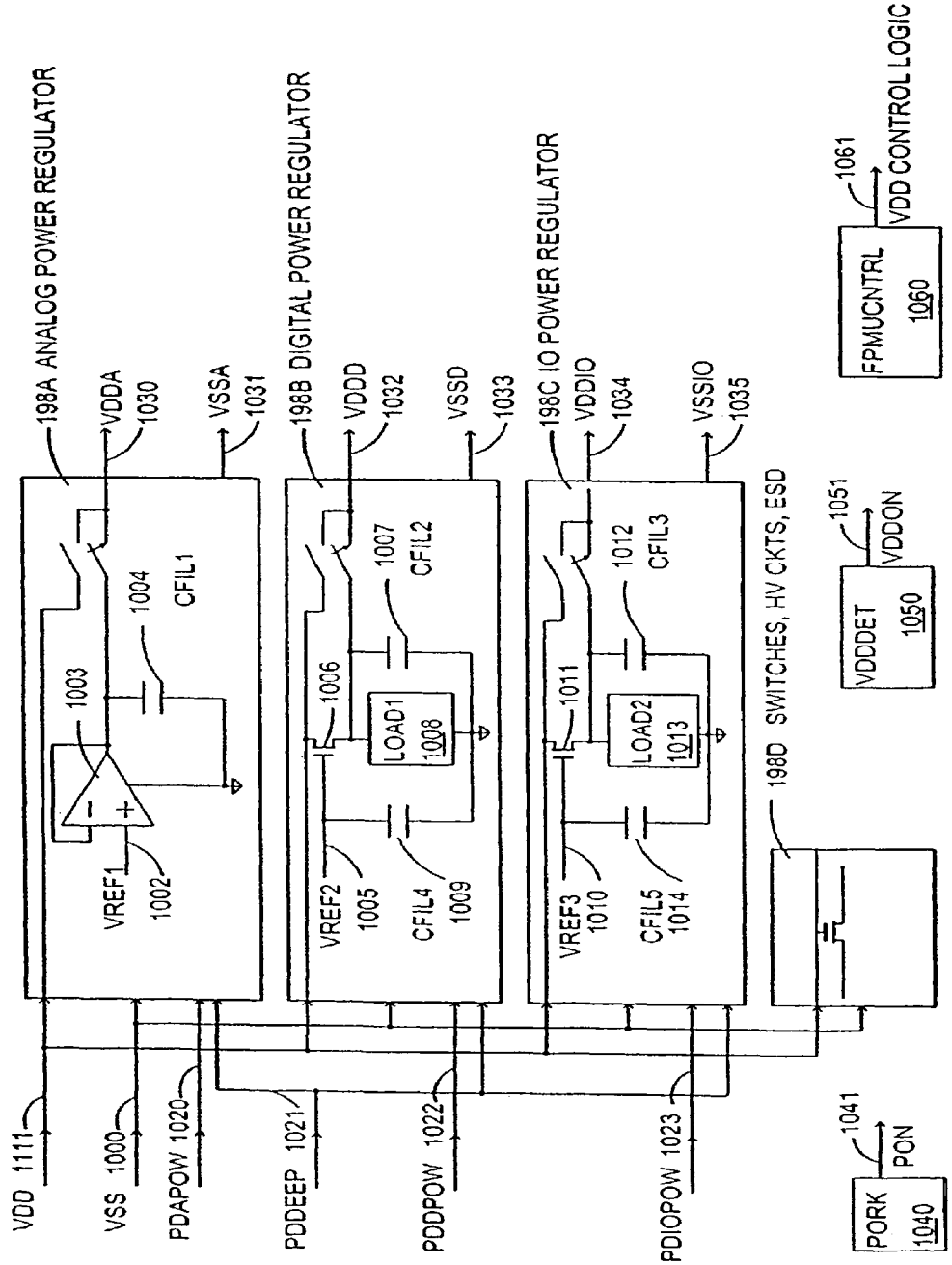
FIG. 2B is a block diagram of flash power management unit.

Block diagram of the FPMU 198 is shown in FIG. 2B. A VDD 1111 and a VSS 1000 are externally applied power supply and ground lines, respectively. A block (ANALOG POWER REGULATOR) 198A is an analog power supply regulator, which uses closed loop regulation. The closed loop regulation is provided by negative feedback action of an operational amplifier (op amp) 1003 configured in a voltage buffer mode with a reference voltage (VREF1) 1002 on the positive input of the op amp 1003. A filter capacitor (CFILL) 1004 is used for smoothing transient response of the analog power (VDDA) 1030. A ground line (VSSA) 1031 is for analog power supply. A block (DIGITAL POWER REGULATOR) 198B is a digital power supply regulator, which uses open loop regulation. The open loop regulation is provided by source follower action of a transistor 1006 with a reference voltage (VREF2) 1005 on its gate. A pair of filter capacitor (CFIL4) 1009 and (CFIL2) 1007 are used for smoothing transient response of digital power (VDDD) 1032. A loading element (LOAD1) 1008 is for the transistor 1006. A ground line (VSSD) 1033 is for digital power supply. A block (IO POWER REGULATOR) 198C is an 10 power supply regulator, which uses open loop regulation similar to that of the digital power supply 198B. The open loop regulation is provided by a transistor 1011 with a reference voltage (VREF3) 1010 on its gate. A loading element (LOAD2) 1013 is for transistor 1011. A pair of capacitors (CFIL5) 1014 and (CFIL3) 1012 are used for smoothing transient response of IO power (VDDIO) 1034. A ground line (VSSIO) 1035 is for IO power supply. A block 198D includes various circuits that require unregulated power supply such as transmission switches, high voltage circuits, ESD structures, and the like.

A block (PORK) 1040 is a power on reset circuit which provides a logic signal (PON) 1041 indicating that the power supply being applied to the chip is higher than a certain voltage. The signal (PON) 1041 is typically used to initialize logic circuits before chip operation begins.

A block (VDDDET) 1050 is a power supply detection circuit, which provides a logic signal (VDDON) 1051 indicating that the operating power supply is higher than a certain voltage. The block (VDDDET) 1050 is normally used to detect whether the power supply is stable to allow the chip to take certain actions such as stopping the programming if the power supply is too low.

A block (FPMUCNTRL) 1060 is a power supply logic controller, that receives control signals from blocks (PORK) 104, (VDDDET) 1050, (INPUTLOGIC) 160, (ALGOCNTRL) 164, and other logic control blocks to power up and power down appropriately power supplies and circuit blocks. The FPMUCNTRL 1060 is also used to reduce the power drive ability of appropriate circuit blocks to save power. A line (PDDEEP) 1021 is used to power down all regulators. Lines (PDAPOW) 1020, (PDDPOW) 1022, and (PDIOPOW) 1023 are used to power down blocks 198A, 198B, and 198C, respectively. Lines (PDDEEP) 1021, (PDAPOW) 1020, (PDDPOW) 1022, and (PDIOPOW) 1023 come from block (FPMUCNTRL) 1060.

It is possible that either closed or open loop regulation could be used for any type of power supply regulation. It is also possible that any power supply could couple directly to the applied power supply (VDD) 1111 without any regulation with appropriate consideration. For example, VDDA 1030 or VDDIO 1034 could couple directly to VDD 1111 if high voltage transistors with thick enough oxide are used for analog circuits or IO buffer circuits, respectively.

A typical memory system operation is as follows: a host such as the microcontroller 2001 sends an instruction, also referred to as a command, such as a program instruction via the CONTROL SIGNALS 196L and the IO BUS 194L to the multilevel memory chip 2000 (see FIG. 1C). The INPUTLOGIC 160 interprets the incoming command as a valid command and initiates the program operation internally. The ALGOCNTRL 164 receives the instruction from the INPUTLOGIC 160 to initiate the multilevel programming algorithmic action by outputting various control signals for the chip. A handshake signal such as the ready busy signal R/BB 196RB then signals to the microcontroller 2001 that the multilevel memory chip 2000 is internally operating. The microcontroller 2001 is now free to do other tasks until the handshake signal R/BB 196RB signals again that the multilevel memory chip 2000 is ready to receive the next command. A timeout could also be specified to allow the microcontroller 2001 to send the commands in appropriate times.

Read Operation:

A read command including a read operational code and addresses is sent by the microcontroller 2001 via the CONTROL SIGNALS 196L and IO BUS 194L. The INPUTLOGIC 160 decodes and validates the read command. If it is valid, then incoming addresses are latched in the ADDRCTR 162. The ready busy signal (R/BB) 196RB now goes low to indicate that the multilevel memory device 2000 has begun read operation internally. The outputs of ADDRCTR 162 couple to blocks (XPREDEC) 154, (XCGCLPRED) 156, (PGDEC) 150, (BYTEDEC) 152, and (REDCNTRL) 186. The outputs of blocks 154, 156, 150, 152, and 186 couple to blocks (MLMDEC) 130, (MLSMDEC) 134, and block 100 to enable appropriate memory cells. Then the ALGOCNTRL 164 executes a read algorithm. The read algorithm will be described in detail later in the multilevel algorithm description. The read algorithm enables blocks (BGAP) 170, (V&IREF) 172, (PRECISIONOSC) 174, (VALGGEN) 176, and (REFCNTRL) 184 to output various precision shaped voltage and current bias levels and algorithmic read timing for read operation, which will be described in detail later in the description of the multilevel array architecture. The precision bias levels are coupled to the memory cells through blocks (MLMDEC) 130, (MLMSDEC) 134, and block 100.

In an embodiment, the read algorithm operates upon one selected page of memory cells at a time to speed up the read data rate. A page includes a plurality of memory cells, e.g., 1024 cells. The number of memory cells within a page can be made programmable by fuses, e.g., 512 or 1024 to optimize power consumption and data rate. Blocks (PGDEC) 150, (MLMDEC) 130, (MLMSDEC) 134, 100, and (PSEL) 120 select a page. All memory cells in the selected page are put in read operating bias condition through blocks (MLMDEC) 130, (MLMSDEC) 134, 100, (PSEL) 120, and (XCGCLPRED) 156. After the readout voltage levels are stable, a read transfer cycle is initiated by the block (ALGOCNTRL) 164. All the readout voltages from the memory cells in the selected page are then available at the y-drivers (YDRVS) 110S, (RYDRVS) 112S, and (SYDRVS) 114S inside block (YDRV) 110, (RYDRV) 112, and (SYDRV) 114, respectively.

Next, in the read transfer cycle the ALGOCNTR 164 executes a multilevel read algorithm to extract the binary data out of the multilevel cells and latches them inside the YDRVS 110S, RYDRVS 112S, and SYDRVS 114S. This finishes the read transfer cycle. A restore flag is now set or reset in the status register inside the INPUTLOGIC 160. The restore flag indicates whether the voltage levels of the multilevel memory cells being read have been changed and whether they need to be restored to the original voltage levels. The restore concept will be described more in detail in the multilevel algorithm description. Now the ready busy signal (R/BB) 196RB goes high to indicate that the internal read operation is completed and the multilevel memory device 2000 is ready to transfer out the data or chip status. The microcontroller 2001 now can execute a status read command to monitor the restore flag or execute a data out sequence. The data out sequence begins with an external read data clock provided by the microcontroller 2001 via the CONTROL SIGNAL 196L coupled to an input buffer 196 to transfer the data out. The external read data clock couples to the blocks (BYTEDEC) 152 and (BYTESEL) 140, 142, and 144 to enable the outputs of the latches inside blocks (YDRV) 110 or (RYDRV) 112 or (SYDRV) 114 to output one byte of data at a time into the bus IO<0:7> 1001. The external read data clock keeps clocking until all the desired bytes of the selected page are outputted. The data on bus IO<0:7> 1001 is coupled to the microcontroller 2001 via IO BUS 194L through IO buffers 194.

Program Operation:

A program command including a program operational code, addresses, and data is sent by the microcontroller 2001 via CONTROL SIGNALS 196L and IO BUS 194L. The INPUTLOGIC 160 decodes and validates the command. If it is valid, then incoming addresses are latched in the ADDRCTR 162. The data is latched in the latches inside YDRV 110, RYDRV 112, and SYDRV 114 via blocks (BYTEDEC) 152, (BYTESEL) 140, 142, and 144, respectively. The ready busy signal (R/BB) 196RB now goes low to indicate that the memory device has begun program operation internally. The outputs of ADDRCTR 162 couple to blocks (XPREDEC) 154, (XCGCLPRED) 156, (PGDEC) 150, (BYTEDEC) 152, and (REDCNTRL) 186. The outputs of blocks 154, 156, 150, 152, and 186 couple to blocks (MLMDEC) 130, (MLSMDEC) 134, and 100 to enable appropriate memory cells. Then the (ALGOCNTRL) 164 executes a program algorithm, which will be described in detail later in the multilevel algorithm description. The (ALGOCNTRL) 164 enables blocks (BGAP) 170, (V&IREF) 172, (PRECISIONOSC) 174, (VALGGEN) 176, and (REFCNTRL) 184 to output various precision shaped voltage and current bias levels and algorithmic program timing for the program operation, which will be described in detail later in the description of the multilevel array architecture. The precision bias levels are coupled to the memory cells through blocks (MLMDEC) 130, (MLMSDEC) 134, and block 100.

In an embodiment, the program algorithm operates upon one selected page of memory cells at a time to speed up the program data rate. Blocks (PGDEC) 150, (MLMDEC) 130, (MLMSDEC) 134, 100, and (PSEL) 120 select a page. All memory cells in the selected page are put in appropriate program operating bias condition through blocks (MLMDEC) 130, (MLMSDEC) 134, 100, (PSEL) 120, and (XCGCLPRED) 156. Once the program algorithm finishes, program flags are set in the status register inside the block (INPUTLOGIC) 160 to indicate whether the program has been successful. That is, all the cells in the selected page have been programmed correctly without failure and with enough voltage margins. The program flags are described more in detail in the multilevel algorithm description. Now the ready busy signal (R/BB) 196RB goes high to indicate that the internal program operation is completed and the memory device is ready to receive the next command.

Erase Operation:

An erase command including an erase operational code and addresses is sent by the microcontroller 2001 via CONTROL SIGNALS 196L and IO BUS 194L. The INPUTLOGIC 160 decodes and validates the command. If it is valid, then incoming addresses are latched in the ADDRCTR 162. The ready busy signal (R/BB) 196RB now goes low to indicate that the memory device has begun erase operation internally. The outputs of ADDRCTR 162 couple to blocks (XPREDEC) 154, (XCGCLPRED) 156, (PGDEC) 150, (BYTEDEC) 152, and (REDCNTRL) 186. The outputs of blocks 154, 156, 150, 152, and 186 couple to blocks (MLMDEC) 130, (MLSMDEC) 134, and 100 to enable appropriate memory cells. Then the ALGOCNTRL 164 executes an erase algorithm. The ALGOCNTRL 164 enables blocks (BGAP) 170, (V&IREF) 172, (PRECISIONOSC) 174, (VALGGEN) 176, and (REFCNTRL) 184 to output various precision shaped voltage and current bias levels and algorithmic erase timing for erase operation. The shaped voltage for erase is to minimize electric field coupled to memory cells, which minimizes the damage to memory cells during erasing. The precision bias levels are coupled to the memory cells through blocks (MLMDEC) 130, (MLMSDEC) 134, and block 100.

In an embodiment, the erase algorithm operates upon one selected erase block of memory cells at a time to speed up the erase time. An erase block includes a plurality of pages of memory cells, e.g., 32 pages. The number of pages within an erase block can be made programmable by fuses to suit different user requirements and applications. Blocks (PGDEC) 150, (MLMDEC) 130, (MLMSDEC) 134, 100, and (PSEL) 120 select a block. All memory cells in the selected block are put in erase operating bias condition through blocks (MLMDEC) 130, (MLMSDEC) 134, 100, (PSEL) 120, and (XCGCLPRED) 156. Once the erase algorithm finishes, the erase flags are set in the status register inside the block (INPUTLOGIC) 160 to indicate whether the erase has been successful. That is, all the cells in the selected page have been erased correctly to desired voltage levels without failure and with enough voltage margins. Now the ready busy signal (R/BB) 196RB goes high to indicate that the internal erase operation is completed and the multilevel memory device 2000 is ready to receive the next command.

Multilevel Array Architecture:

The demanding requirements associated with putting together a billion transistors on a single chip with the ability to store multiple precision levels per cell and operating at a very high speed are contradictory. These requirements need innovative approaches and careful tradeoffs to achieve the objective. Examples of tradeoffs and problems with prior art implementation are discussed below. In conventional prior art architectures, a voltage drop along a metal line of a few tens of millivolts could be easily tolerated. Here, in a super high density nonvolatile multilevel memory integrated circuit system such a voltage drop can cause unacceptable performance degradation in precision levels due to the high number of levels stored per memory cell. In conventional array architectures, a bit line capacitance in the order of 10 pico farads would be a non-issue. Here it may be unworkable due to the high data rate required. In prior art array architectures a bias level variation from one memory cell to another in the order of +/−30 percent would be a typical situation. Here such a bias variation would be a serious performance problem. In prior art array architectures, the total resistance of a memory source line in the order of a few hundreds of ohms would be a typical situation, here a few tens of ohms is a serious problem. The huge number of memory cells of the giga to tera bit high-density memory system compounds the matter even further by making the memory source line longer. Another challenge facing the multilevel system is maintaining high speed sensing and programming with low power, again requiring tradeoffs. Another challenge facing the multilevel system is high speed sensing and programming with very high precision voltages due to a high number of levels stored per digital multilevel memory cell, again a conflicting demand. Another challenge facing the multilevel system is high speed sensing and programming consistently every time over many years, process corners, temperature, and power supply variation.

To get an appreciation of the order of magnitude of the difficulty involved in the super high density multilevel nonvolatile memory system, numerical examples will be given corresponding to a one giga bit array architecture system suitable for 256 levels, i.e., 8 bits. The array is then organized as 8192 bitlines or columns and 16384 rows or wordlines for a total of 134,217,730 physical cells.

One sensing level, V1level, =multilevel sensing range/$2^N$, N=number of digital bits stored per memory cell. Multilevel sensing range is the readout voltage range from sensing a multilevel memory cell. Assuming the multilevel sensing range from the multilevel memory cell available is 2048 millivolts, then V1level=2048/256=8 millivolts.

A very high data rate is required for applications such as image or high density data storage. For example, write and read rates of a mega byte per second are required. To achieve this high data rate, parallel writing and sensing is required for the super high density nonvolatile multilevel memory integrated circuit system. In the present embodiment, a total of 1024 y-drivers (YDRVS) 110S inside blocks (YDRV) 110 are used. This allows 1024 memory cells to be written and sensed at the same time in a page mode manner, effectively increasing the speed by a factor of 1024 over single cell operation.

The number of bitlines multiplexed into one single y-driver (YDRVS) 110S is =8192/1024=8 bitlines.

A program algorithm described in more detail elsewhere in this specification is able to achieve desired multilevel resolution. The read or program multilevel resolution is the smallest voltage range in read or program, respectively, needed to operate the multilevel memory cells correctly. An erase algorithm first erases the memory cells to make the cell readout voltage reaching a certain desired voltage level. Then the iterative program algorithm is applied to the memory cells. The program algorithm includes a plurality of verify-program cycles. A verify-program cycle includes a verify cycle followed by a program cycle. A verify cycle is done first to inhibit the cell from the first programming pulse if the cell is verified, therefore preventing possible over-programming. Over-programming means that after a programming pulse the cell sensing level passes a desired voltage level by more than a desired voltage amount. A verify cycle is used to determine whether the desired readout sensing level has been reached. If the desired readout sensing level is reached, the cell is inhibited from further programming. Otherwise, the cell is enabled for the next program cycle. A program cycle is used to change incrementally the charge stored in the cell and the corresponding cell sensing readout voltage. Instead of a verify-program cycle, a program-verify cycle can be used. A program-verify cycle begins with a program cycle followed by a verify cycle. In this case, care should be taken to ensure that the first programming pulse does not cause over-programming.

Figure 2C:
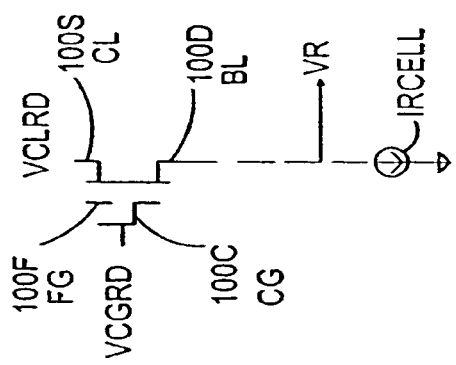
FIG. 2C shows voltage mode sensing.

In an embodiment the program cycle includes applying a voltage on the source line, (interchangeably referred to as common line [CL]) (VCL), with a predetermined program pulsewidth (TPPWD) and a predetermined program bias cell current (Ipcell). The verify cycle makes use of the voltage mode sensing as shown in FIG. 2C, which applies a reference voltage (VCLRD) on the source line (CL), another reference voltage (VCGRD) on the control gate, and a predetermined read bias current (Ircell) on the bitline and through the memory cell. The current (Ircell) is applied to the bitline and the memory cell through select transistors which are not shown. The resulting voltage on the bitline is the sensing readout voltage (VR), which has a unique relationship to the charge on the floating gate. The voltage mode sensing is also used during read. To change incrementally the readout sensing voltage to the next value (VR+dVR), with dVR equals to the incremental readout sensing voltage change, the next program cycle is repeated with the common line voltage increased incrementally to (VCL+dVCLP), with dVCLP equals to the incremental programming voltage change.

The number of verify-program cycles (NC) is dependent on the number of voltage levels and various margins of the memory system. For example, for an equivalent 8-bit digital multilevel cell, there are $2^N=2^8=256$ levels, with N=8. The minimum possible number of verify-program cycles (NC) required would be 256. To cover variations due to cell-to-cell variation, temperature, process corners, an algorithm may require, for example, approximately 1.4×256=360 verify-program cycles. To cover various margins needed such as for data retention and programming distribution, the number of verify-program cycles required is actually higher. Assuming a factor of 2 due to various margin coverage, the number of verify-program cycles is approximately equal to 720. The exact number of verify-program cycles is typically varied depending on various memory technologies and particular desired performance targets.

For write data rate of 1 mega byte per second and for 8-bit digital multilevel operation with 1024 bytes per page, the write timing per page is, TWRT=# of bytes written in parallel/data rate=1024 bytes per page/1 mega bytes/second=1024 μs=1.024 ms per page.

Hence the time to execute each program-verify cycle (TPV) must be less than TWRT/NC=1.024 ms/720=1.42 μs. This fast timing coupled with parallel operation of 1024 cells has important implication on memory cell program speed, capacitance loading, power consumption and other effects as will be described below.

Typical process parameters of a sub-micron memory cell are as follows. A typical diffused source line resistance per cell is 100 ohms. A typical bitline resistance per cell is 80 milliohms. A typical silicided row line resistance per cell is 20 ohms. A typical source line capacitance per cell is 2 fF. A typical bitline capacitance per cell is 1.5 fF. And a typical row line capacitance per cell is 3 fF.

Hence for the 8192×16384 array, the total bitline capacitance is CBL=~16384×1.5 fF=25 pF, where "=~" is defined as approximately equal to. The total metal bitline resistance RBL=~16384×0.08=1330 ohms. The total diffused source line resistance is RSL=8192×100=819 K ohms. The total row line resistance is RWL=8192×20=164 K ohms. For a typical memory system, the diffused source line is strapped by metal along the source line, with approximately 80 milliohms per cell, in this case RSL=8192×0.08=655 ohms.

In conventional stacked gate drain-side CHE programming (abbreviated as CHE flash program), the single cell current is typically 1 ma, which causes a voltage drop along a single metal bitline of =~1 ma×RBL=~1 ma×1330 ohms=1330 millivolts, which is unacceptable since it is much greater than 1 level=8 millivolts. In SSI flash programming (abbreviated as SSI flash program), the typical cell current can be lowered to 1 μa, which causes a voltage drop along a single metal bitline of =~1 μa×1330 ohms=1.33 millivolts, which is acceptable.

For 1024 cells drawing the cell current (Icell) continuously, the voltage drop (DVCL) along the source line from the driver to the other end follows the geometric equation:

$$DVCL=0.5*P*(P+1)*R8cell*Icell, tm \qquad (1)$$

where R8cell=the metal source line resistance for 8 cells in series=0.08 ohms×8=0.64 ohms, and P=1024.

Along the source line, for 1024 cells programming simultaneously, the total current is 1024×1 ma=1.024 A for the CHE flash program and =1024×1 μa=1.024 ma for the SSI flash program. The power needed for the drain side CHE flash programming for parallel page mode operation is unsustainable due to very high current. Additionally, the voltage drop along the metal source line by equation (1) is =~0.5× 1024*1025*0.64*1 ma=336 Volts for CHE. This is unworkable for CHE flash technology. Similarly, the source line voltage drop for the SSI flash =~336 millivolts. This is also unworkable in the multilevel program for the following reasons.

For a multilevel nonvolatile system, in one program cycle, the cell sensing voltage can only shift (dVR) a maximum of <(Q*V1level) for reliable sensing, where Q was 0.5 in the prior example. However Q could vary from ⅓ to ⅛ for long term reliability. This is needed, for example, to allow for sensing margin, verify margin, program disturb, data retention, and endurance. The number of cells programming simultaneously within a selected page can vary between as many as 1024 to as few as only one from one program cycle to the next. Thus the total program current flowing through the common line CL could change by a factor of 1024 from one program cycle to the next. The resulting worst case voltage change in the source line VCL from one program cycle to the next is dVCL=~336 millivolts for SSI flash. This voltage jump in VCL causes the only remaining programming cell to over program, which causes the cell sensing voltage to shift much greater than the (Q*V1level). Hence, the challenge is to bring the voltage drop dVCL to an acceptable level during programming.

For verifying after programming multilevel memory cells, conventional methods would shut off the read cell currents for cells that have already reached their desired verifying levels, this would cause the voltage shift dVCL in verify as much as in programming as described above. This voltage jump dVCL would couple to the memory cells and cause a large jump in cell sensing voltage. This undesired large jump in cell sensing voltage causes an error in sensing, herein called a sense error VRerr. This sense error should be much less than (Q*V1level). Hence this large jump is unacceptable. The invention solves the problem by enabling the total current all the time whether the cells have been verified or not. This mitigates the change in the source line voltage. However a new problem surfaces as compared to that in programming. As temperature changes from −45 C to +85 C the resistance of the source line metal line changes by about 40%, hence the source line voltage drop changes by about 40%, which causes an additional sense error VRerr in read. This sense error should be much less than (Q*V1level) to prevent overall read margin degradation. Therefore, an array architecture is needed to achieve this, as will be described in detail below.

With 1024 cells operating simultaneously, assuming sense current Ircell=10 µa, the total sense current is =1024×10 µa=10.24 ma flowing into the source line. This presents several problems. With power specification for a typical memory chip ICC=20-30 ma. This 10.24 ma is a big percentage of the power specification. To deliver 10.24 ma while maintaining a precise voltage level VCLRD, VCLRD is defined as the voltage in read on CL line, requires a challenging decoding and driver scheme, which will be addressed in the description of the multilevel decoding scheme. Large current flowing across the source line also causes the voltage drop as described above.

High data rate, meaning high sense speed and write speed, is required for data intensive application. The speed is proportional to capacitance and voltage swing and inversely proportional to the current, $$T = C*V/I \qquad (2).$$

For typical bitline capacitance as calculated above, CBL=25 pF and assuming voltage swing V=1V, and assuming available current I=10 µa, the time it takes to charge or discharge a bitline as needed in verify or program cycle is, TBL=25 pF*1V/10 µa=2.5 µs. This is greater than the TPV=1.42 µs as calculated above. At least a 2× or better timing is required for TBL to allow for various settling time, sensing time, and programming time. Increasing the current would cause higher power consumption, large decoding driver, and voltage problems as described above.

Further, in programming 1024 cells in parallel, the programming current is supplied from an on-chip voltage multiplier, also known as a charge pump. The on-chip voltage multiplier multiplies the low voltage power supply, e.g., 2.5V to the required higher voltages. Allowing a reasonable area penalty from the on-chip voltage multiplier, a total current of 100 µa is allowed for programming. The programming current per cell is 100 µa/1024=0.1 µa. This causes a TBL=25 pF*1V/0.1 µa=250 µs, which is even more severe of a timing problem. Here an improvement of more than 2 order of magnitude or better in speed is needed. The invention describes array architectures with suitable operating methods to achieve this improvement and will be described below.

Figure 3A:
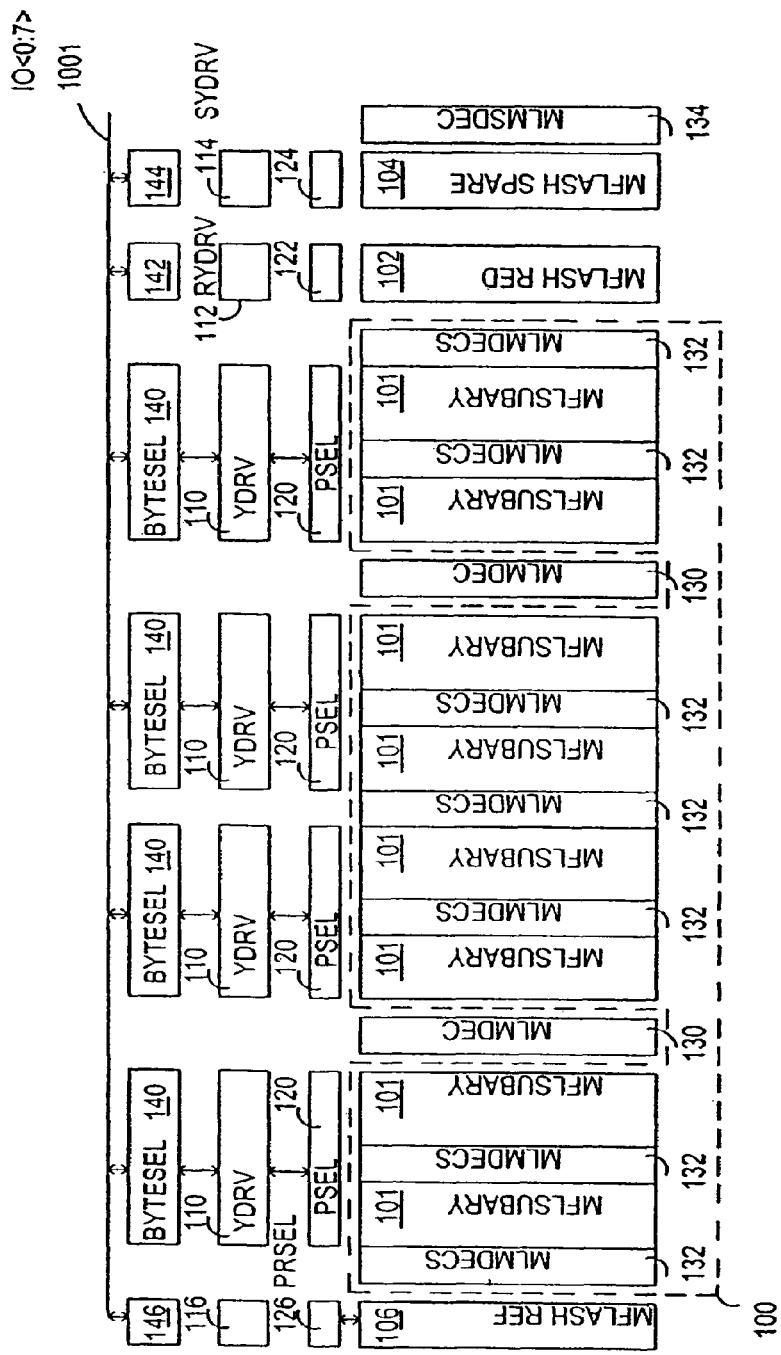
FIG. 3A is a block diagram of super high-density nonvolatile multilevel array architecture.

FIG. 3A is the block diagram of a super high-density digital nonvolatile multilevel memory array architecture which is capable of >8-bit multilevel operation. The block 100 has been expanded from FIG. 2A to show the sub-blocks inside. A multilevel precision memory decoder MLMDECS 132 is used for delivering bias voltage levels with tight tolerance over temperature, process, and power supply variation for multilevel memory cells. A multilevel memory sub-array MFLSUBARY 101 includes a plurality of single multilevel memory cells. Other blocks in FIG. 3A have already been described in association with the description of FIG. 2A.

Figure 3B:
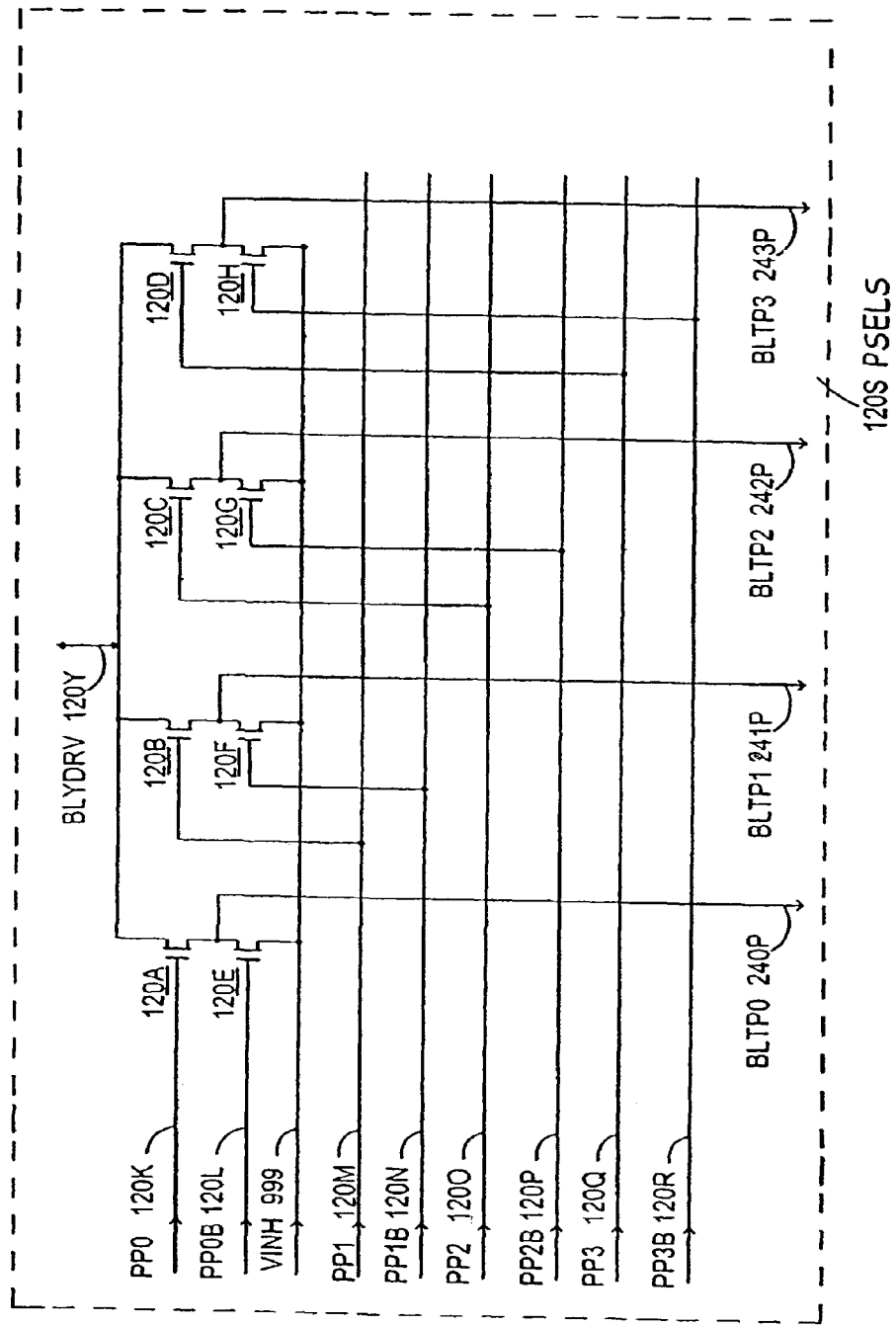
FIG. 3B is a page select circuit, which together with the segment select decoder selects one bitline at a time for each y-driver.

A block (PSEL) 120 includes a plurality of circuit blocks (PSELS) 120S. FIG. 3B shows details of a page select circuit (PSELS) 120S that selects a pair of bitlines at a time. Transistors 120A-D are select transistors. Transistors 120E-H are inhibit transistors. Lines (PP0) 120K, (PP1) 120M, (PP2) 120O, and (PP3) 120Q are complementary signals of lines (PP0B) 120L, (PP1B) 120N, (PP2B) 120P, and (PP3B) 120R, respectively. Line (BLYDRV) 120Y goes to one y-driver (YDRVS) 110S inside the block (YDRV) 110. Block (YDRVS) 110S will be described in detail later in the description of the multilevel algorithm. Lines (BLTP0) 240P, (BLTP1) 241P, (BLTP2) 242P, and (BLTP3) 243P couple to the bitlines in block 101 and couple to a set of lines (BLP0) 240, (BLP1) 241, (BLP2) 242, and (BLP3) 243 of the circuit block 290 in FIG. 4A.

Figure 3C:
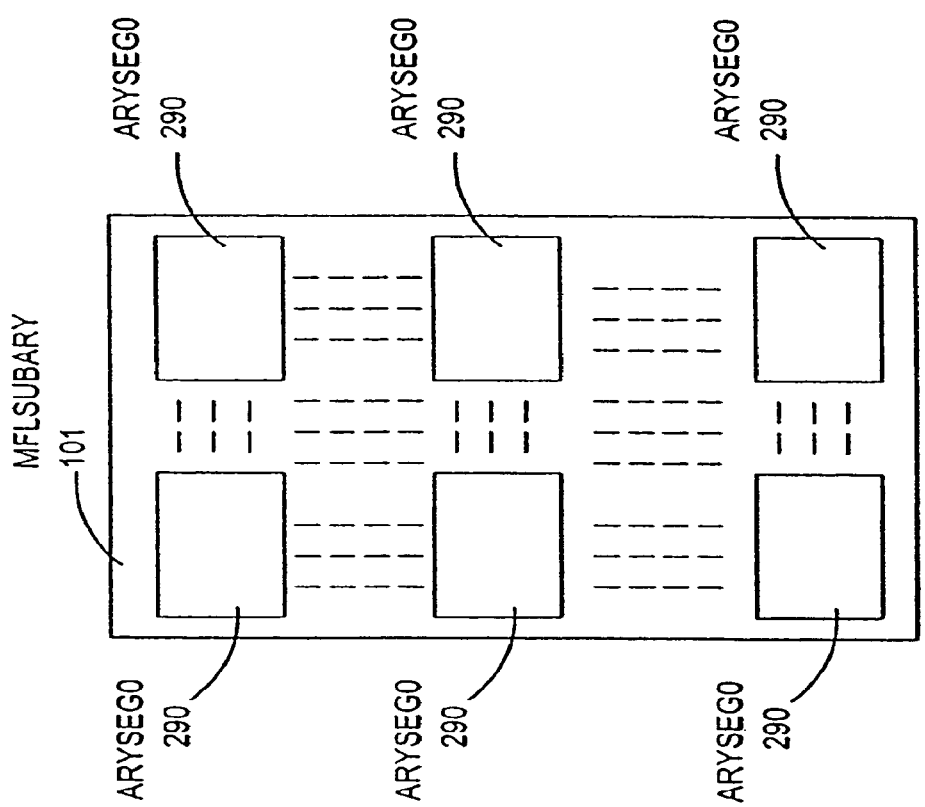
FIG. 3C is a block diagram of a multilevel sub-array block.

FIG. 3C shows a block diagram of a block (MFLSUBARY) 101. A block (MFLSUBARY) 101 includes a plurality of blocks (ARYSEG0) 290. Blocks (ARYSEG0) 290 are first tiled horizontally NH times and then the horizontally tiled blocks 290 are tiled vertically NV times. For a page with 1024 memory cells, NH is equal to 1024. NV is determined such that the total number of memory cells is equal to the size of the desired physical memory array.

Figure 4A:
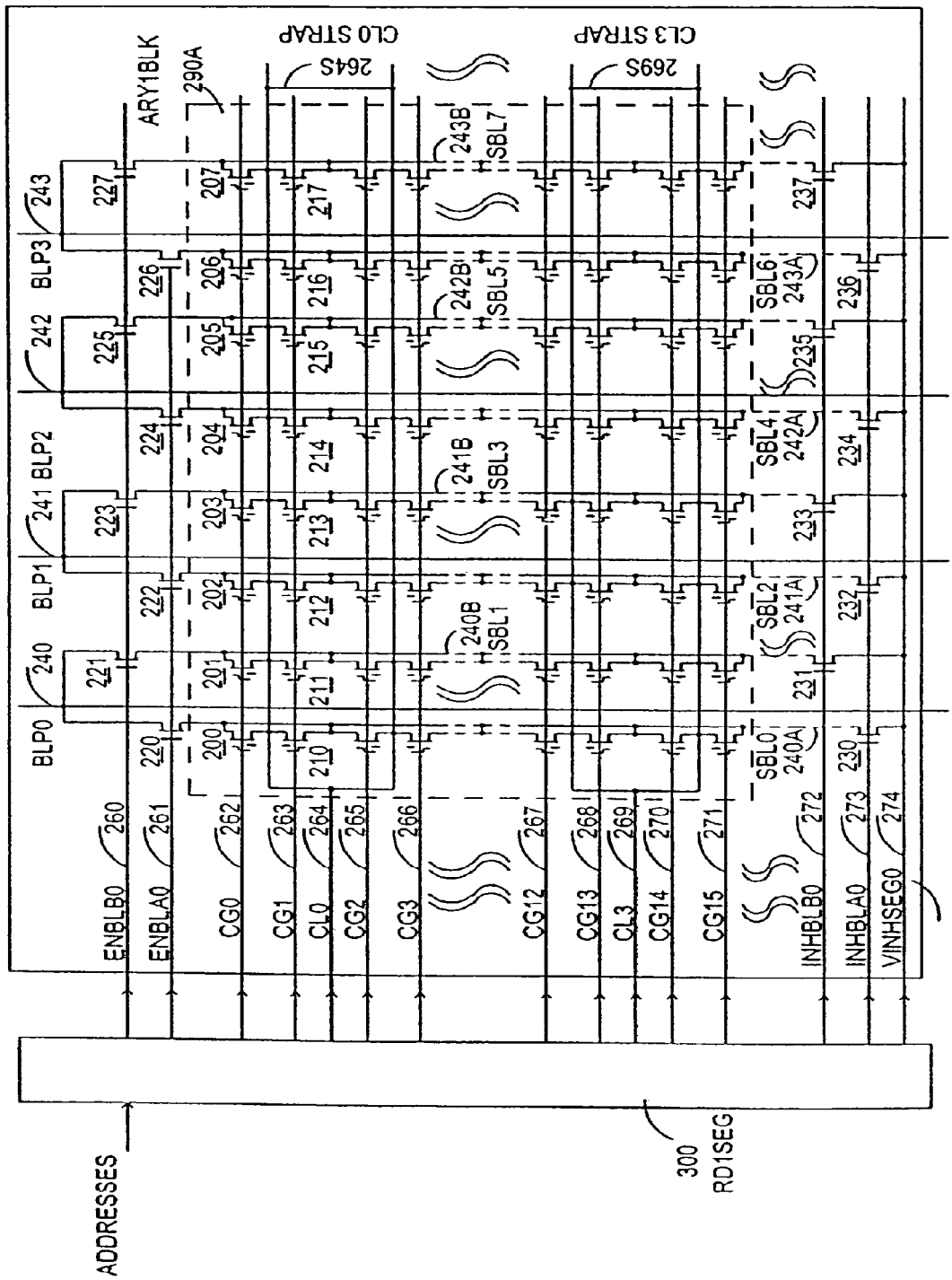
FIG. 4A is one embodiment of a nonvolatile multilevel array unit of inhibit and select segmentation.

FIG. 4A shows a basic array unit (ARYSEG0) 290. A block (RD1SEG) 300 is a multilevel decoding block. A plurality of the blocks RDLSEG makes up the circuit block (MLMDEC) 130. In the block (ARYSEG0) 290, there are 8 columns and FIG. 4A shows only 8 rows of memory cells, while other rows, e.g., 120 rows, are not shown for clarity. Each ARYSEG0 290 includes a plurality, e.g. 8, of array blocks (ARYLBLK) 290A tiled vertically. A set of transistors 220, 221, 222, 223, 224, 225, 226, 227 couples respectively a set of segment bitlines (SBL0) 240A and (SBL1) 240B, (SBL2) 241A and (SBL3) 241B, (SBL4) 242A and (SBL5) 242B, (SBL6) 243A and (SBL7) 243B to a set of top bitlines (BLP0) 240, (BLP1) 242, (BLP2) 242, and (BLP3) 243, respectively. Top bitlines refer to bitlines running on top of the whole array and running the length of the MFLSUBARY 101. Segment bitlines refer to bitlines running locally within a basic array unit ARYSEG0 290. A set of transistors 230, 231, 232, 233, 234, 235, 236, 237 couples respectively segment bitlines (SBL0) 240A and (SBL1) 240B, (SBL2) 241A and (SBL3) 241B, (SBL4) 242A and (SBL5) 242B, (SBL6) 243A and (SBL7) 243B to an inhibit line (VINHSEG0) 274. A line (CL0) 264 is the common line coupled to common lines of the first four rows of memory cells. A line (CL3) 269 couples to common lines of the last four rows of memory cells. A set of control gates (CG0) 262, (CG1) 263, (CG2) 265, (CG3) 266 couples to control gates of memory cells of the first four rows respectively. A set of control gates (CG12) 267, (CG13) 268, (CG14) 270, (CG15) 271 couples to control gates of memory cells of the last four rows, respectively. A pair of inhibit select lines INHBLB0 272 and INHBLB1 273 couples to gates of transistors 231, 233, 235, 237 and transistors 230, 232, 234, 236 respectively. A pair of bitline select lines (ENBLB0) 260 and (ENBLA0) 261 couples to gates of transistors 221, 223, 225, 227 and transistors 220, 222, 224, 226, respectively.

Multiple units of the basic array unit (ARYSEG0) 290 are tiled together to make up one sub-array (MFLSUBARY) 101 as shown in FIG. 3C. And multiples of such (MFLSUBARY) 101 are tiled horizontally to make up the final 8192 columns for a total of 32768×8192=268,435,460 physical memory cells, or called 256 mega cells. The logical array size is 256 mega cells×4 bits per cell=1 giga bits if 4-bit digital multilevel memory cell is used or 256 mega cells×8 bits per cell=2 giga bits if 8-bit digital multilevel memory cell is used. The top bitlines (BLP0) 240, (BLP1) 241, (BLP2) 242, and (BLP3) 243 run from the top of the array to the bottom of the array. The segment bitlines (SBL0) 240A, (SBL1) 240B, (SBL2) 241A, (SBL3) 241B, (SBL4) 242A, (SBL5) 242B, (SBL6) 243A, and (SBL7) 243B only run as long as the number of rows within a segment, for example, 128 rows. Hence the capacitance contributed from each segment bitline is very small, e.g., 0.15 pF.

The layout arrangement of the top bitlines 240-243 in relative position with each other and with respect to the segment bitlines (SBL0) 240A, (SBL1) 240B, (SBL2) 241A, (SBL3) 241B, (SBL4) 242A, (SBL5) 242B, (SBL6) 243A, (SBL7) 243B are especially advantageous in reducing the bitline capacitance. The purpose is to make the top bitlines as truly floating as possible, hence the name of truly-floating-bitline scheme.

Figure 5A:
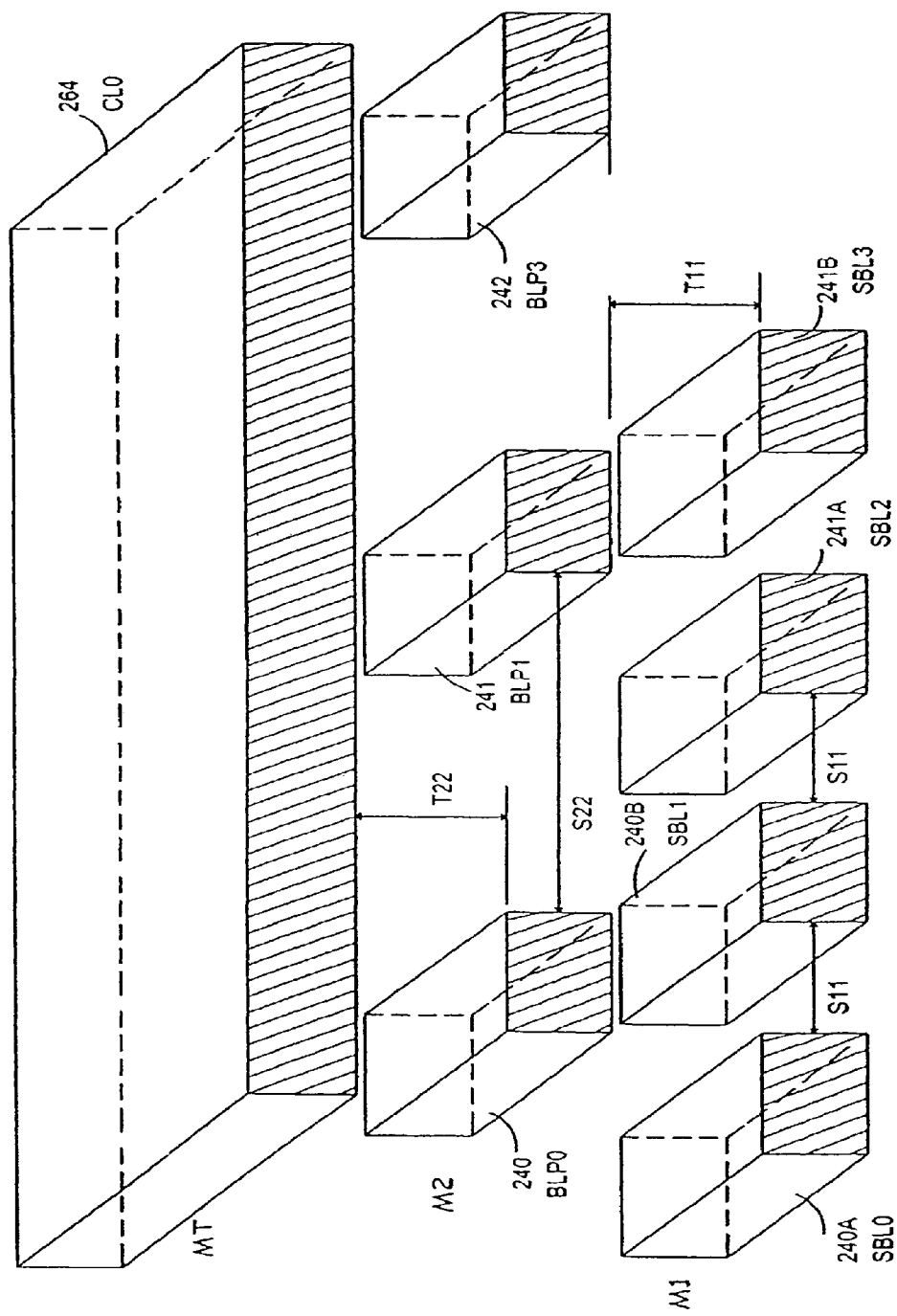
FIG. 5A is a cross section of inhibit and select segmentation interconnection.

In an embodiment as shown in FIG. 5A, lines 240, 241, and 242 are in the middle, sandwiched between lines 240A, 240B, 241A and 241B in the bottom and lines (CL0) 264 in the top. Furthermore, line 240 is on top of the spacing between lines 240A and 240B and line 241 is on top of the spacing between lines 241A and 241B. This has the benefit of reducing significantly the bottom plane capacitance of line 240 and line 241 since the oxide below each line is almost doubled. The lines 240 and 241 could be positioned on top of lines 240A and 241A, respectively, when the sidewall capacitance reduction outweighs the benefit of the bottom plane capacitance reduction. The sidewall capacitance refers to the capacitance resulting from the vertical walls of a line, the bottom plane capacitance refers to the capacitance from the bottom of a line, and the top plane capacitance refers to the capacitance from the top of a line.

Figure 5B:
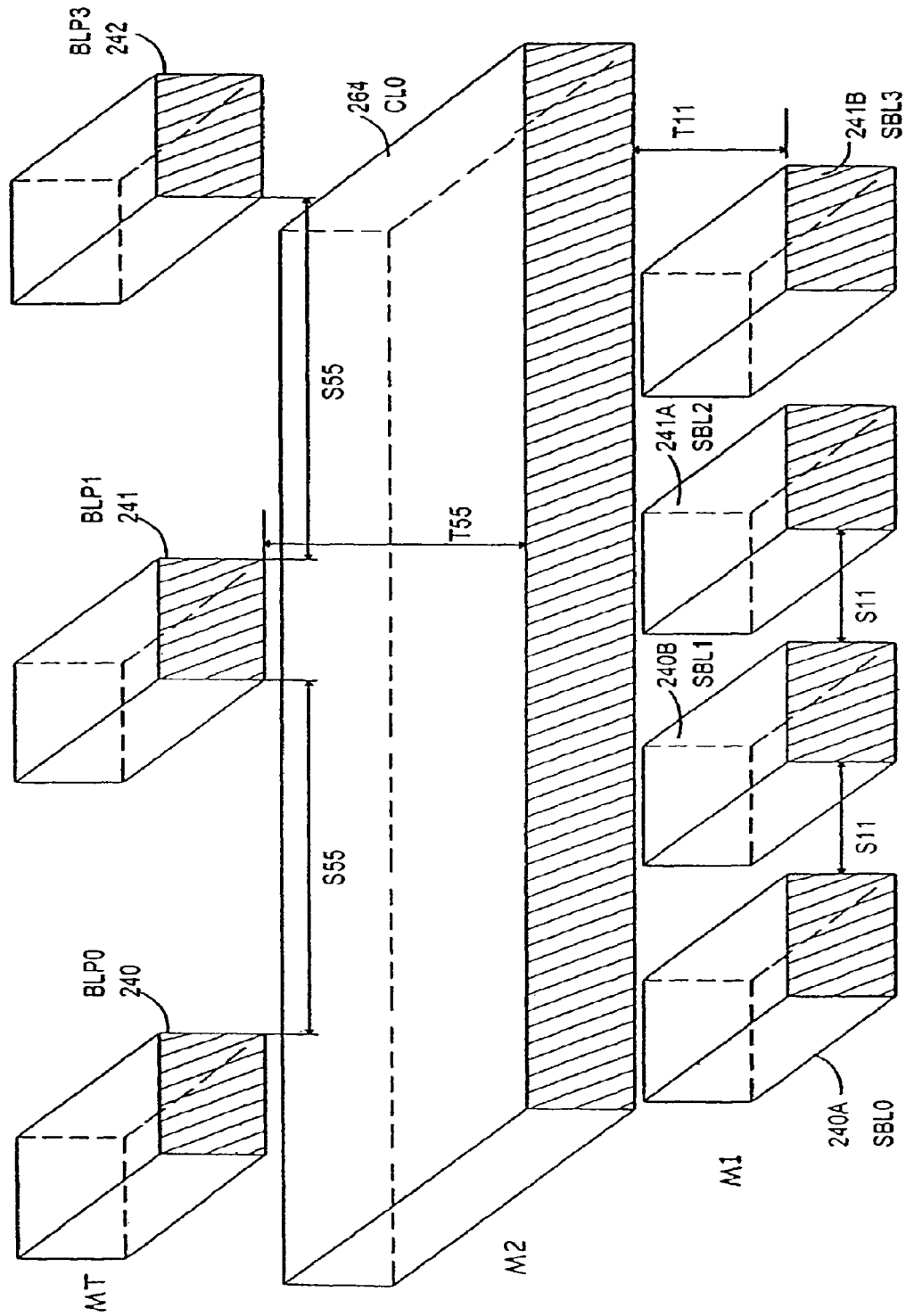
FIG. 5B is a cross section of another embodiment of inhibit and select segmentation interconnection.

In another embodiment, as shown in FIG. 5B, the top bitlines 240-242 have been positioned all the way to the top metal of a multi-layer metal integrated circuit system. For example, for a 5-layer metal integrated circuit system, the top bitlines are metal 5 layer. This avoids the top plane capacitance of the top bitlines 240-242. This also reduces the bottom plane capacitance of the top bitlines 240-242 by a factor of as much as 4 if metal 5 is used. The reduction factor of 4 is due to the oxide below the line increasing by a factor of about as much as 4. Also since the top bitlines 240-242 are spaced further apart as compared to the segment bitlines, the sidewall capacitance is reduced significantly. The top bitlines are now almost floating on top of the array. The end effect is more than on order of magnitude reduction in bitline capacitance. Also since the top bitlines 240-242 spacing are relaxed, the width of the top metal lines can be made larger to reduce the metal bitline resistance.

The reduction in bitline capacitance results in a corresponding increase in speed. To help increase the speed in programming, a bitline-stabilization-assisted operating method can be applied and is described as follows. At the beginning of the programming cycle, a bitline stabilization control signal is used to set all the bitlines to a predetermined voltage VBLPRE, e.g., 0.4-0.8 V. Then high voltage VCL is applied to selected memory common lines for programming. Now the bitlines only have to move partially to a final voltage. This speeds up the TBL timing.

There is an important transient effect related to bitline capacitance in programming. For high speed writing, each program cycle takes time in the microsecond range. The program bias condition for a memory cell is control gate voltage VCGP, =~0.7-2.5 V, bitline cell current Ipcell, =~50-500 nA, and common line voltage VCL going from a low, =~0 V, to a high programming voltage, =~8-13 V. As the VCL ramps from a low to a high voltage, there is a transient current flowing through the memory cell to charge up the bitline node capacitance. This transient current flowing through the cell contributes to the cell programming in addition to the programming current Ipcell. Prior art CHE programming would not be bothered with this effect since the additional transient programming current is small compared to the actual programming current. However, for a very fine programming voltage level control as required for high bits per cell, this effect will cause the programming level to be uncontrollable, making the multilevel memory system useless. The following example is given to appreciate the magnitude of this transient current. Assuming program VCL ramp time=1 µs, CBL=1 pF, the voltage the bitline has to slew=1 V, then, by equation (2), I=CV/T=1 pF×1 V/1 µs=1 µA, which can be 10× the programming current. Hence a method is needed to reduce the transient programming current.

Two approaches are shown in FIG. 5C to reduce this transient phenomenon. In one embodiment, 2-step ramp rate control approach greatly reduces this transient effect without prolonging the programming time as follows. First VCL ramps fast during TRP1 to an intermediate voltage VCLINT, e.g., 2-6 V, then VCL stays at an intermediate voltage for a finite time TVCLINT, then VCL ramps slow during TRP2 to a final voltage VCLFIN. The first fast ramp with the flat intermediate time TVCLINT will let transient current flowing through the cell to stabilize most of the cell capacitances such as CBL in a short time and at sufficiently low VCL voltage so that insignificant programming takes place while the transient current is flowing. The TRP1 is made fast to consume little programming time. The second slow ramp then brings the cell to a final programming voltage without affecting the programming rate since very little current is flowing through the cell in the second ramp.

Another embodiment of the ramp rate control is a fast-slow ramp rate control approach. VCL first ramps fast during TRP1 to an intermediate voltage VCLINT, then VCL ramps slow during TRP2 to a final voltage VCLFIN. The first ramp TRP1 is faster than that of the TRP2 ramp to allow the transient current during the first ramp TRP1 to stabilize quickly all the cell capacitances while VCL is low enough to not cause significant programming.

The ramp rate can be generated by a RC network, meaning the rate is controlled by a certain capacitance multiplied by a certain resistance, or by a CV/I network, meaning the rate is controlled by a certain capacitance multiplied by a voltage swing divided by a certain bias current. Further, the ramp rate can be programmable by programmable fuses as a function of bitline capacitance to optimize the programming time without introducing adverse transient current. That is the ramp rate is made to be faster for smaller bitline capacitance.

The common line CL0 264 is common to four rows of memory cells for the following reason. Allowing 4 mV voltage drop along the CL line during programming to avoid programming error as described previously, with 1024 cells operating simultaneously with 0.1 µa drawn per cell, the voltage drop by equation (1) is, dVCLP=4 mV=0.5*(1024)

(1025) R8cell*0.1 μa, hence R8cell=76 milliohms. For a typical CL line with the line width half as wide as the memory cell, the CL resistance per cell is =~80 milliohms, for 8 cells in series, R8cell is 8×80=640 milliohms, which is much greater than 76 milliohms. Hence by making CL line 264 four memory cells wide, R8cells is =~80 milliohms. The reason the width of the line CL 264 cannot be made arbitrarily large is due to the program disturb. As the high voltage is applied to CL line 264 in programming, all the cells connected to the CL line 264 will see the VCL voltage whether they are selected for programming or not. The more cells connected to the same CL line, the longer time for the disturb for the unselected cells.

Shown in FIG. 4A are the metal strapping lines (CL0STRAP) 264S and (CL3STRAP) 269S of the common lines that connect the diffusion common lines to the metal common lines. The metal strapping could be done every 8, 16, or 32 memory cells depending on an allowable voltage drop along the common line diffusion inside the strapping. This voltage drop depends on the diffusion common line resistance for a given operating current.

An alternative method that mitigates the voltage drop problem along the common line in the program cycle is by the constant-total-current-program scheme. Namely by keeping the same total current flowing all the time independent of whether the cells have been verified or not, the common line voltage drop is kept constant during programming. This could be done for example, by adding additional switching transistors in the array every 8, 16, 32, or 64 memory cells and switching into the CL line the current equivalent to the current from verified cells.

Table 1 shows the operating conditions for the memory array in read, erase, and program. The array operating conditions are shown for the cell 200 of the block ARY1BLK 290A in FIG. 4A, of a selected page for read and program. The selected cell 200 is one cell out of 1024 selected cells within a selected page. The other 1023 selected cells belong to the other 1023 ARYSEG0 290 connected horizontally. The array operating conditions are also shown for all cells connected to CL0 264 for erase.

As shown in Table 1, the operating conditions are such that all the unselected memory cells see no voltage other than 0 volts. This reduces significantly the power consumption. This is also particularly advantageous for improved speed in very high-density memory chips since all the necessary driver circuits only see the loading from the selected memory cells. The loading from the whole array is tremendous due to large number of transistors in array, e.g., 256 million transistors, with its tremendous diffusion, metal and poly interconnect parasitics. For example, one bitline capacitance, CBL is 25 pF, with 8192 bitlines the total bitline capacitance is 8192×25 pF=204 nF. This would require a tremendous amount of power during signal switching, for example, to inhibit all the bitlines during programming. Also not shown in Table 1, the unselected control signals ENBLAs, ENBLBs, INHBLAs, and INHBLBs for unselected array units ARYSEG0 290 only see 0 or VDD but not the multiplied high voltage. This again saves significant power and increases speed due to no loading from unselected control circuits.

Another factor that is reduced greatly is the excessive leakage current from the bitline to ground due to junction leakage, bitline to bitline leakage, band-to-band tunneling, and cell subthreshold conduction. For example, for a typical leakage of 10 pA per cell, with 16,384 cells per bitline, the total leakage is 164 nA, which is greater than Ipcell=100 nA. This implies that the multilevel programming will be uncontrolled due to the uncontrollable excessive leakage current contributing to the controlled programming current Ipcell. With the inhibit and segmentation scheme, the total leakage current is reduced to 128×10 pA=1.28 nA, which is much less than Ipcell=100 nA.

Figure 4B:
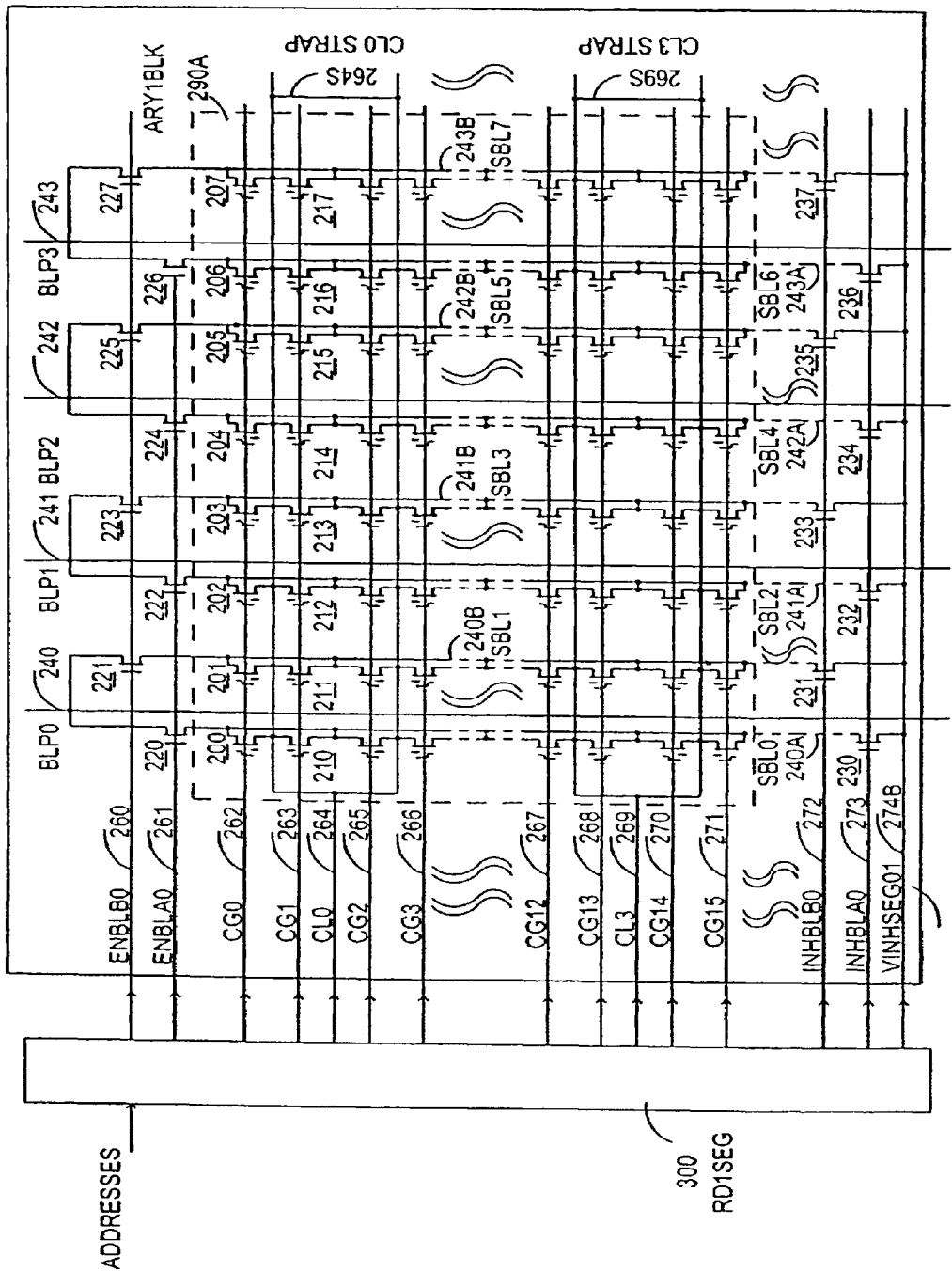
FIG. 4B shows an alternate embodiment of the inhibit and select segmentation scheme.

FIG. 4B shows an alternative array architecture in which the decoded inhibit line VINHSEGO1 274B is shared between any two adjacent segments. This has the benefit of reducing the number of inhibit lines in the array.

Figure 4C:
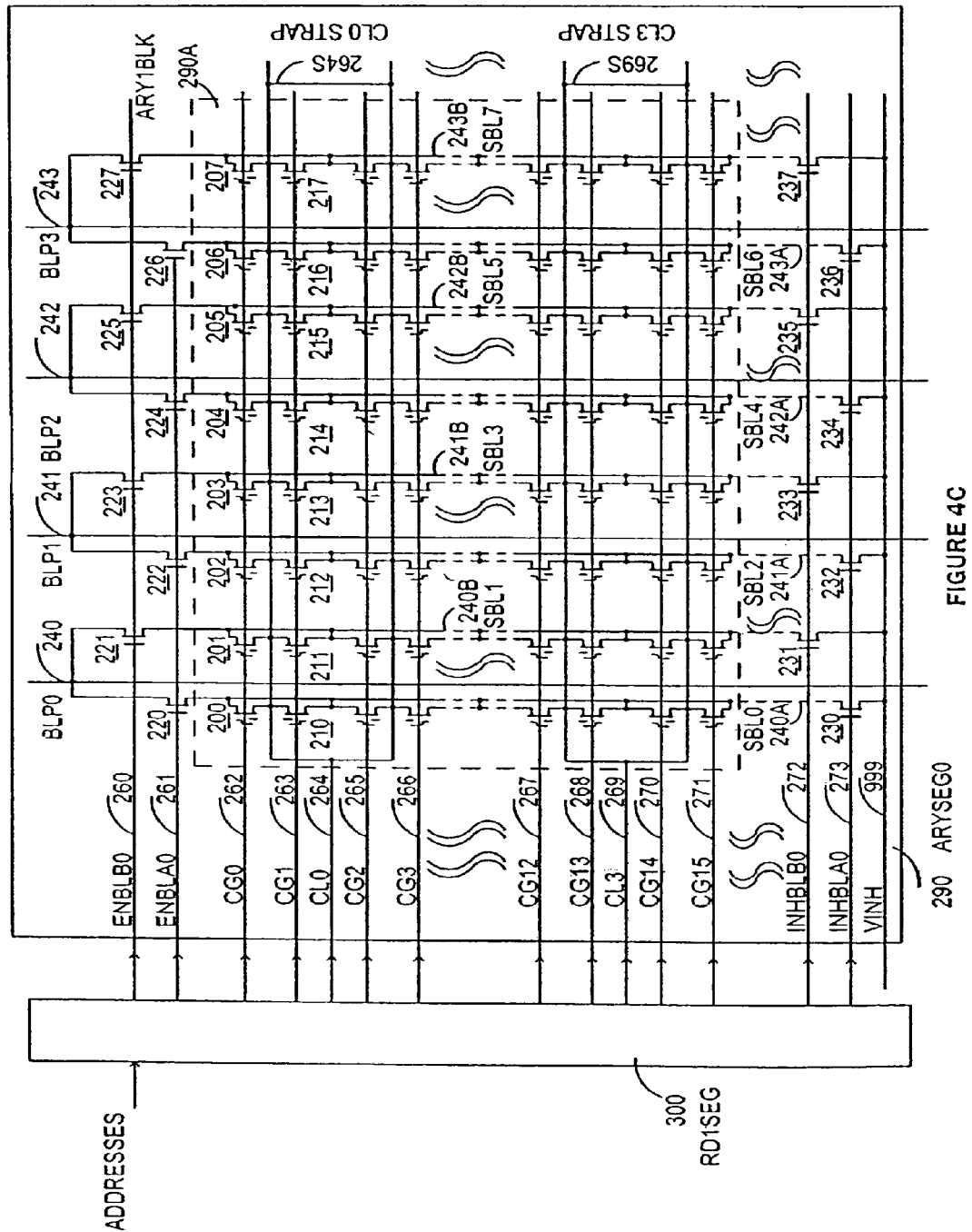
FIG. 4C shows another alternate embodiment of the inhibit and select segmentation scheme.

FIG. 4C shows an alternative array architecture in which the inhibit line VINH 999 is shared for all the segments. This has the benefit of sharing one inhibit line for the whole array.

Figure 4D:
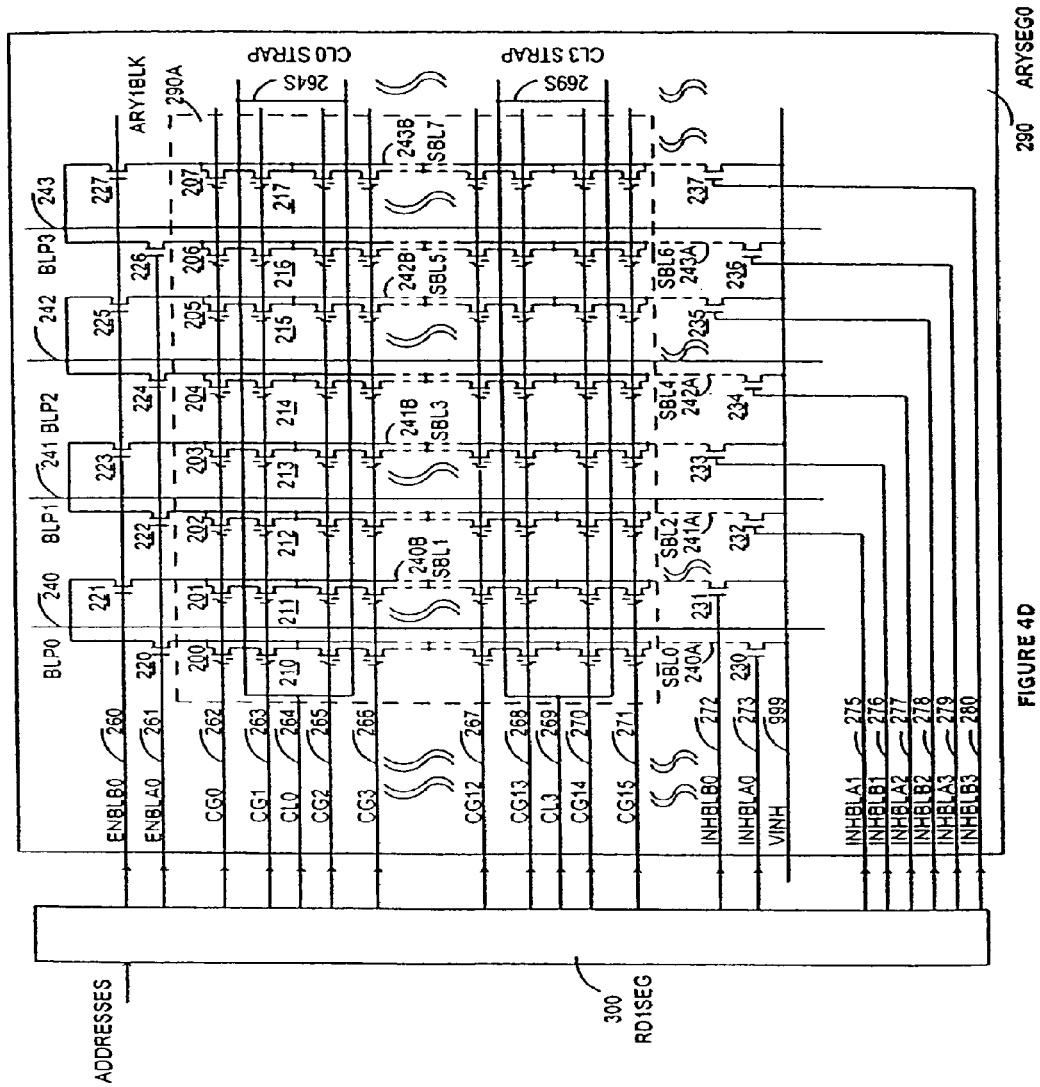
FIG. 4D shows another alternate embodiment of the inhibit and select segmentation scheme.

FIG. 4D shows an alternative array architecture in which a set of inhibit select line INHBLA1-3 and INHBLB1-3 275 to 280 are used to inhibit all segment bitlines except the selected segment bitline. VINH 999 is shared for all the segments. The operating method makes use of a segment cascading scheme that is described as follows. To even isolate the bitline capacitance further, bitline select transistors 220-227 are also used as cascading transistors in programming in addition to the select and inhibit function. In programming, cell 200 for example, the voltage on line 261 is initially pulsed high to pass inhibit voltage VINH 999 from a page select (PSELS) 120S into the selected segment bitline (SBL0) 240A. Then the voltage on line ENBLA0 261 is pulsed to a cascading voltage (VPBCAS), e.g., 1 V. A precharge signal then charges the selected top bitline (BLP0) 240 to 0.3V. The final voltage on the top bitline (BLP0) 240 is =~0.3 V since 1V−VT=~0.3 V. Hence the voltage on line BLP0 240 no longer changes during programming. The voltage on the segment bitline, however, still changes as VCL is applied and stabilized. But the capacitance on the segment bitline is minimal, =~0.15 pF. Here the operating method just described could also apply to the array shown in FIG. 4A but the inhibit voltages on the unselected segment bitlines are floating. The array shown in FIG. 4D just makes sure all the unselected segment bitlines are kept at a constant inhibit voltage (VINH) 999.

Figure 4E:
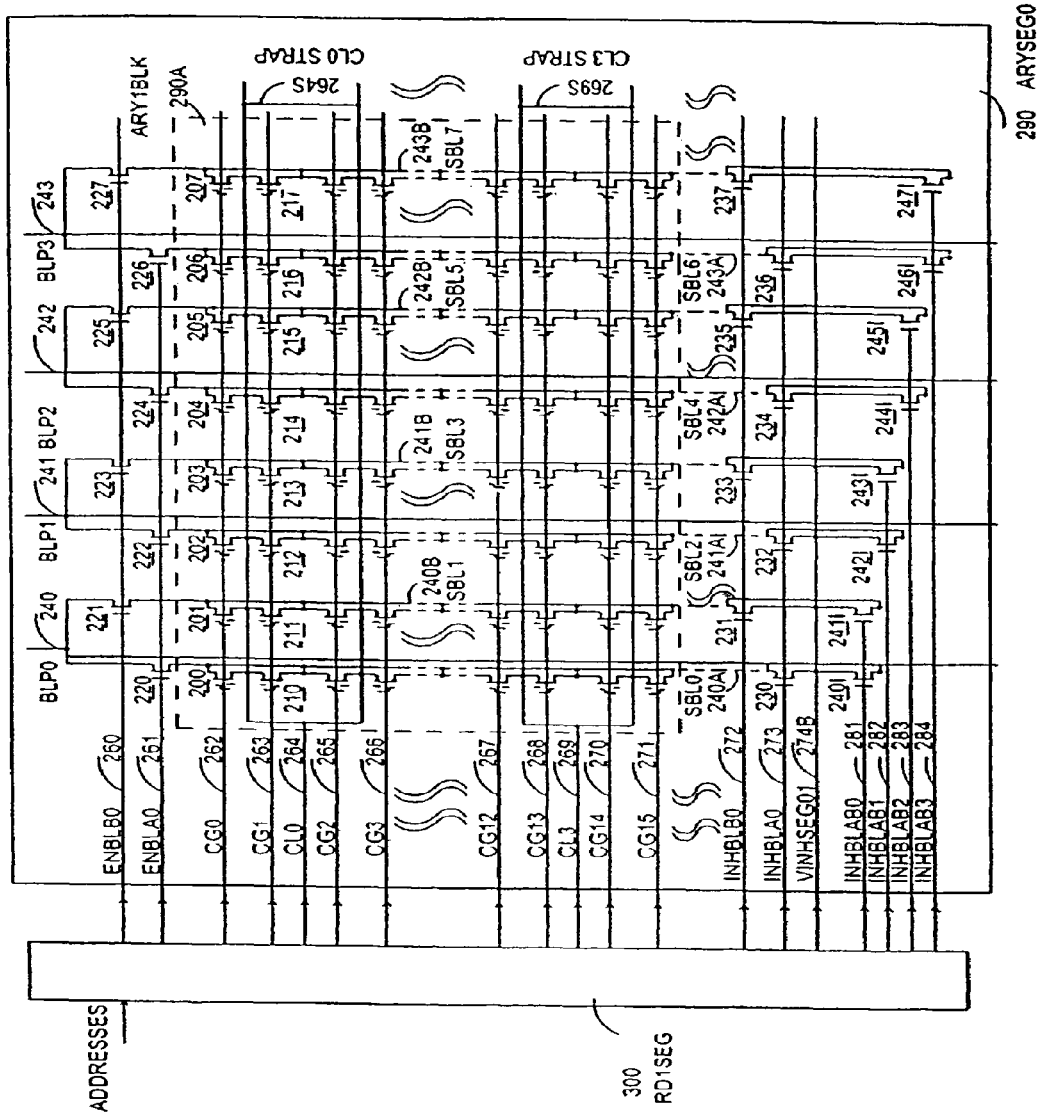
FIG. 4E shows another alternate embodiment of the inhibit and select segmentation scheme.

FIG. 4E shows another array suitable for the method just described above. It needs a set of 4 additional lines (INHBLAB0-3) 281-284 and a set of 8 additional transistors 240I-247I for inhibit decoding. However additional transistors 240I-247I occupy less die area than that required for additional inhibit decoding lines 275-280 in FIG. 4D.

Figure 4F:
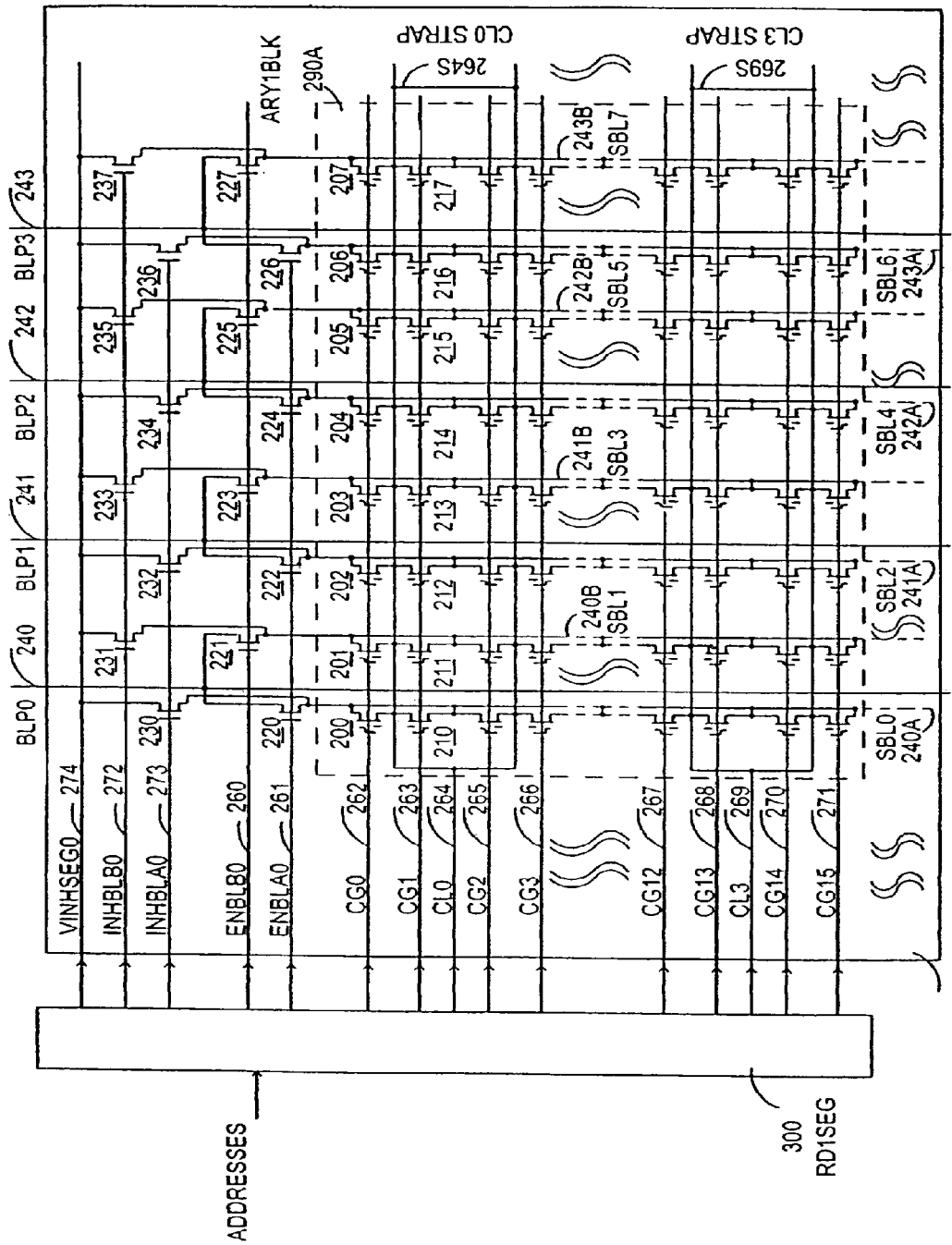
FIG. 4F shows another alternate embodiment of the inhibit and select segmentation scheme.

FIG. 4F shows an array architecture similar to that in FIG. 4A with the inhibit transistors physically at the top of the segment array.

Note that it is possible to do one top bitline per one segmented bitline in the ARYSEG0 290. In this case, the sidewall capacitance from one top bitline to adjacent top bitlines increases due to reduced spacing between the top bitline and the adjacent top bitlines.

Note that it is also possible to do one top bitline per more than two segmented bitlines in the ARYSEG0 290. In this case, more decoding transistors are needed in the array to select one segmented bitline out of more than two segmented bitlines, which leads to more die size. However the sidewall capacitance from one top bitline to adjacent top bitlines decreases due to increased spacing between the top bitline and the adjacent top bitlines. This reduction of capacitance may not be significant if the spacing is already wide enough.

An alternative embodiment of reducing the bitline capacitance is by hierarchical interconnect segmentation that is an extension over the previous concept as follows. A first segment bitline running in first layer of metal couples to a plurality of memory cells. A second segment bitline running in second layer of metal is coupled to a plurality of first segment bitlines by bitline segment transistors through vias between metal 1 and metal 2. Third segment bitline running in third layer of metal is coupled to a plurality of second segment bitlines by other bitline segment transistors through vias between metal 1 and metal 2 and metal 3. This can continue to higher metal layers. This approach allows optimization of horizontal spacing, vertical spacing, interconnect width, and interconnect length between different layers of interconnect metals for minimum capacitive coupling between metal interconnect lines. This results in further reduced bitline capacitance.

TABLE 1

Array Operating Conditions

|  | READ | ERASE | PROGRAM |
|---|---|---|---|
| SELECTED SEGMENTS: |  |  |  |
| CG0 | 3-6 V | 8-13 V | 0.7-2.5 V |
| CG1, 2, 3 | 0 |  | 8-13 V |
| CG4-15 | 0 | 0 | 0 |
| Rest of all CG lines | 0 | 0 | 0 |
| CL0 | 2-3 V | 0 | 4-13 V |
| CL1, 2, 3 | 0 | 0 | 0 |
| Rest of all CL lines | 0 | 0 | 0 |
| BL0, 8, 16 . . . | 0 TO 2-3 V | FL or 0 V | 0-0.8 V |
| BL1-7, 9-15, 17-23, . . . | VINH | VINH | VINH |
| UNSELECTED SEGMENTS: |  |  |  |
| All CG lines | 0 V | 0 V | 0 V |
| All CL lines | 0 V | 0 V | 0 V |
| All BL lines | 0 V | 0 V | 0 V |

Figure 6:
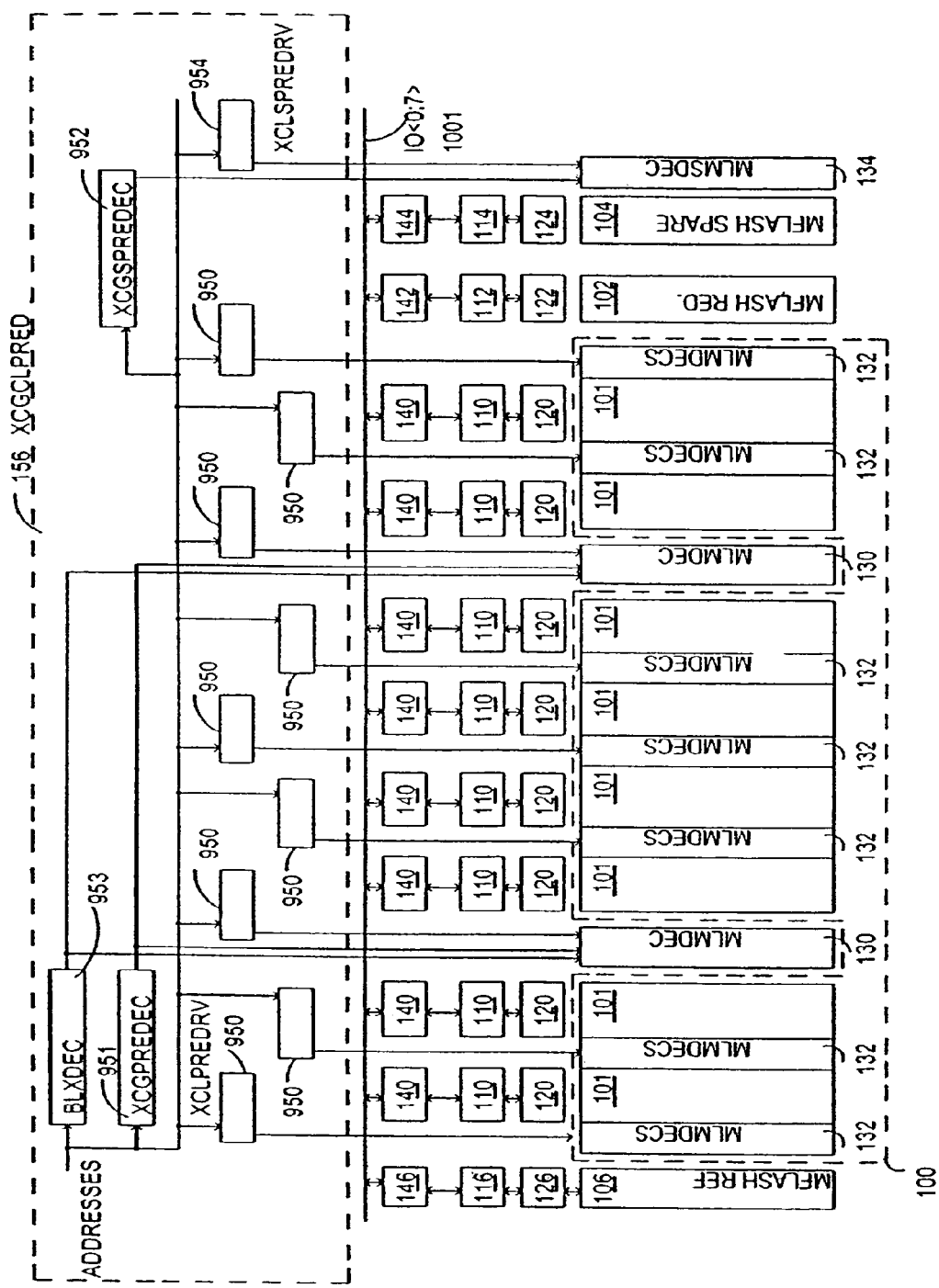
FIG. 6 shows a block diagram of multilevel decoding.

Multilevel Memory Decoding:

FIG. 6 shows the block diagram of the multilevel decoding scheme. The invention provides precision voltages with millivolt control tolerances to the memory array over temperature, process corners, and power supply variation. The invention provides these voltages in an efficient manner, meaning deliver power where it is needed and reducing the output loading through circuit configuration. The invention also provides a multilevel precision decoding circuit with minimum area overhead.

As discussed in the array architecture section, the voltage drop along the common line would cause a programming error as well as sense error in read. Hence the drop is brought down to a manageable level. By partitioning a common line into small line sections, with drivers on both sides of each of the line sections, the voltage drop is reduced. However, prior art partition would cause a tremendous area penalty due to the large amount of decoding lines and circuits. This invention provides an enhanced decoding circuit by routing the interconnect in the higher metal layers and by using circuit configurations suitable for multilevel decoding.

The block (VCGCLPRED) 156 has been expanded to include sub-blocks inside. Common line predecoder and driver (XCLPREDRV) 950 provide predecoded common lines with precision voltages to regular memory common lines in block 130 and 132. A common line predecoder and driver (XCLSPREDRV) 954 provides predecoded common lines with precision voltages to spare memory common lines in block 134. The circuit block 954 is functional equivalent to circuit 950. A control gate predecoder (XCGPREDEC) 951 provides predecoded control gate lines to block 130. A spare control gate predecoder (XCGSPREDEC) 952 provides predecoded control gate lines to block 134. A bitline predecoder (BLXDEC) 953 provides predecoded bitlines to block (MLMDEC) 130. All other circuit blocks have been described in association with FIG. 2A.

Figure 7:
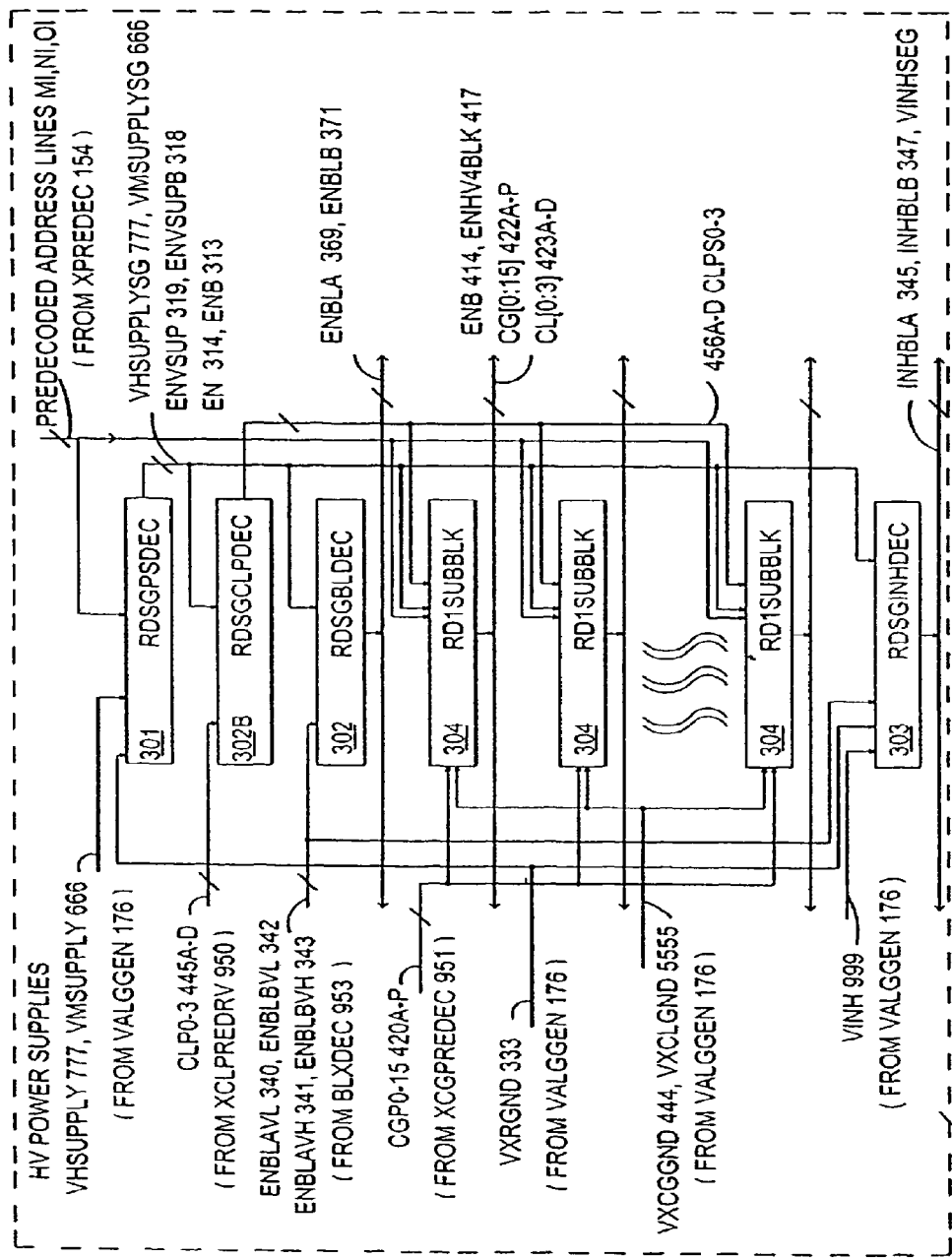
FIG. 7 shows one segment decoder that includes segmented power supply decoder, segmented bitline select decoder, inhibit decoder, segmented predecoded common line decoder, and control gate and control line decoder.

FIG. 7 shows one segmented decoder (RD1SEG) 300. The RD1SEG 300 selects or deselects a plurality of basic array unit (ARYSEG0) 290 connected horizontally. The RD1SEG 300 includes a circuit segmented supply decoder (RDSGPSDEC) 301, a segmented bitline decoder (RDSGBLDEC) 302, a segmented common line pre-decoder (RDSGCLPDEC) 302B, a segmented inhibit decoder (RDSGINHDEC) 303, and multiples of a sub-block decoder (RD1SUBBLK) 304. The RDSGPSDEC 301 decodes the high voltage supply for each segmented decoder (RDLSEG 300). The high voltage supplies for the unselected segmented decoders (RD1SEG) 300 are disabled and hence power is minimized due to much less loading and die size is reduced due to a smaller voltage multiplier. The RDSGBLDEC 302 couples the segment bitlines to the top bitlines when selected. The RDSGINHDEC 303 couples the inhibit voltage (VINH) 999 to the appropriate bitlines of the selected array units (ARYSEG) 290 when selected or unselected as described later in FIG. 9B. The RD1SUBBLK 304 enables appropriate control gates and common lines for the memory cells.

Figure 8:
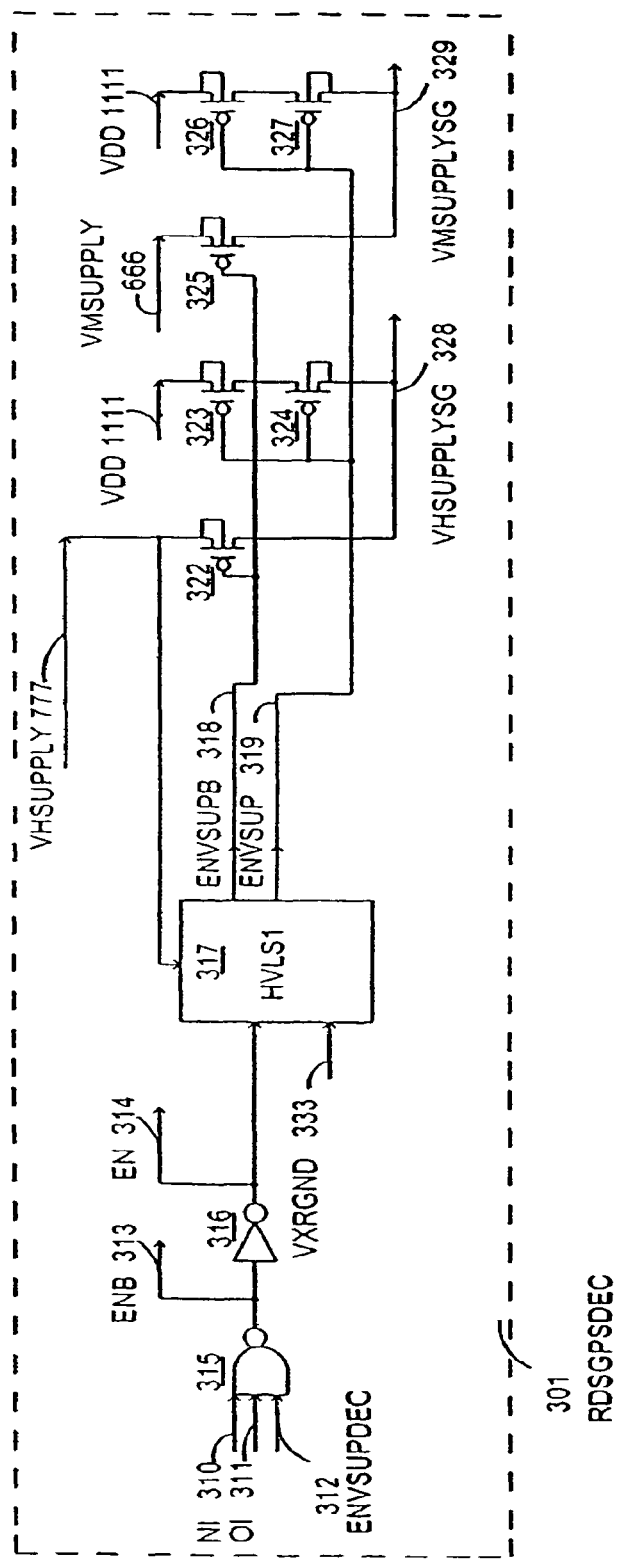
FIG. 8 shows a segmented power supply decoder.

FIG. 8 shows details of the power supply decoder (RDSGPSDEC) 301. Line (NI) 310 and (OI) 311 are predecoded address lines coming from the address predecoder block (XPREDEC) 154. Line ENVSUPDEC 312 is a global enable signal for disabling or enabling all the supply decoders. A NAND gate 315 is a typical 3-input NAND gate with an output line (ENB) 313. An inverter 316 is a typical inverter with input line (ENB) 313 and an output line 314. A high voltage level shifter (HVLS1) 317 shifts logic signal EN 314 into high voltage complementary output signal lines (ENVSUPB) 318 and (ENVSUP) 319. A line (VXRGND) 333 is a low voltage line for (HVLS1) 317. A line (VHSUPPLY) 777 is a precisely regulated high voltage supply for the decoding. A line (VMSUPPLY) 666 is another precisely regulated high voltage supply. A transistor PMOS 322 couples the high voltage supply (VHSUPPLY) 777 into line (VHSUPPLYSG) 328 when the RDSGPSDEC 301 is selected. Transistors PMOS 323 and 324 couple regular voltage supply (VDD) 1111 into line (VHSUPPLYSG) 328 when the RDSGPSDEC 301 is deselected. A transistor PMOS 325 couples another high voltage supply (VMSUPPLY) 666 into line (VMSUPPLYSG) 329 when the RDSGPSDEC 301 is selected. The voltage level on line (VMSUPPLY) 666, e.g., 5-10V, is such that in read the bitline select transistors in the memory array are heavily overdriven to reduce their on resistance, which results in insignificant sense error. Transistors PMOS 326 and 327 couple regular voltage supply (VDD) 1111 into line (VMSUPPLYSG) 329 when the RDSGPSDEC 301 is deselected. The PMOS 323 and 326 have their wells connected to line (VDD) 1111. The PMOS 324 and 327 have their wells connected to the VHSUPPLYSG 328 and VMSUPPLYSG 329, respectively. The connection of their wells is done to avoid source and drain junction diodes turning on during the switching.

Figure 9A:
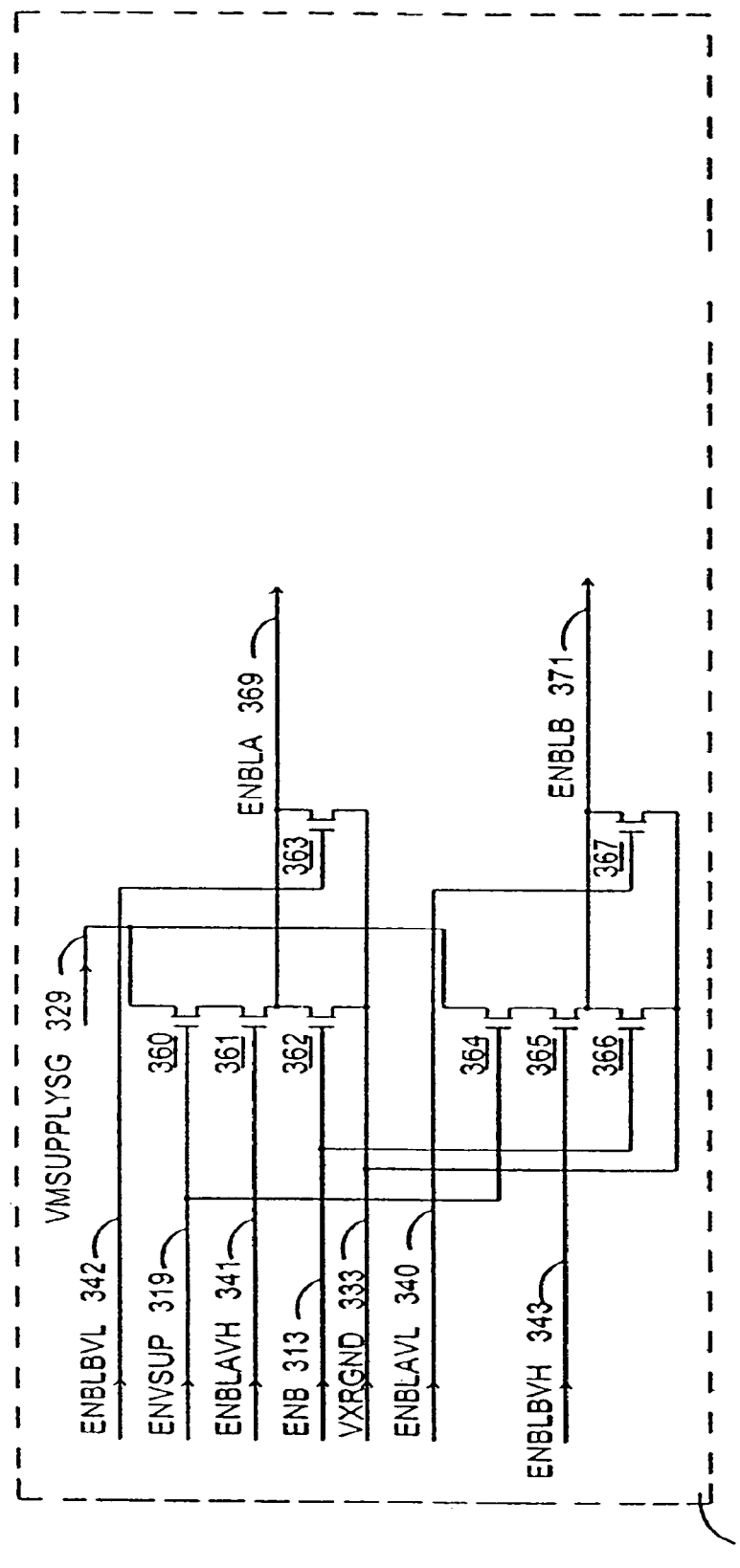
FIG. 9A shows a segmented bitline decoder.

FIG. 9A shows details of the segmented bitline select decoder (RDSGBLDEC) 302. Line (ENVSUP) 319 and line (ENBLAVH) 341 connected to the gates of transistors 360 and 361, respectively, are used to couple voltage on line VMSUPPLYSG 329 into line ENBLA 369. Either transistor 362 with line (ENB) 313 on its gate or transistor 363 with line (ENBLBVL) 342 on its gate is used to couple line (ENBLA) 369 to line (VXRGND) 333. Similarly transistors 364 and 365 together with lines (ENVSUP) 319 and line (ENBLBVH) 343, respectively, on their gates are used to couple voltage on line (VMSUPPLYSG) 329 into line (ENBLB) 371. Either transistor 366 with line (ENB) 313 on its gate or transistor 367 with line ENBLAVL 340 on its gate are used to couple line (ENBLB) 371 to line (VXRGND) 333. The voltage level on line (VHSUPPLY) 777 in the block (RDSGPSDEC) 301, e.g., 7-12 V, is such that the transistors 360, 361, 364, 365 couple, with minimal loss, the voltage from VMSUPPLYSG 329 into lines (ENBLA) 369 and (ENBLB) 371. The deselect transistors 362, 363, 366, and 367 have their gates coupled only to the low voltage signals instead of the high voltage control signals as conventionally done. This circuit configuration has the benefit of reducing significantly the loading for the high voltage supply (VHSUPPLY) 777. This circuit configuration is applied throughout all the decoding circuits.

Figure 9B:
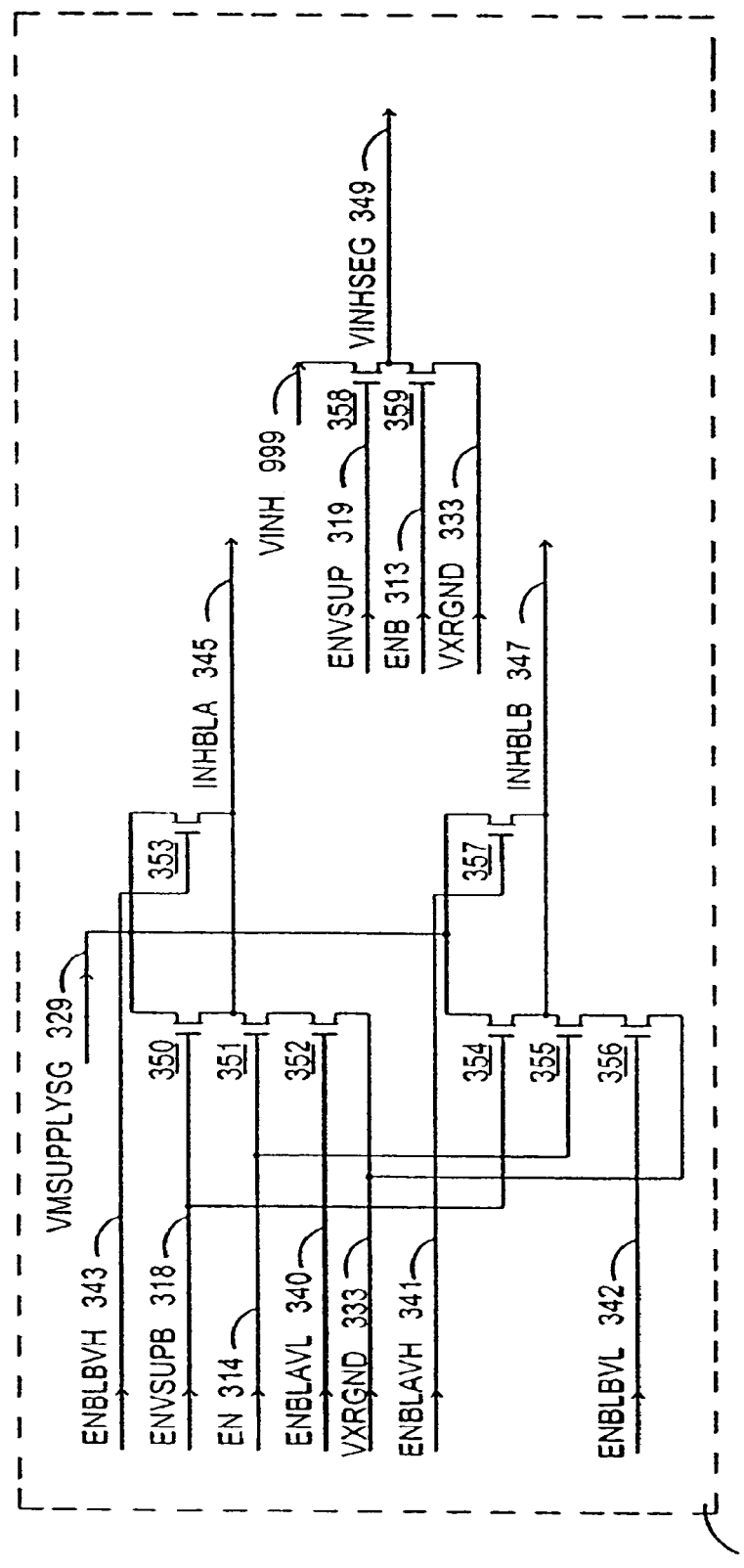
FIG. 9B shows a segmented inhibit decoder.

FIG. 9B shows details of the segmented inhibit select decoder (RDSGINHDEC) 303. Either transistor 350 with line (ENVSUPB) 318 on its gate or transistor 353 with line (ENBLBVH) 343 on its gate couples the voltage on line (VMSUPPLYSG) 329 to line (INHBLA) 345. Transistors 351 and 352 together with lines (EN) 314 and (ENBLAVL) 340, respectively, on their gates are used to couple line (INHBLA) 345 to line (VXRGND) 333. Similarly either transistor 354 with line (ENVSUPB) 318 on its gate or transistor 357 with line (ENBLAVH) 341 on its gate is used to couple the voltage on line (VMSUPPLYSG) 329 to line (INHBLB) 347. Transistors 355 and 356 together with lines (EN) 314 and line (ENBLBVL) 342 respectively on their gates are used to couple line (INHBLB) 347 to line (VXRGND) 333. Transistor 358 with line (ENVSUP) 319 on its gate is used to couple the inhibit voltage on line (VINH) 999 to line (VINHSEG) 349. Transistor 359 with line (ENB) 313 on its gate is used to couple the voltage on line (VINHSEG) 349 to line (VXRGND) 333. Similar to the circuit configuration in the RDSGBLDEC 302, the low voltage signals are used for signal deselection.

The circuit blocks RDSGPSDEC 301, RDSGBLDEC 302, RDSGINHDEC 303, and RD1SUBBLK 304 are used in the array as shown in FIG. 4A for array selection and inhibit decoding.

Figure 9C:
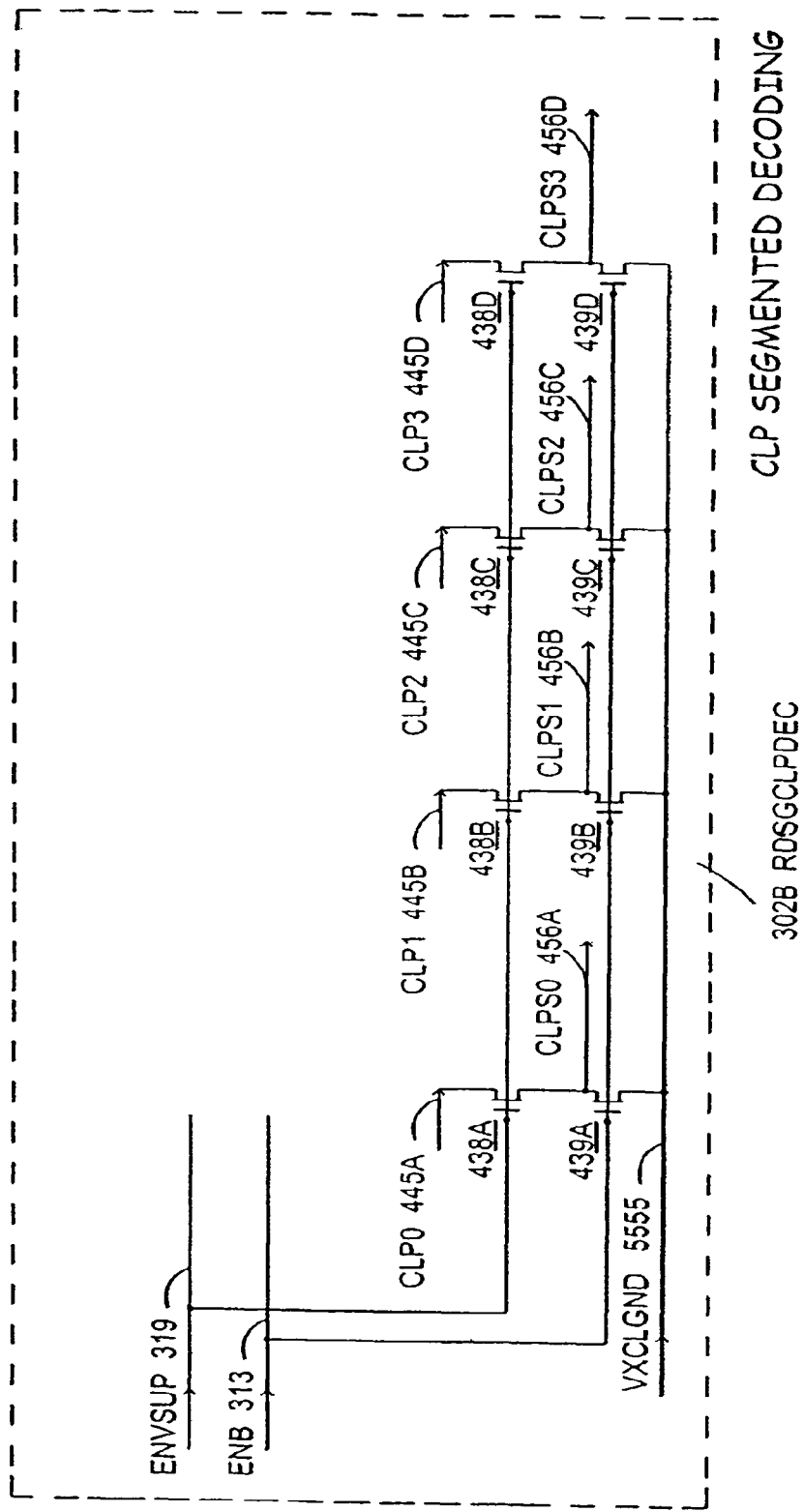
FIG. 9C shows a segmented predecoded common line decoder.

FIG. 9C shows a predecoded common line segmented decoder (RDSGCLPDEC) 302B for lines (CLP0-3) 445A-D. Lines (CLP0-3) 445A-D come from a common line pre-decoder (XCLPREDRV) 950. The purpose of this circuit (RDSGCLPDEC) 302B is to greatly reduce the capacitive loading on lines CLP0-3 seen by the common line pre-decoder (XCLPREDRV) 950. Lines (CLPS0-3) 456A-D are the output lines. Transistors 438A-D with line (ENVSUP) 319 on their gates are used to couple lines (CLP0-3) 445A-D to lines (CLPS0-3) 456A-D, respectively. Transistors 439A-D with line (ENB) 313 on their gates are used to couple lines (CLPS0-3) 456A-D to line (VXCLGND) 5555. This concept of segmented loading could also be applied to predecoded control gates CGP0-15.

Figure 10:
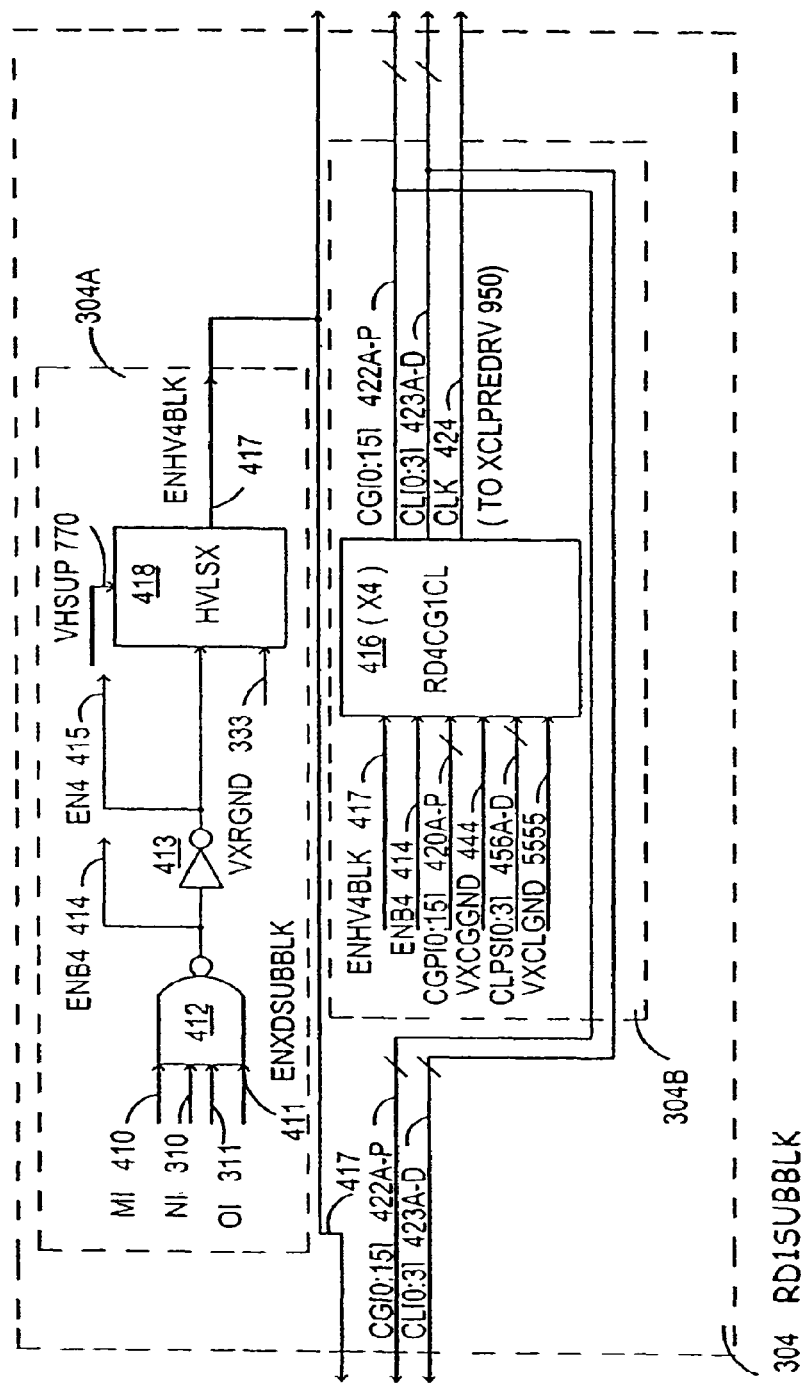
FIG. 10 shows a sub-block decoder for control gate and common line multilevel decoder.

FIG. 10 shows details of the sub-block decoder (RD1SUBLK) 304, that includes a circuit block 304A and a circuit block 304B. The bloc6tgk 304A includes a NAND gate 412, an inverter 413, and a high voltage level shifter (HVLSX) 418. The 3-input NAND gate 412 is used for address decoding. Line (ENB4) 414 is its output. Lines (MI) 410, (NI) 310, and (OI) 311 are predecoded address lines coming from the address pre-decoder (XPREDEC) 154. The inverter 413 inverts line (ENB4) 414 into line (EN4) 415. The high voltage level shift (HVLSX) 418 is used to shift the logic signal EN4 415 into the high voltage output signal (ENHV4BLK) 417. Line (VHSUP) 770 supplies high voltage for the level shifter (HVLSX) 418. Line (VHSUP) 770 couples to line (VHSUPLYSG) 328 of circuit block (RDSGPSDEC) 301. The circuit block 304B including a set of four circuit blocks (RD4CG1CL) 416 provides control signals for control gates (CG) and common lines (CL). Lines CG[0:15] 422A-P couple to 16 rows of memory cells, for example, lines 262, 263, 265-268, 270, 271 of the block (ARY1BLK) 290A in FIG. 4A. Lines CL[0:3] 423A-D couple to 4 shared common lines of memory cells, for example, lines 264 and 269 of the block ARY1BLK 290A in FIG. 4A. Lines CGP[0:15] 420A-P are predecoded control gate lines coming from the control gate pre-decoder (XCGPREDEC) 951. Lines CLPS [0:3] 456A-D are predecoded common lines coming from block RDSGCLPDEC 302B. Line (VXCGGND) 444 is a line for control gate (CG) deselection. Line (VXCLGND) 5555 is a line for common line (CL) deselection.

Figure 11A:
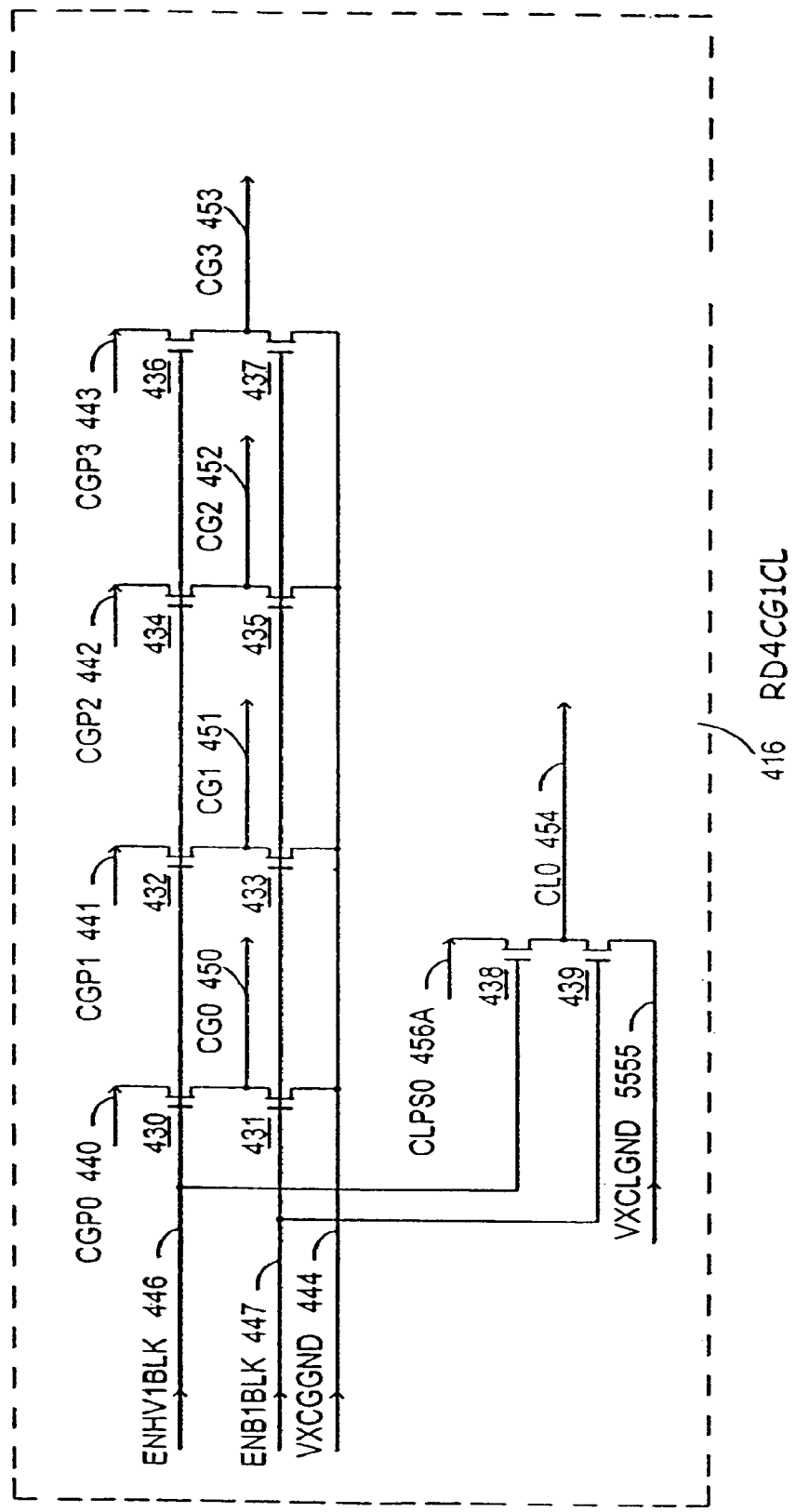
FIG. 11A shows a sub-block of the circuit in FIG. 10 for four control gates and one common line multilevel decoder.

FIG. 11A shows details of circuit block (RD4CG1CL) 416. Transistors 430, 432, 434, 436 together with lines (CGP0) 440, line (CGP1) 441, line (CGP2) 442, line (CGP3) 443, respectively, on their drains are used to couple these lines 440-443 to output line (CG0) 450, line (CG1) 451, line (CG2) 452, and line (CG3) 453, respectively. Lines (CGP0-CGP3) 440-443 come from a control gate predecoder (XCGPREDEC) 951. Transistor 438 is used to couple line (CLPS0) 456A to line (CL0) 454. Transistor 439 is used to couple line (CL0) 454 to line (VXCLGND) 5555. Line (ENHVLBLK) 446 couples high voltage into the gates of transistors 430, 432, 434, and 436. Line (ENB1BLK) 447 couples lines (CG0-3) 450-453 to the line (VXCGGND) 444 through transistors 431, 433, 435, and 437, respectively, and couples line (CL0) 454 to line (VXCLGND) 5555 through transistor 439. The lines (ENHV1BLK) 446 and (ENB1BLK) 447 are coupled respectively to lines (ENHV4BLK) 417 and (ENB4) 414 generated by circuit block 304.

Four common lines of memory cells are coupled together to one decoded common line CL as shown in the block (ARYSEG0) 290 in FIG. 4A. Four blocks of the RD4CG1CL 416 are used to provide array block selection as shown in the block (ARYSEG0) 290 in FIG. 10. One array block is defined as including 16 rows and 4 common lines of memory cells. One array block includes a plurality of blocks (ARY1BLK) 290A connected horizontally.

The lines (VXRGND) 333, (VXCLGND) 5555, and (VXCGGND) 444 could be individually controlled to be biased at different voltage levels during erase, read, and program to optimize circuit functionality, for instance, to increase the breakdown or to reduce the leakage of MOS decoding transistors.

Note that the same transistors are used for decoding in erase, read, and program operation. In conventional decoding, read decoding is isolated from erase and program decoding since read decoding requires only low voltage and hence the decoding size can be optimized for read speed. Here all decoding is combined together to minimize the die size. Further all decoding is done by NMOS transistors instead of by both PMOS and NMOS transistors as conventionally done. This has the benefit of reducing the capacitive loading. This is so because in deselection one PMOS presents itself as a gate capacitor load while one NMOS only presents itself as a source or drain overlap capacitor load, which is much smaller than a gate capacitor load. Low capacitive loading leads to less power consumption for NMOS decoding. This is against conventional wisdom, which holds that a CMOS circuit is more power efficient than a NMOS circuit.

Figure 11B:
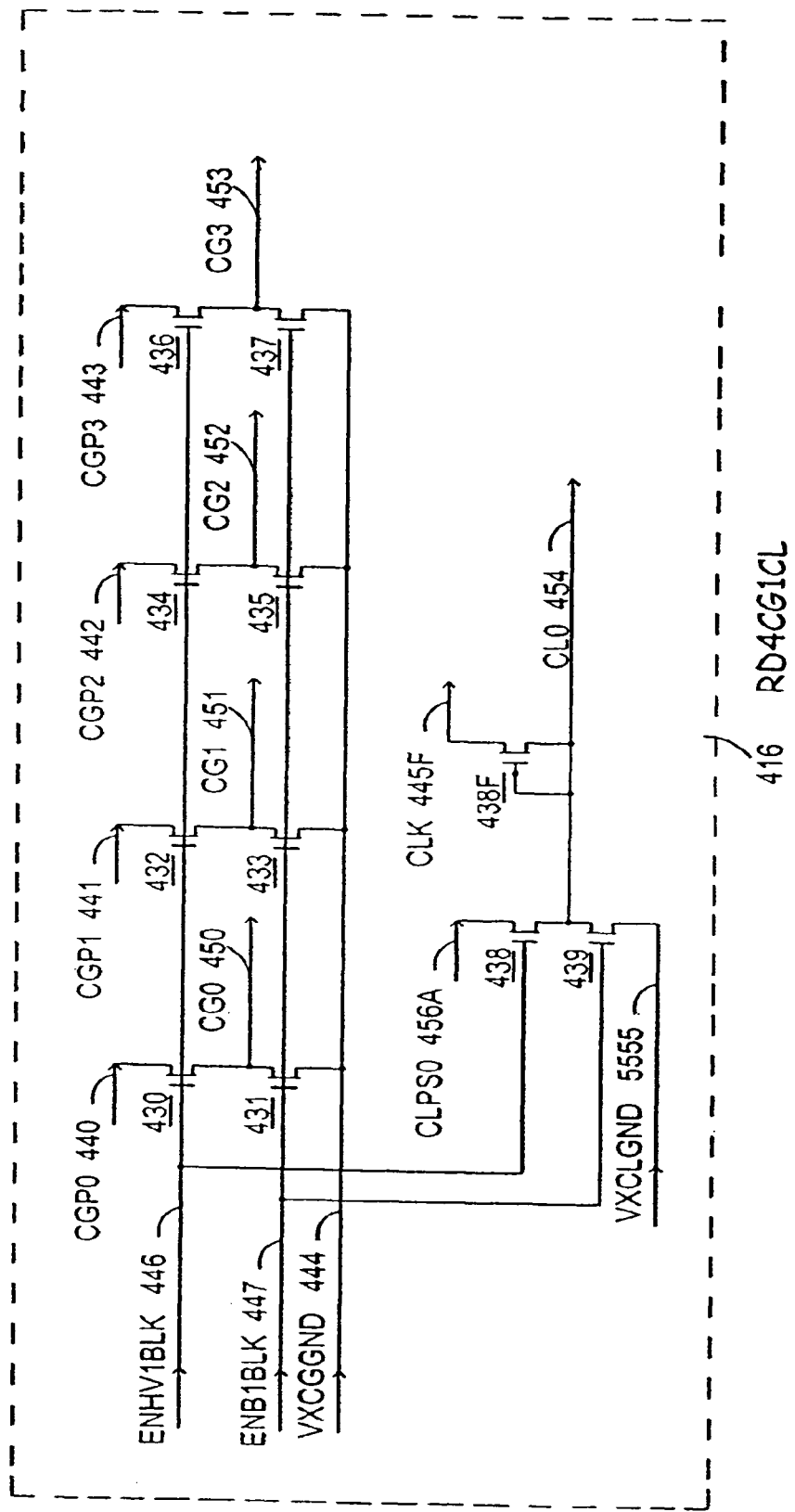
FIG. 11B shows another embodiment of sub-block for four control gates and one common line multilevel decoder with winner-take-all Kelvin connection.

FIG. 11B shows an alternative circuit block (RD4CG1CL) 416 with a diode-connected transistor 438F. The transistor 438F provides feedback signal (CLK) 445F for a Kelvin type connection to a circuit driver inside the block (XCLPRE- DRV) 950. A Kelvin connection line consumes minimal (or no) DC current. A Kelvin connection allows a circuit driver such as a common line circuit driver to stabilize its output signal at a desired voltage level based on feedback voltage from the Kelvin connection line. This Kelvin connection line (CLK) 445F is connected to other Kelvin connection lines vertically. This is possible since only one common line is on at any given time. Once a common line is selected, this common line will take control of the CLK 445F line since the diode-connected transistor will be forward biased and other diode-connected transistors on the rest of the common lines will be reverse biased. This will be known as winner-take-all Kelvin decoder. This winner-take-all Kelvin decoder will ensure a predetermined voltage on the line (CL0) 454 will be stable all the time over varying load, process corners, temperature, and power supply variation with minimum cost. The stable voltage on the common line is required to not introduce significant voltage error in program or in read as described previously in the description of the multilevel array architecture.

Figure 11C:
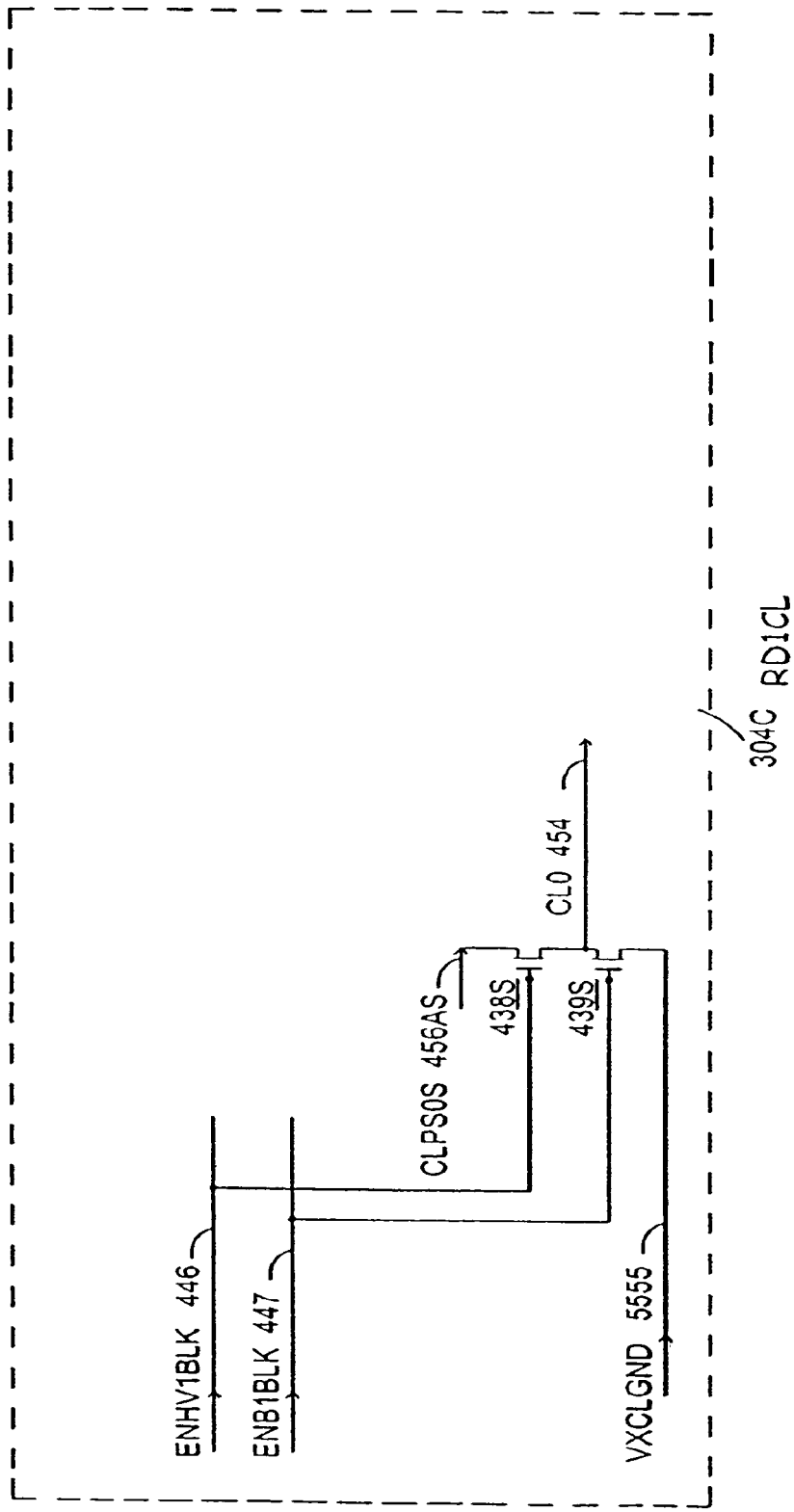
FIG. 11C shows a circuit for one common line driver.
Figure 12:
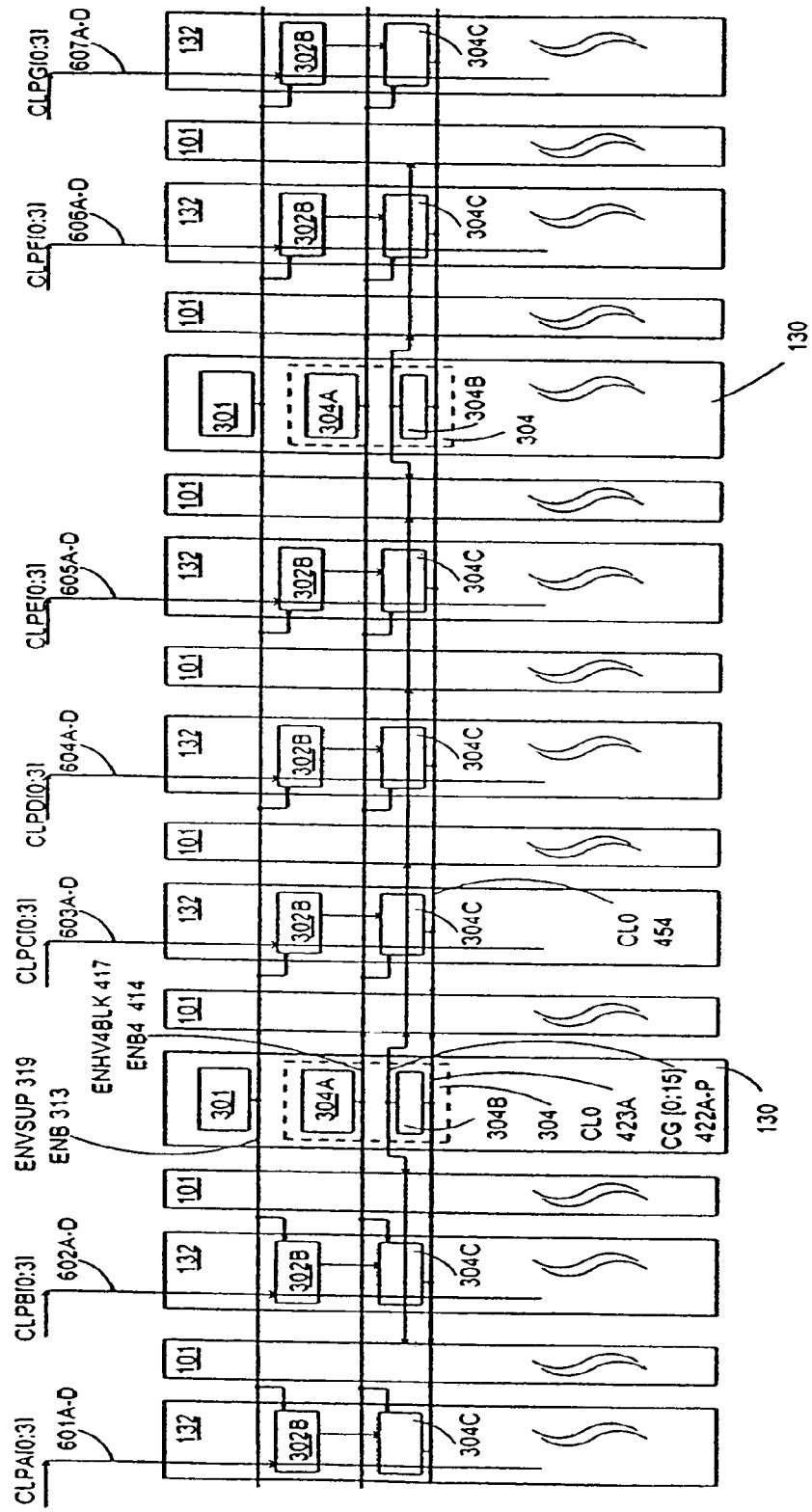
FIG. 12 shows a scheme of the feedthrough-to-driver and feedthrough-to-memory multilevel precision decoding.

FIG. 11C shows a circuit block (RD1CL) 304C, which is used in a common line segmentation scheme with the array partitioning shown in FIG. 12 to reduce the voltage drop along the common lines. In an embodiment, one common line (CL) is connected together across the full array with a plurality of blocks (RD1CL) 304C driving the same common line (CL). Transistor 438S with line (ENHV1BLK) 446 on its gate couples line (CLPS0S) 456AS to line (CL0) 454. Line (CL0) 454 of this circuit block 304C is the same line (CL0) 454 of the circuit block (RD4CG1CL) 416. A deselect transistor 439S with line (ENB1BLK) 447 couples line (CL0) 454 to line (VXCLGND) 5555. The transistor 439S is optional in this circuit since the function of coupling line (CL0) 454 to line (VXCLGND) 5555 is already provided by the transistor 439 in the RD4CG1CL 416. The transistor 439S provides additional drive ability in addition to that of the transistor 439. Line (CLPS0S) 456AS couples to a common line pre-decoder (XCLPREDRV) 950. The winner-take-all Kelvin decoding can also be used here. The control signals (ENHV4BLK) 417 and (ENB4) 414 shown in the block (RD1SUBBLK) 304 couple to control signals (ENHVLBLK) 446 and (ENB1BLK) 447, respectively. The control signals (ENHV4BLK) 417 and (ENB4) 414 are fed through the memory array as shown in FIG. 12. In an alternate embodiment, one common line is divided into many separate common lines across the full array. These separate common lines are not connected to each other. In this case, each separate common line is driven on both sides by two blocks (RD1CL) 304C or by a (RD1CL) 304C and a (RD4CG1CL) 416. Common line segmentation is described more in detail below in description associated with FIG. 12.

FIG. 12 shows a feedthrough-to-memory and feedthrough-to-driver scheme together with the common line segmentation to deliver precise voltages for memory cells as described in the following. The feedthrough scheme exploits the multi-layer metal interconnect to reduce the circuit complexity and die size and to enable innovative circuit configurations. A conventional flash memory system typically only uses up to a maximum of 2 metal layers and hence is limited in core interconnect scheme possibilities. This feedthrough scheme is made possible by three or more metal layers.

The block (MLMDECS) 132, shown in FIG. 12 and also in FIG. 3A, includes a plurality of the blocks (RDSGCLPDEC) 302B and a plurality of the blocks (RD1CL) 304C. Only one block (RDSGCLPDEC) 302B and one block (RD1CL) 304C per block 132 are shown in FIG. 12 for clarity. Other blocks have similar connections. The block (MLMDEC) 130, shown in FIG. 12 and also in FIG. 3A, includes a plurality of the blocks (RD1SEG) 300. The block RD1SEG 300 includes a block (RDSGPSDEC) 301 and a plurality of blocks (RD1SUBBLK) 304. Only the block (RDSGPSDEC) 301 and one block (RD1SUBBLK) 304 inside one block RDLSEG 300 are shown in FIG. 12 for clarity. Other blocks have similar connections.

The feedthrough-to-memory uses a single driver to drive both left and right sides of a memory array. The layout of row decoding circuits such as of the block (RD1SUBBLK) 304 is very dense because of the limited height of a typical advanced memory cell, e.g., 0.5-1 μm per cell height, and the very wide width of each decoding transistor, e.g., 20-50 μm, due to their required precision multilevel drive ability. This makes it extremely difficult to route the required lines from the right side across the active circuit of this row decoding circuit to the left side with limited layers of metal interconnect. As shown in FIG. 10, the control lines CG[0:15] 422A-P and common lines CL [0:3] 423A-D provides the control signals to the memory cells on the right side as well as the memory cells on the left side. This is also shown in FIG. 12 in block 304B with lines pointing to the right as well as to the left. Similarly it also shows the control lines from circuit block 304A and 304C driving both sides. The feedthrough-to-memory scheme also shows predecoded high voltage lines (ENHV4BLK) 417 and (ENVSUP) 319 and predecoded low voltage lines (ENB) 313 and (ENB4) 414 being fed through the memory by running on top of the memory, for example, in metal 4, without interfering with the memory cells underneath. Other control lines could also be fed through the memory. Again this is achievable by three or more metal layers which allow a different circuit configuration with minimal active area. The circuit block 304C is the precision voltage driver for the common lines CL of the memory cells in addition to the circuit block 304B. The feedthrough-to-driver scheme shows control signals from circuit blocks 304B and 304A being fed through the memory array to the precision voltage drivers 304C.

The common line segmentation is also shown in FIG. 12. Each metal common line runs the length of the memory core horizontally across the full array with seven circuit blocks (RD1CL) 304C and two circuit blocks (RD1SUBBLK) 304 driving the same common line. The voltage drop across one common line is thus divided into eight voltage drop segments. Each voltage drop segment belongs to each common line of each sub-array block (MFLSUBARY) 101. Within each voltage drop segment, the voltage value on the left side is same as the voltage value on the right side of the voltage drop segment and the lowest voltage value is in the middle of the voltage drop segment. This is because there is a precision circuit driver (RDLCL) 304C or (RD4CG1CL) 416 on each side of the voltage drop segment. One alternative embodiment of the common line segmentation scheme is to have these common lines physically divided into eight separate common lines. That is, each sub-array block (MFLSUBARY) 101 shown in FIG. 12 has its separate common line. However, in this case, the deselect transistor 439S in the block (RD1CL) 304C is no longer optional but necessary to deselect each separated common line.

The voltage level on the control gates is controlled by the voltage on the lines (CGP[0:15]) 420A-P in circuit block 304. The voltage on lines (CGP[0:15]) 420A-P are in turn controlled by a precise bandgap-referred regulated voltage. Hence precision voltage level is provided at the memory control gates. The voltage level on the common lines is controlled by the voltage on the predecoded common lines (CLP[0:3]) 421A-D in circuit block 304. The voltage on lines (CLP[0:3]) 421A-D are in turn controlled by a precise bandgap-referred regulated voltage for each common line driver. Hence precision voltage level is provided at the memory common lines. The programming and sensing current bias are also bandgap-referred; hence they are highly stable.

Note that in FIG. 12 an alternative embodiment is to share one block (RDSGPSDEC) 301 or 304A across the full array by doing feedthrough of the outputs of (RDSGPSDEC) 301 or 304A across the full memory array. In this case the drive ability of the driver circuit inside block (RDSGPSDEC) 301 or 304A should be adequately designed to drive the long interconnect lines.

Note that in FIG. 10 an alternative embodiment is to have a separate block (RD4CG1CL) 416 for driving the right side of an array and another separate block (RD4CG1CL) 416 for driving the left side of an array. Another alternative embodiment is to share just one CL driver for both left and right sides but to have separate control gate CG drivers for the left side and the right side.

Figure 13:
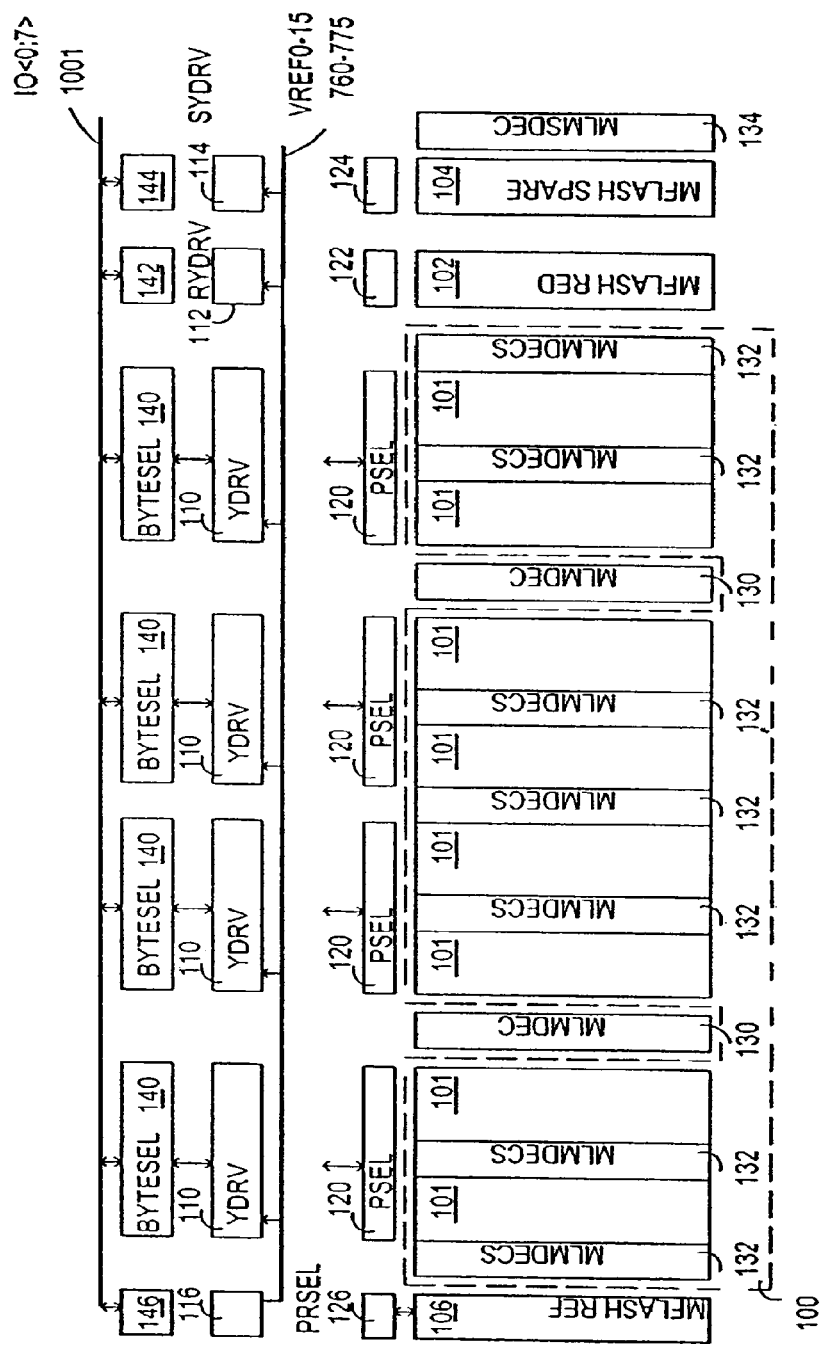
FIG. 13 shows a block diagram of a multilevel reference system.

Multilevel Reference System:

FIG. 13 shows a block diagram for a multilevel digital memory reference system. All the relevant blocks have been described in association with previous figures. The highlighted blocks 106, 116, 126, and 146 with the highlighted lines (VREF0-15) 760-775 are shown to show the reference system in relation to the physical position of the array and y-drivers. The physical position of the reference array corresponding to various schemes is explained in the following description.

Figure 14:
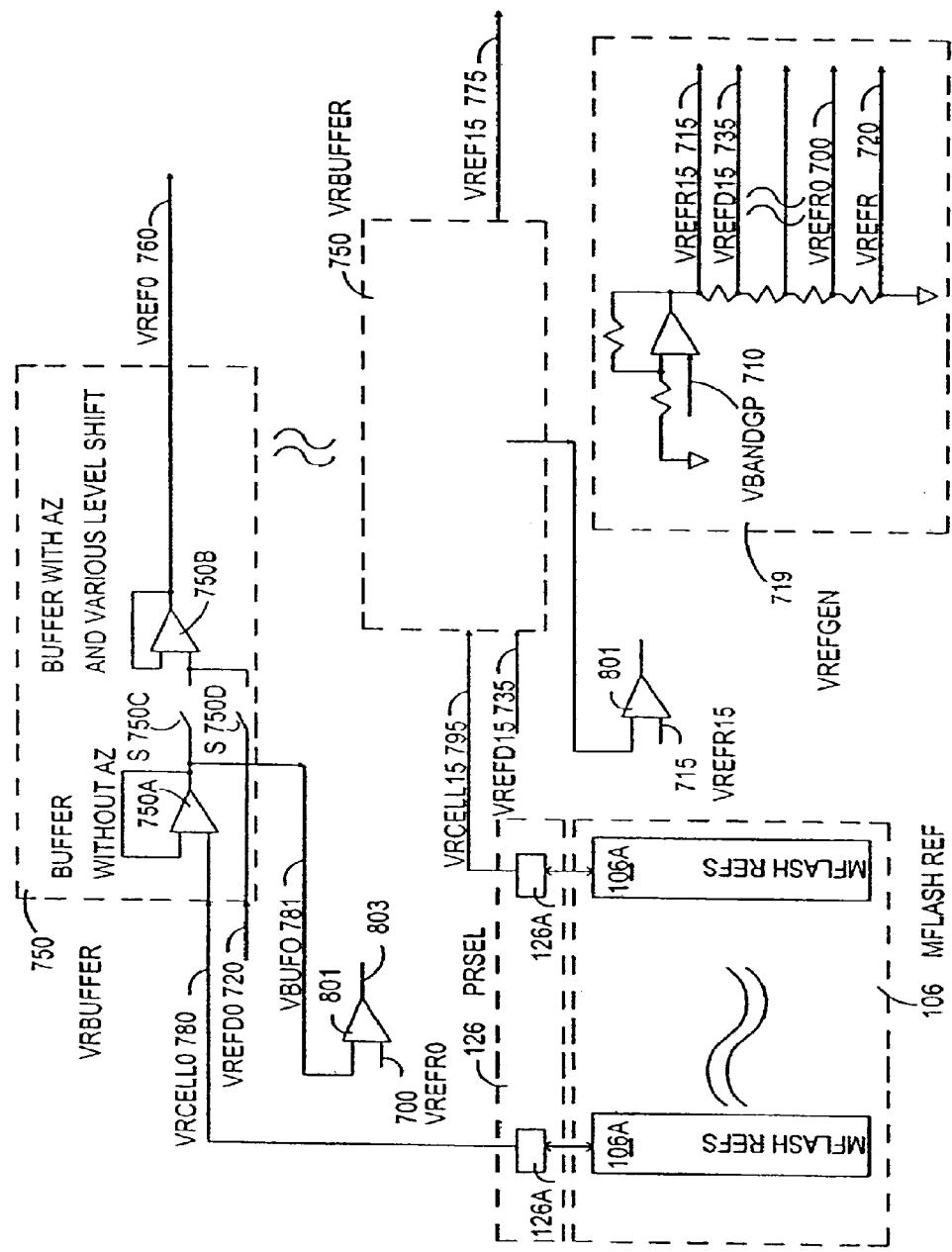
FIG. 14 shows details of a block diagram of a multilevel reference system.

FIG. 14 shows details of a multilevel digital memory reference system. A reference circuit block (VREFGEN) 719 is used to provide all reference voltage levels for erasing, programming, sensing, margin tests, and production tests. Shown are reference levels for reference cells (VREFR0-15) 700-715 and reference levels for data cells (VREFD0-15) 720-735. Data cells refer to memory cells that store digital data. A 16 level multilevel flash cell is assumed for this discussion. A flash reference array (MFLASHREF) 106 includes a plurality of blocks (MFLASHREFS) 106A. A block (MFLASHREFS) 106A includes a plurality of reference memory cells. A reference page select 126A is used to select the reference cells in the blocks (MFLASHREFS) 106A associated with a selected page. Each block 126A selects one reference cell in one corresponding block (MFLASHREFS) 106A. For each selected page, there are 16 blocks 126A selecting 16 reference cells in 16 corresponding blocks (MFLASHREFS) 106A. The 16 selected reference cells makes up one page reference.

A buffer (VRBUFFER) 750 and a comparator 801 are inside a block (REFYDRVS) 116S. The buffer (VRBUFFER) 750 is used to drive each reference level of (VREF0-15) 760-775 for all the y-drivers. A buffer circuit without offset auto zero 750A is used to isolate the reference cell from all capacitance from auxiliary circuits. The offset auto zero cancels out the voltage offset of an analog buffer. The voltage offset of an analog buffer is typically uncontrollable and is caused by threshold voltage mismatch, transistor transconductance mismatch, and systematic offset. This voltage offset would cause an uncertainty in the reference voltage, which would degrade the margin of one voltage level with respect to another voltage level. Line (VBUFO) 781 is used to verify a reference cell is programmed to one desired reference level out of 16 possible reference levels. Line (VBUFO) 781 is used instead of the direct memory cell output for verifying in the verify cycle. This is to include the buffer offset from buffer 750A in the verifying process. The comparator 801 is used to do the actual comparison in verify. A buffer with offset auto zero 750B is used to drive a reference level. Various voltage levels needed for multilevel algorithm are also generated by the buffer 750B with switch capacitor technique. The auto zero is needed to zero out the offset of this buffer since a typical buffer offset is 10-20 mV. This voltage amount if not canceled out would degrade the margin of a reference level, which effectively reduces the voltage margin for each level. Capacitors are needed to accomplish the auto zero and level shifting operation in the buffer 750B. However as described in the array architecture description, any additional capacitance would adversely degrade the write and read speed. Hence buffer 750A is inserted between the reference cell and the buffer 750B so that the reference cell only sees one gate capacitance inside a typical buffer as a capacitor load.

Lines (VREF0-15) 760-775 are the final reference lines driving into all the y-drivers as needed for verify-program cycles and read cycles. Switch S 750D couples line (VREFD) 720 to the input terminal of buffer 750B when one selected page programs for the first time. Switch S 750C couples line (VBUFO) 781 to input terminal of buffer 750B when the same selected page programs for the second time or more without an erase in between program. The reason is that for first time programming, reference levels for data cells come from a reference generator VREFGEN 719 and for subsequent programming reference levels come from the reference cells in MFLASHREFS 106A.

For the memory system described herein, there are 8 pages for each row, 4 rows for each block, and 512 bytes per page with a 4-bit digital multilevel memory cell. Since any one page is written or read at any time a complete reference set of 16 levels is reserved for each page instead of for each row. This is done to preserve the operating conditions through the lifetime of a memory system exactly the same for reference cells as regular data cells. This is done for example to make the reference and data cells have the same voltage readout drift over time. For each row, there are 8×16=128 reference cells. This has some small die size penalty. The reference cells are written at the same time as the regular data cells.

Figure 15:
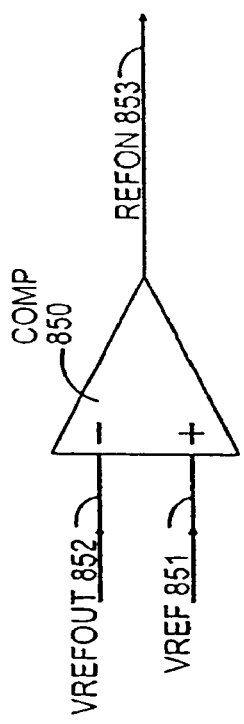
FIG. 15 shows a reference detection scheme.

After the reference cells are written with the first programming sequence, if subsequent programming cycles are allowed to write other data cells in the same page, the previously programmed reference cells stay in the program inhibit mode. This is accomplished as shown in FIG. 15. A comparator 850 is used to compare a reference voltage from a bandgap VREF 851, e.g., 1.2 V, versus a readout voltage from a reference memory cell VREFOUT 852, for example, level 0, e.g., 0.5V. If the reference cell has not been written, VREF 851<VREFOUT 852, then line (REFON) 853 would be low. If the reference cell has been written, VREF 851>VREFOUT 852, then line (REFON) 853 would be high indicating that the reference cells have been previously written and the reference cells are inhibited in programming.

For subsequent programming cycles after the first programming cycle, the reference voltages for the data cells come from the reference cells and the reference voltages are shifted appropriately to place the data voltages in between the adjacent reference voltages.

The voltage drop along the common line poses a particular problem for a multilevel reference system. Reference cells are needed to track the data cells over temperature, process, or power supply. But as temperature changes, the voltage drop along the common line changes, which causes a sense error. The voltage drop along the line from one end to the other end follows geometrically as described earlier. That is depending on position along the common line, the cells experience different amounts of common line voltage changes, which cause different voltage readout shifts due to different voltage amounts being coupled into the cells. This cannot be corrected by a conventional reference system.

Figure 16:
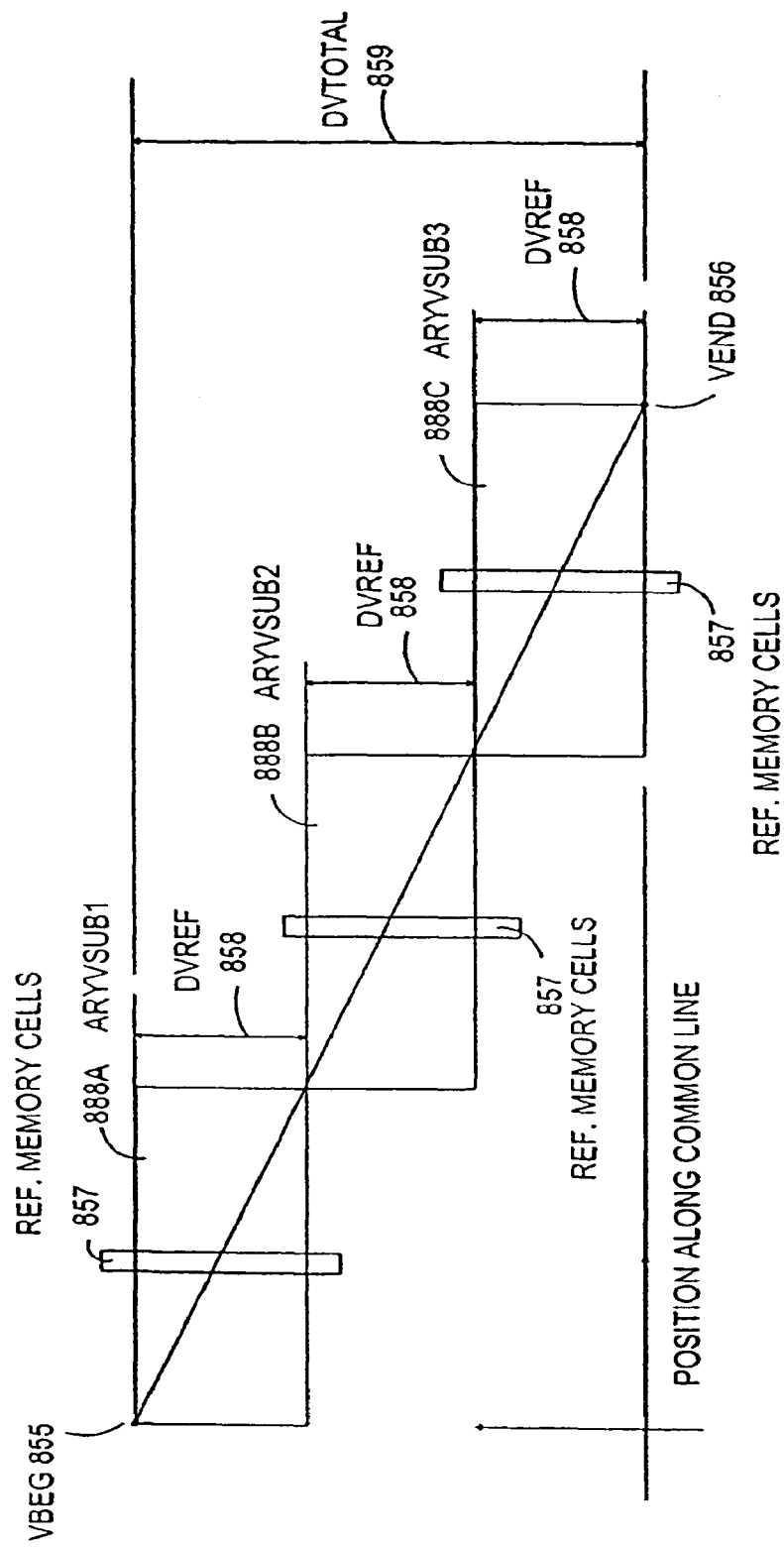
FIG. 16 shows positional linear reference system.

FIG. 16 shows a positional linear reference system that corrects this error. Assuming the voltage drop along a line is linear and assuming an acceptable voltage shift is DVREF/2, by dividing the voltage drop DVTOTAL 859=VBEG 855−VEND 856, into different voltage segments with equal voltage drop DVREF 858 and by positioning the reference cells 857 in the middle of a divided array segment (ARYVSUB1-3) 888A-C corresponding to a voltage segment, the maximum voltage difference from a reference cell to a data cell in the beginning or at the end of the voltage segment is =<DVREF/2. Hence reference correction over temperature is achieved. It is possible to place the reference cells 857 at the beginning or the end of a divided array segment (ARYVSUB1-3) 888A-C. In this case the maximum voltage difference from a reference cell to a data cell is DVREF instead of DVREF/2 as in the case of positioning the reference array in middle of a divided segment array. Another advantage of placing the reference cells in the middle of a divided array segment is to minimize the electrical variation due to the edge interface from the memory array to peripheral circuits.

Figure 17:
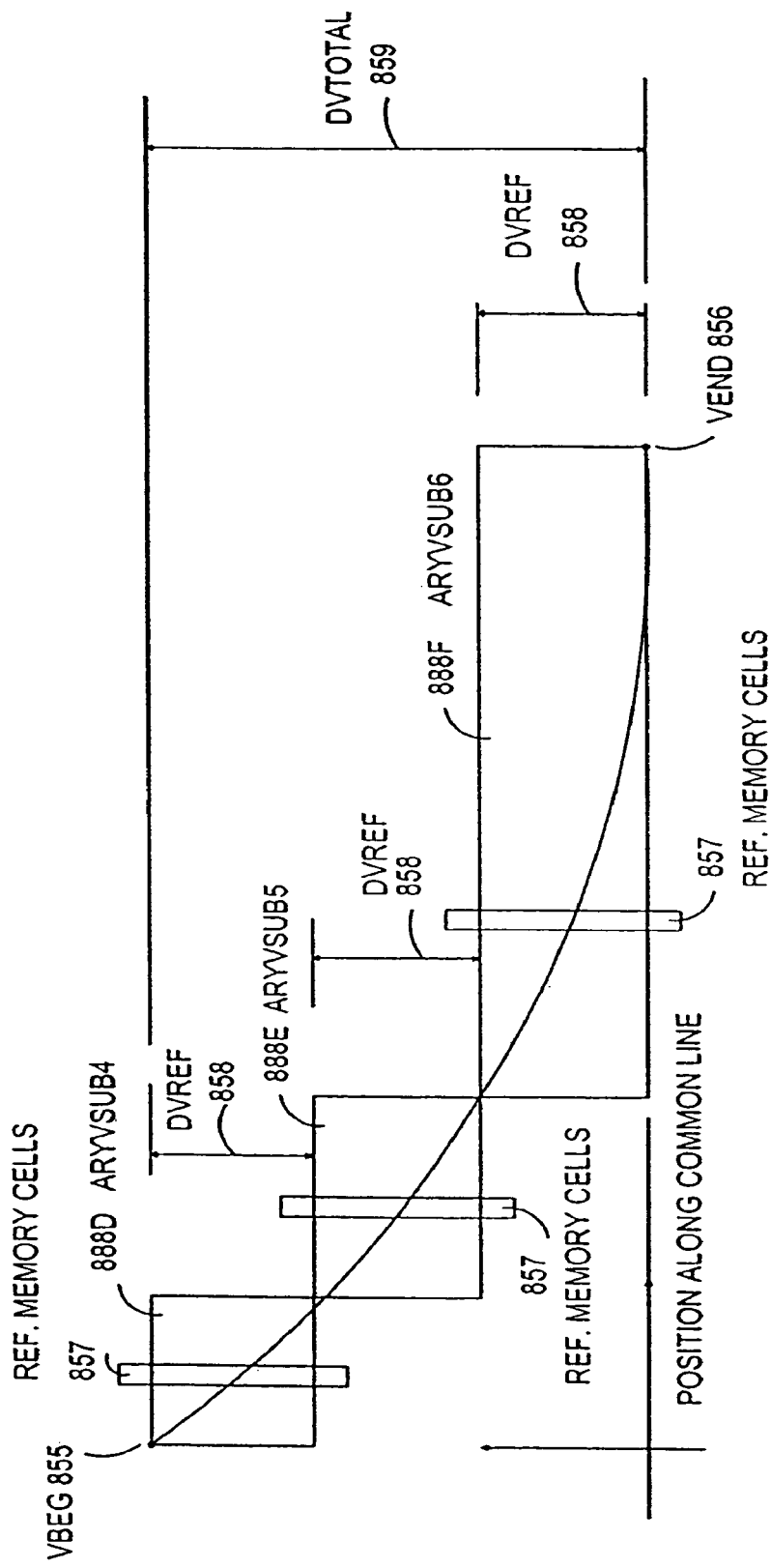
FIG. 17 shows a positional geometric reference system.

FIG. 17 shows a positional reference geometric system basing on the concepts similar to FIG. 16. In this embodiment, the reference cells 857 are not symmetrically but geometrically positioned to correct for the geometric effect of the voltage drop.

In FIGS. 16 and 17, each full array is divided into three sub-arrays (ARYVSUB1-3) 888A-C and (ARYVSUB4-6) 888D-F respectively. It should be noted that the array could be divided into as many sub-arrays as needed to reduce the voltage error. Also shown in FIGS. 16 and 17, each sub-array of ARYVSUB1-6 888A-F includes its own complete set of reference cells in the middle. A complete set of reference cells provides all the reference levels, e.g., 16 levels for 4-bit digital multilevel cell per page, for all the pages. One row of reference cells includes 128 reference cells if each row has 8 pages and each reference cell provides one reference level. An alternative embodiment is to have more than one reference cell per level, e.g., 4-16 cells per level. This averages out the electrical variation of multiple cells.

Figure 18:
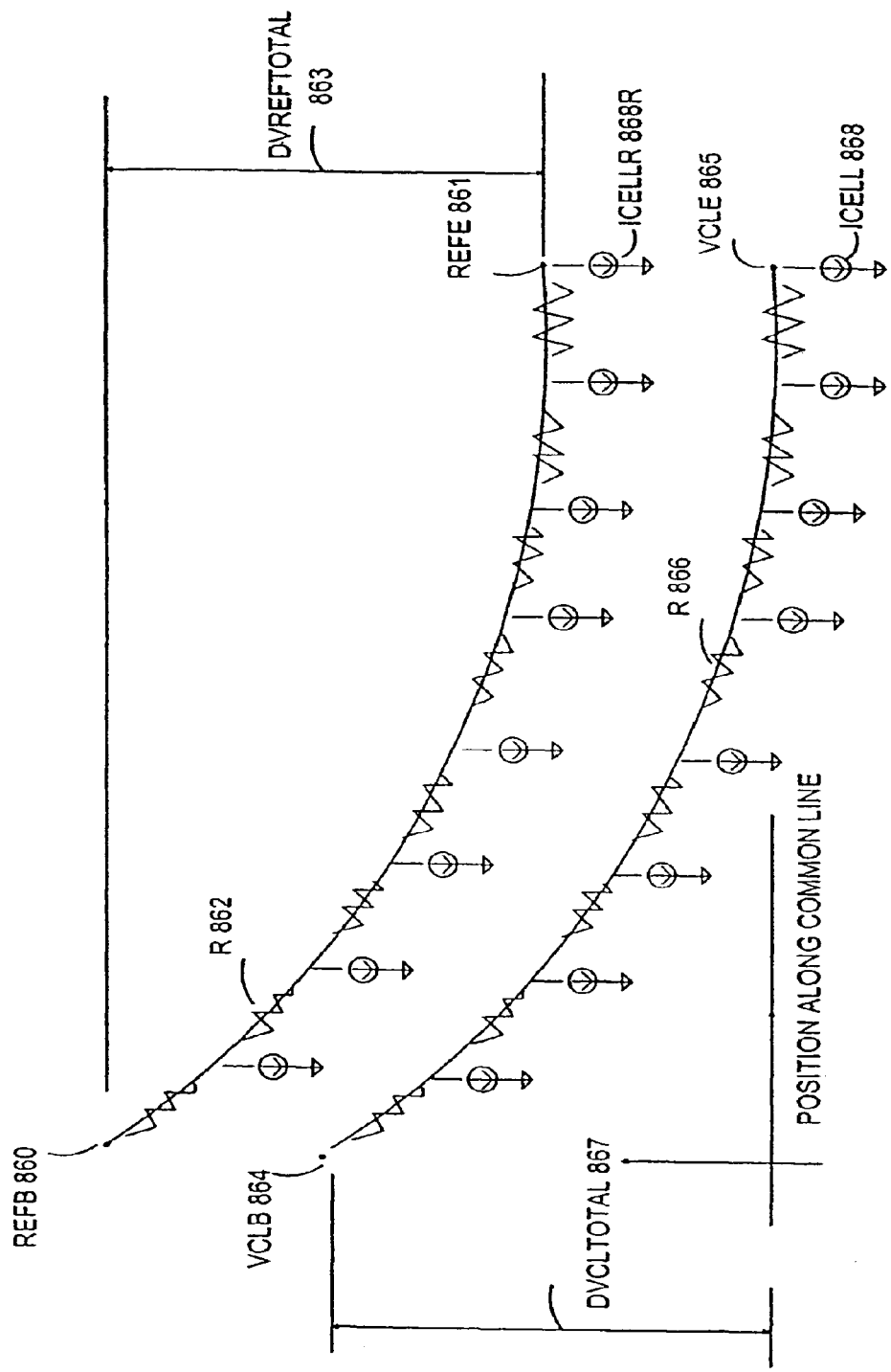
FIG. 18 shows an embodiment of geometric compensation reference scheme.

FIG. 18 shows a geometric compensation reference system. The objective is to simulate the voltage drop in the common line into the reference readout voltage by attaching similar loading currents to the reference readout voltage. A resistance R 862 in the reference line is made equivalent to a resistance R 866 in the common line. A reference loading current (ICELLR) 868R is made the same as that of ICELL 868. Hence the total voltage drop in reference DVREFTOTAL 863, =REFB 860−REFE 861, is equal to DVCLTOTAL 867, =VCLB 864−VCLE 865. It is not necessary to attach the same number of loading reference currents ICELLR 868R to the number of ICELL 868. It is only necessary to attach the approximate amount of the current loading at appropriate positions to minimize the error to an acceptable level.

One alternative embodiment of the reference system is, instead of using 16 reference cells for a 4-bit digital multilevel cell, to use 2 or 4 or 8 reference cells to generate 16 reference levels with level interpolation. That is from reference levels coming from reference cells, the other reference levels are interpolated by using linear or any other interpolation.

Figure 19A:
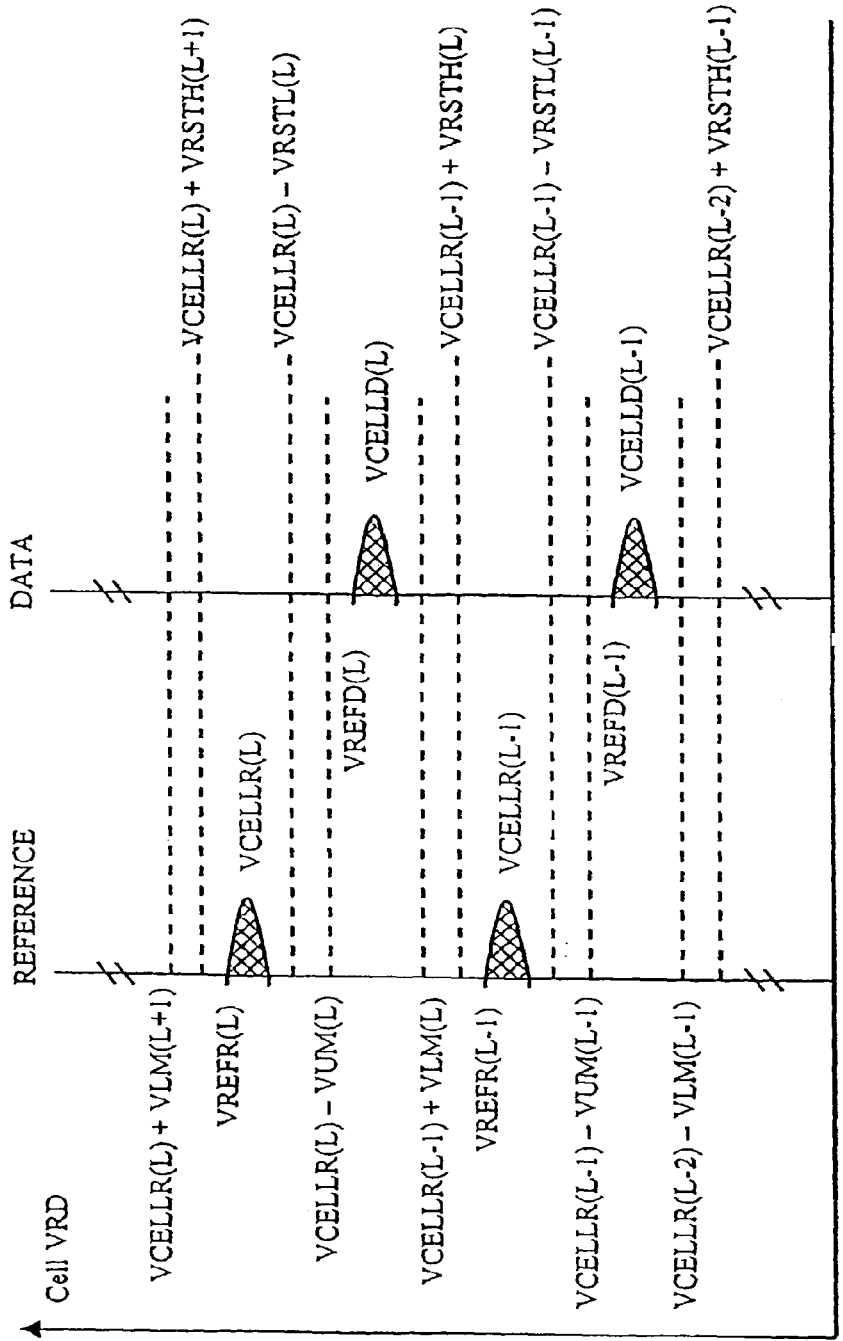
FIG. 19A shows voltage levels for program verify, margin, read, and restore for one embodiment of the current invention.

Multilevel Algorithm:

FIG. 19A shows various voltages generated and used in one embodiment of the invention for program verifying, program upper and lower margin verifying, read sensing and restore high or restore low margin verifying during read sensing. The read sensing is advantageously performed in the voltage-mode but other modes of read sensing are also applicable. All the voltages are generated by the V&IREF block 172. VREFR(L) is the program verify voltage used to verify program level (L) of a reference cell. VREFD(L) is the program verify voltage used to verify program level (L) of a data cell. For example, in a 4 bit per cell storage embodiment there are 16 levels used. It is also possible to use 15 levels instead of 16 levels since the extreme low or high levels not need to be constrained to exact low or high levels but can go to ground or power supply respectively. VREFR0 through VREFR15 are program verify voltages used for verifying programming of the reference cells. VREFD0 through VREFD15 are program verify voltages used for verifying programming of the data cells. VUM(L) and VLM(L) are upper and lower program margin voltages respectively for level L. Each level L may have its own VUM(L) and VLM(L) voltage values. VUM(L) and VLM(L) can each be of different value also for each level L. On the other hand, VUM(L) and VLM(L) can be of the same voltage value for all the levels. VUM(L) and VLM(L) voltages are generated by the block V&IREF 172. VRSTH(L) and VRSTL(L) are RESTORE HIGH and RESTORE LOW margin voltages respectively for level L. Each level L may have its own VRSTH(L) and VRSTL(L) voltage value. VRSTH(L) and VRSTL(L) can each be of different value also for each level L. On the other hand, VRSTH(L) and VRSTL(L) can be of the same voltage value for all the levels. VRSTH(L) and VRSTL(L) voltages are generated by the V&IREF 172 block. VCELLR(L) is the voltage read back from a reference cell during read sensing. VCELLD(L) is the voltage read back from a data cell during read sensing. The cross-hatched regions show the distribution of possible read back voltages during read sensing after reference cells or data cells have been programmed to a certain level L, while using VREFR(L) or VREFD(L) as the program verify voltage, respectively. The distributions occur because every cell does not have the same programming or read sensing characteristics.

Page Programming Cycle:

FIG. 20 shows the flow diagram for one embodiment of the page programming cycle. During a page programming cycle a plurality of memory cells are programmed in parallel. However this algorithm is equally applicable for single cell programming. As an example, 4 bit per cell is programmed in each cell. First the program command is issued and the address of the page to be programmed is loaded. The data count NC is initialized. The address loading may be performed through a single or a plurality of address cycles. Program data is input during the DATAIN step and is selectively loaded in the internal latches of a YDRVS 110S or SYDRVS 114S or RYDRV 112S. Block YDRV 110, SYDRV 114, (RYDRV) 112 includes a plurality of YDRVS 110S, SYDRVS 114S, RYDRVS 112S respectively. Block YDRVS 110S will be described in detail later in the description associated with FIG. 26. Data gets loaded into the data latches of the current YDRVS 110S or SYDRVS 114S selected from the ADDRCTR 162 and the BYTEDEC 152. The redundancy control block REDCNTRL 186 asserts RED_ADD_TRUE true (YES or Y) or false (NO or N) to signify whether the current YDRVS 110S or SYDRVS 114S is GOOD or BAD. A YDRVS 110S or SYDRVS 114S is GOOD if it has not been flagged as one that cannot be used to load input data on its data latches. A YDRVS 110S or SYDRVS 114S is BAD if it has been flagged as one that cannot be used to load input data on its data latches. GOOD or BAD YDRVSs or SYDRVSs are flagged during manufacturing testing and the flags are internally stored on non-volatile latches. If RED_ADD_TRUE=NO, meaning current YDRVS 110S or SYDRVS 114S is GOOD, then a data nibble on the IO[0:3] or IO[4:7] bus is placed at the input of the data latches of the current YDRVS 110S or SYDRVS 114S. A data byte consists of 8 digital bits and a data nibble consists of 4 digital bits. If RED_ADD_TRUE=Y, meaning current YDRVS 110S or SYDRVS 114S is BAD, then the data nibble on the IO[0:3] or IO[4:7] bus is placed at the data latches of the selected RYDRVS 112S. Next, if NEXTDATAIN=Y, the data at the input of the data latches of the respective YDRVS 110S, SYDRVS 114S or RDYRVS 112S is latched. If NEXTDATAIN=N then the flow waits for the program start command PRG. Next, if the data count NC>MAXNC=not true (N), then NC=NC+1 and the flow loops back to DATAIN step to load in the next data byte. If the data count NC>MAXNC=true (Y), then the flow goes out of the loop and waits for the program start command PRG. The data count MAXNC signifies the number of data bytes that are simultaneously programmed in a page. Next, if command PRG is received then page programming begins. If command PRG is not received then the flow loops back to check for NEXTDATAIN. No data loading is required for blocks (REFYDRVS) 116S because their latches are internally set. A block (REFDRV) 116 includes a plurality of blocks (REFYDRVS) 116S.

FIG. 21 shows the flow diagram after page programming begins. The Program flag=Pass is set and the BUSY signal is set. In another embodiment a configuration (fuse) bit initialization is executed to load in data from fuse non-volatile memory cells to volatile latches located in the fuse circuit block (FUSECKT) 182 at this step. The program inhibit mode of all cells in the page being programmed are reset to enable programming. Based on the output B[0:3] of the data latches of each YDRVS 110S, SYDRVS 114S or RYDRVS 112S a program verify voltage VREFD(L) is set at the input of the comparator in each of the respective YDRVS 110S, SYDRVS 114S or RYDRVS 112S. Based on the output B[0:3] of the data latches of each REFYDRVS 116S a program verify voltage VREFR(L) is set at the input of the comparator in each REFYDRVS 116S. For each reference cell and data cell in the page being programmed, the cell voltage VCELLD(L) or VCELLR(L) is read. Depending on the output B[0:3] of the data latches (a) for each REFYDRVS 116S the appropriate program verify voltage VREFR(L) is compared to the reference cell read back voltage VCELLR(L) and (b) for each YDRVS 110S, SYDRVS 114S, RYDRVS 112S, the appropriate program verify voltage VREFD(L) is compared with data cell read back voltage VCELLD(L) to indicate whether further programming is required. If no further programming is required for a particular reference cell or data cell, it is put in the program inhibit mode. If the Program Pulse Count=MAXPC is not true, then the cells are placed in the program mode and another programming pulse is applied to all the cells in the page, including the reference cells. Cells which are in the program inhibit mode do not get any additional programming. Cells which are not in the program inhibit mode get additional programming. After the programming pulse is applied, the program pulse count is incremented and the cells are placed in the voltage-mode read to verify if further programming is required. This iterative verify-program loop is continued until either all the cells in the page including the reference cells are in the program inhibit mode or when the program pulse count=MAXPC is true. If program pulse count=MAXPC true condition is reached, before all cells in the page including the reference cells are all in program inhibit mode, then the program flag=fail condition is set, BUSY signal is reset and the programming cycle is done. Whenever the All Cells in Program Inhibit Mode=true condition is reached, the flow moves to the next step as shown in FIG. 22A.

As shown in FIG. 22A, next, for each level L, upper program margin verify voltage UMV(L)=VCELLR(L)−VUM(L) is generated, where VUM(L) is the upper margin voltage for level L. Depending on the data latch output B[0:3] of the data latches in the respective YDRVS 110S, SYDRVS 114S, RYDRVS 112S the appropriate voltage UMV(L) is compared with read back cell voltage VCELLD(L) for all the data cells. If the result of comparison indicates that all upper cell margins are not within limits then a program flag=fail condition is set; BUSY signal is reset and programming cycle is done. If the result of comparison indicates that all the upper cell margins are within limits then a program flag=fail condition is not set and then, for each level L, lower program margin verify voltage LMV(L)=VCELLR(L−1)+VLM(L) is generated, where VLM(L) is the lower margin voltage for level L. Depending on the data latch output B[0:3] of the data latches in the respective YDRVS 110S, SYDRVS 114S, RYDRVS 112S the appropriate voltage LMV(L) is compared with read back cell voltage VCELLD(L). If the result of comparison indicates that all lower cell margins are not within limits then a program flag=fail condition is set; BUSY signal is reset and programming cycle is done. If the result of comparison indicates that all the lower cell margins are within limits then a program flag=fail condition is not set and BUSY signal is reset and programming cycle is done. The program flag=fail indicates the programming cycle has been unsuccessful to program the current page. It does not indicate specifically which cell or cells caused the unsuccessful programming.

Page Read Cycle:

FIG. 23 shows the flow diagram for the page read cycle. During a page read cycle a plurality of memory cells are read in parallel. However this algorithm is equally applicable for single cell read. After the page read command is issued along with the address of the page to be read, the BUSY signal is set, RESTOREL and RESTOREH flags are reset, the data latches in the YDRVS 110S, SYDRVS 114S, RYDRVS 112S are set to output B[0:3]=1111 and N is set to 3. N represents the number of bits stored per memory cell. In another embodiment a configuration (fuse) bit initialization is executed to load in data from fuse non-volatile memory cells to volatile latches located in the fuse circuit block (FUSECKT) 182 at this step. All the cells in the addressed page are placed in the voltage-mode read and the cell voltages, VCELLR(L) for reference cells and VCELLD(L) for data cells are read. BN is forced to "0" and the read verify voltage VCELLR(L), which is one of the reference read back voltages dependent on B3, B2, B1, B0, is compared with the cell read back voltage VCELLD(L). For each cell, if the VCELLD(L)>VCELLR(L) then BN is latched as "1", otherwise BN is latched as "0". The loop continues until all the bits B3, B2, BE1, B0 are latched and N=0. Next, as shown in FIG. 24, for each level L, a MARGIN RESTORE LOW Voltage VRSTRL(L)=VCELLR(L)-VRSTL(L) is generated, where VRSTL(L) is the restore low margin voltage. Depending on the latched bits B3, B2, B1, B0 on each of the YDRVS 110S, SYDRVS 114S, RYDRVS 112S, the voltage VRSTRL(L) is compared with the respective data cell read back voltage VCELLD(L). If VCELLD(L)>VRSTRL(L) for any one of the cells, then the RESTOREL flag is set. Next, for each level L a MARGIN RESTORE HIGH Voltage VRSTRH(L)=VCELLR(L−1)+VRSTH(L) is generated, where VRSTH(L) is the restore high margin voltage. Depending on the latched bits B3, B2, B1, B0 on each of the YDRVS 110S, SYDRVS 114S, RYDRVS 112S, the voltage VRSTRH(L) is compared with the respective data cell read back voltage VCELLD(L). If VCELLD(L) <VRSTRH(L) for any one of the cells, then the RESTOREH flag is set, otherwise RESTOREH flag is not set. Next, as shown in FIG. 25, BUSY signal is reset and the byte count ND is initialized to NDI. NDI is the byte count of the existing byte address location. All bits in the respective YDRVSs, SYDRVSs, or RYDRVSs data latches are ready to be sequentially read. Whenever READ CL0CK=Y, the RED_ADD_TRUE is checked for that byte address location. If RED_ADD_TRUE=Y, then data from RYDRVS 112S is output to the IO port IO[0:7] 1001, otherwise data from YDRVS 110S is output to the IO port IO[0:7] 1001. If READ CL0CK=N and ENABLE=Y then the flow loops back until READ CL0CK=Y or ENABLE=N. After all the data is output i.e. ND>MAXND=Y or if ENABLE=N, the Page read cycle is done. If ND>MAXND is =N, then ND is incremented and the flow loops back to check the READ CL0CK.

FIG. 26 shows the details of an embodiment of YDRVS 110S. SYDRVS 114S and RYDRVS 112S have similar details. The description given for YDRVS 110S is equally applicable for SYDRVS 114S and RYDRVS 112S. In this embodiment 4 bits are stored per memory cell, hence four data latches are required per YDRVS 110S. A set of four data latches (DATALAT3) 10, (DATALAT2) 11, (DATALAT1) 12, (DATALAT0) 13 holds the data during the DATAIN step of a page programming cycle or holds the data during a LATCH EN=1 or =0 step during a page read cycle. Data is loaded into DATALAT3 10, DATALAT2 11, DATALAT1 12, DATALAT0 13 through the DIN3 14, DIN2 15, DIN1 16, DIN0 17 lines respectively and read out from the DATALAT3 10, DATALAT2 11, DATALAT1 12, DATALAT0 13 through the DOUT3 18, DOUT2 19, DOUT1 20, DOUT0 21 lines respectively. Lines (DIN3) 14, (DIN2) 15, (DIN1) 16, (DIN0) 17, (DOUT3) 18, (DOUT2) 19, (DOUT1) 20, (DOUT0) 21 connect to BYTESEL 140 for YDRV 110 and connect to blocks 144, 142 for SYDRV 114, RDYRV 112 respectively. During page program cycle, lines (B3) 22, (B2) 23, (B1) 24, (B0) 25 are outputs of DATALAT3 10, DATALAT2 11, DATALAT1 12, DATALAT0 13, respectively, and have a latched logical relationship to the lines (DIN3) 14, (DIN2) 15, (DIN1) 16, (DIN0) 17, respectively. During page read cycle lines B3 22, B2 23, B1 24, B0 25 are output of DATALAT3 10, DATALAT2 11, DATALAT1 12, DATALAT0 13 respectively and represent the 4 bits read out of the cell. Depending on the status of lines (B3) 22, (B2) 23, (B1) 24, and (B0) 25, the REFERENCE MULTIPLEXER 26 couples one of the lines VR0 through VR15 to one input of the VOLTAGE COMPARATOR 27. The output of the VOLTAGE COMPARATOR 27 connects to the input of the LATCH 28. Under the control of ALGOCNTRL 164, the line ENLATCOMP 29 functions as a strobe signal to enable the LATCH 28 during a certain time to latch the output of the VOLTAGE COMPARATOR 27. Line RBYLATCOMP 30 resets the LATCH 28 at suitable times under the control of ALGOCNTRL 164. The PROGRAM/READ CONTROL 31 outputs lines COMPOR 32 and COMPORB 33. COMPOR 32 and COMPORB 33 lines are connected together in a wire-OR manner for all YDRV 110, SYDRV 114, and RYDRV 112. The PROGRAM/PROGRAM INHIBIT SWITCH 34 puts the memory cell coupled to it indirectly through line BLIN 35 into a program or program inhibit mode under the control of PROGRAM/READ CONTROL 31. Line BLIN 35 goes to the PSEL 120 for YDRV 110 and to blocks 124, 122 for SYDRV 114, RYDRV 112 respectively. The lines VRO through VR15 individually are coupled to the output of a VRBUFFER 750.

FIG. 27 shows the details of a LATCH 28 block, a PROGRAM/READ CONTROL 31 block and a PROGRAM/PROGRAM INHIBIT 34 block. The VROUT line 55 couples the output of REFERENCE MULTIPLEXER 26 to the positive input of a VOLTAGE COMPARATOR 27. The line COMPOUT 58 couples the output of the VOLTAGE COMPARATOR 27 to the D input of a latch 59. ENLATCOMP 29 goes to the EN input of the latch 59. ENLATCOMP 29 acts as a strobe signal for the latch. When ENLATCOMP 29 is at logic high the latch 59 outputs the logic level on D input to the Q output. QB is the inverted logic level of Q. When ENLATCOMP 29 goes to logic low, the latch 59 latches the logic level on D input. RBYLATCOMP 30 goes to the reset R input of the latch 59. When RBYLATCOMP 30 is logic low latch 59 is reset, whereby Q is at logic low and QB is at logic high. Line COMLATQ 40 couples the Q output of the latch 59 to the gate of a NMOS transistor N1 43. Line COMLATQB 41 couples the QB output of the latch 59 to the gate of a NMOS transistor N2 44. Line COMLATQ 40 also couples to the data latches DATALAT3 10, DATALAT2 11, DATALAT1 12, DATALAT0 13. COMLATQ 40 also couples to one input of a 2 input NAND gate NAND 49. The other input of the NAND 49 is coupled to the signal READ2B. READ2B is at logic high during page programming cycle and at logic low during page read cycle. The line NDO 52 couples the output of NAND 49 to the input of an inverter INV 48 and also to the gate inputs of PMOS transistor P1 45 and NMOS transistor N3 47. The line INVO 53 couples the output of INV 48 to the gate of a PMOS transistor P2 46. Line BLIN 35 connects to one terminal of each of P1 45, N3 47 and P2 46. BLIN 35 also connects to the negative input of VOLTAGE COMPARATOR 27. The other terminal of P1 45 is connected to inhibit voltage input VIH 57. Line N4D 54 connects the other terminals of N3 47 and P2 46 to one terminal of NMOS transistor N4 50. Line N5D 60 connects the other terminal of N4 50 to one terminal of NMOS transistor N5 51. The other terminal of N5 51 is connected to ground. The gates of N4 50 and N5 51 are connected to inputs VBIYDRVCAS 56 and VBIYDRV 57 respectively. N4 50 and N5 51 form a current bias circuit whereby a constant current load is placed on the BLIN 35 when INVO 53 is at logic low and NDO 52 is at logic high. N4 50 and N5 51 together represent the predetermined bias current for the voltage mode sensing as shown in FIG. 2C.

After the page program command and the address of the page to be program is issued, the data to be programmed is loaded in the data latches DATALAT3 10, DATALAT2 11, DATALAT1 12, DATALAT0 13 of each of the YDRVS 110S, SYDRVS 114S or RYDRVS 112S. The REFERENCE MULTIPLEXER 26 then couples one of the inputs VR0 through VR15 to its output VROUT 55. During a program verify cycle VREFD(0) through VREFD(15) are available on the VR0 through VR15 lines respectively. VR0 through VR15 are commonly coupled to REFERENCE MULTIPLEXER 26 of all the YDRV 110, SYDRV 112, RYDRV 14. The REFYDRVS 1165 have the data latches internally set. In this embodiment there are 16 REFYDRVS 1165. Each REFYDRVS 1165 is used for a specific level. For example, the data latches of a REFYDRVS 1165 used for level 5 will be internally set to program level 5 into reference cells coupled to it. VR0 through VR15 are commonly coupled to REFERENCE MULTIPLEXER 26 of all the REFYDRVS 1165. During a program verify cycle, VREFR(0) through VREFR(15) are respectively available at the VR0 through VR15 lines of a REFYDRVS 1165. Depending on the output B3, B2, B1, B0 of the data latches DATALAT3 10, DATALAT2 11, DATALAT1 12, DATALAT0 13 within each YDRVS 110S, SYDRVS 114S, SYDRVS 112S one specific voltage VREFD (0) through VREFD(15) is output to the input of the VOLTAGE COMPARATOR 27. Depending on the output B3, B2, B1, B0 of the data latches DATALAT3 10, DATALAT2 11, DATALAT1 12, DATALAT0 13 within each REFYDRV 116 one specific voltage VREFR(0) through VREFR(15) is output to the input of the VOLTAGE COMPARATOR 27.

The latch 59 within each REFYDRVS 116S, YDRVS 110S, SYDRVS 114S and RYDRVS 112S are all reset by pulsing line RBYLATCOMP 30. RBYLATCOMP 30 is commonly connected to the reset input of the latch 59 within each REFYDRVS 116S, YDRVS 110S, SYDRVS 114S, and RYDRVS 112S. After latch 59 is reset, COMLATQ 40 is at logic low. The NAND 49 then outputs logic high to line NDO 52. Output of INV 48 then is at logic low on line INVO 53. With NDO 52 at logic high and INVO 53 at logic low transistors N3 47 and P 246 couple BLIN 35 to N4 50. P1 45 de-couples the inhibit voltage VIH 57 from BLIN 35. The memory cell is placed in the voltage read mode and the cell read back voltage VCELLR(L) or VCELLD(L) is available on BLIN 35. At this point, the VOLTAGE COMPARATOR 27 compares the voltages at its inputs. If voltage on BLIN 35 is higher then voltage on VROUT 55 the output COMPOUT 58 is low, otherwise it is high. At this time a positive going strobe pulse is applied to the ENLATCOMP 29 common to all the latches 59 in REFYDRVS 116S, YDRVS 110S, SYDRVS 114S and RYDRVS 112S, to latch the status of line COMPOUT 58. If COMPOUT 58 is low, then the COMLATQ 40 remains at logic low.

If COMPOUT 58 is high, then the COMLATQ 40 switches to logic high. If during an iteration of verify-program cycles any one of the latches 59 latches a logic high on COMLATQ 40, called a program inhibit state, then for that specific REFYDRVS 116S, YDRVS 110S, SYDRVS 114S or RYDRVS 112S, the line NDO 52 is at low and the line INVO 53 is at logic high. With latch 59 in a program inhibit state, BLIN 35 is de-coupled from N4D 54 and there is no current load, whereas, BLIN 35 is coupled to the inhibit voltage VIH 57 through P1 45. With latch 59 in the program inhibit state, further programming pulses do not cause programming.

The line COMPOR 32 is connected in a wire-OR fashion to all the COMPOR 32 lines of each REFYDRVS 116S, YDRVS 110S, SYDRVS 114S or RYDRVS 112S. There is a pull up load coupling the COMPOR 32 line to the power supply. Similarly, the line COMPORB 33 is connected in a wire-OR fashion to all the COMPORB 33 lines of each REFYDRVS 116S, DRVS 110S, SYDRVS 114S or RYDRVS 112S. There is a pull up load coupling the COMPORB 33 line to the power supply. The COMPORB line 33 goes high whenever all the latches 59 have reached the program inhibit mode. When the Program Pulse Count=MAXPC is reached, the ALGOCNTRL 164 latches the status of COMPORB line 33 in a status latch in block INPUT LOGIC 160. The status latch can be read at one of the IO[0:7] 1001 lines by the external host. If ALGOCNTRL 164 latches a logic low in the status latch in block INPUT LOGIC 160 then a program fail condition is reached and the ALGOCNTRL 164 goes out of the page programming cycle.

If at the end of any verify-program iteration, the COMPOR 32 line goes high, the ALGOCNTRL 164 sequences to the margin verify mode. All latches 59 are reset. All cells are placed in the voltage read mode by READB 52 at logic low. At this time inhibit voltage is de-coupled from BLIN 35 and current bias transistor N4 50 is coupled to BLIN 35. Cell voltages VCELLR(L) or VCELLD(L) are respectively available on BLIN 35 of a REFYDRVS 116S or BLIN 35 of YDRVS 110S, SYDRVS 114S, or RYDRVS 112S. During program margin verify the voltages read back from the data cells are checked for adequate margin from voltages read back from reference cells for each programmed level L. In the Upper Program Margin Verify mode, voltages UMV(0) through UMV(15) are placed on the VR0 through VR(15). Depending on the output B3, B2, B1, B0 of the data latches DATALAT3 10, DATALAT2 11, DATALAT1 12, DATALAT0 13 within each YDRVS 110S, SYDRVS 114S, RYDRVS 112S one specific voltage UMV(0) through UMV(15) is output to the input VROUT 55 of the VOLTAGE COMPARATOR 27. At this time the VOLTAGE COMPARATOR 27 compares the voltages at its inputs. If voltage on BLIN 35 is higher then voltage on VROUT 55 the output COMPOUT 58 is low, otherwise it is high. At this time a positive going strobe pulse is applied to the ENLATCOMP 29 common to all the latches 59 in YDRVS 110S, SYDRVS 114S and RYDRVS 112S, to latch the status of line COMPOUT 58. If COMPOUT 58 is low, then the COMLATQ 40 remains at logic low. If COMPOUT 58 is high, then the COMLATQ 40 switches to logic high. At this time, if LGOCNTRL 164 latches a logic low in the status latch in INPUT LOGIC 160 block by looking at the status of the COMPORB 33 line, then a program fail condition is reached and the ALGOCNTRL 164 goes out of the page programming cycle. Otherwise, ALGOCNTRL 164 sequences to the Lower Program Margin Verify mode.

In the Lower Program Margin Verify mode, all latches 59 are reset. Voltages LMV(0) through LMV(15) are placed on the VR0 through VR(15). Depending on the output B3, B2, B1, B0 of the data latches (DATALAT3) 10, (DATALAT2) 11, (DATALAT1) 12, (DATALAT0) 13 within each YDRVS 110S, SYDRVS 114S, RYDRVS 112S one specific voltage LMV(0) through LMV(15) is output to the input VROUT 55 of the VOLTAGE COMPARATOR 27. At this time the VOLTAGE COMPARATOR 27 compares the voltages at its inputs. If voltage on BLIN 55 is higher then voltage on VROUT 55 the output COMPOUT 58 is low, otherwise is high. At this time a positive going strobe pulse is applied to the ENLATCOMP 29 common to all the latches 59 in YDRVS 110S, SYDRVS 114S and RYDRVS 112S, to latch the status on line COMPOUT 58. If COMPOUT 58 is low, then the COMLATQ 40 remains at logic low. If COMPOUT 58 is high, then the COMLATQ 40 switches to logic high. At this time, if ALGOCNTRL 164 latches a logic low in the status latch in INPUT LOGIC 160 block by looking at the status of the COMPOR line 32, then a program fail condition is reached and the ALGOCNTRL 164 goes out of the page programming cycle.

During page read cycle, after page read command and the page address is issued, the reference and the data cells are placed in the voltage read mode. At this time all the B3[0:3] lines output 1111. VR0 through VR15 have VCELLR(0) through VCELLR(15). VCELLR(0) through VCELLR(15) are the voltages read out of the reference cells of the page being read. Under the control of the ALGOCNTRL 164 block 4 bits are sequentially read into the data latches (DATALAT3) 10, (DATALAT2) 11, (DATALAT1) 12, (DATALAT0) 13. For example, B3 is read by forcing the output of DATALAT3 to output B3=0. At this time B[0:3]=1110. The REFERENCE MULTIPLEXER 26 then outputs VCELLR(7) on the VROUT 55 in each of the YDRVS 110S, SYDRVS 114S and RYDRVS 112S. The output COMPOUT 58 of the VOLTAGE COMPARATOR 27 is high or low depending on whether voltage VCELLD(L) on the BLIN 35 is lower or higher relative to voltage VCELLR(7) on line VROUT 55. If COMPOUT 58 is high then a logic high is latched into DATALAT3 10 and B3=0, otherwise logic low is latched and B3=1. Next, B2 is read by forcing the output of DATALAT2 11 to output B2=0. At this time B[0:3]=110B3. B3 is the output of DATALAT3 10 from previous sequence. The REFERENCE MUL- TIPLEXER 26 then outputs VCELLR(L), depending on 110B3 on the VROUT 55 line in each of the YDRVS 110S, SYDRVS 114S and RYDRVS 112S. The output COMPOUT 58 of the VOLTAGE COMPARATOR 27 is high or low depending on whether voltage VCELLD(L) on the BLIN 35 is lower or higher relative to voltage VRCELL(L) on line VROUT 55. If COMPOUT 58 is high then a logic high is latched into DATALAT2 11 and B2=0, otherwise logic low is latched and B2=1. In this manner, the next two sequences latch two bits into the DATALAT1 12 and DATALAT0 13.

After all 4 bit from the cell are latched into the DATALAT3 10, DATALAT2 11, DATALAT1 12, DATALAT0 13 for all the YDRVS 110S, SYDRVS 114S and RYDRVS 112S, the restore margins are checked. All latches 59 are reset. First the RESTORE LOW margin is checked. At this time, for each level 0 through 15, MARGIN RESTORE LOW Voltage VRSTRL(0) through VRSTRL(15) is placed at the VR0 through VR15 lines respectively. Depending on each outputs B3, B2, B1, B0 of the data latches DATALAT3 10, DATA-LAT2 11, DATALAT1 12, DATALAT0 13 within each YDRVS 110S, SYDRVS 114S and RYDRVS 112S, the REFERENCE MULTIPLEXER 26 outputs one of VRSTRL(0) through VRSTRL(15) on line VROUT 55 going into the positive input of the VOLTAGE COMPARATOR 27. ENLATCOMP 29 is strobed with the positive pulse to latch the status of the COMPOUT 58 line. If data cell read out voltage VCELLD(L) on BLIN 35 line is higher than voltage VRSTRL(L) on VROUT 55 line then COMLATQ 40 remains at logic low and COMLATQB 41 at logic high. Otherwise, COMLAT 40 is at logic high and COMLATQB 41 at logic low. At this time, if ALGOCNTRL 164 latches a logic low in the RESTORE LOW latch in INPUT LOGIC 160 block by looking at the status of the COMPORB line 33, then a restore low flag condition is reached. Next, all latches 59 are reset.

Next the RESTORE HIGH margin is checked. At this time, for each level 0 through 15, MARGIN RESTORE HIGH Voltage VRSTRH(0) through VRSTRH(15) is placed at the VR0 through VR15 lines respectively. Depending on each outputs B3, B2, B1, B0 of the data latches DATALAT3 10, DATALAT2 11, DATALAT1 12, DATALAT0 13 within each YDRVS 1105, SYDRVS 114S and RYDRVS 112S, the REFERENCE MULTIPLEXER 26 outputs one of VRSTRH(0) through VRSTRH(15) on line VROUT 55 going into the positive input of the VOLTAGE COMPARATOR 27. ENLATCOMP 29 is strobed with the positive pulse to latch the status of the COMPOUT 58 line. If data cell read out voltage VCELLD(L) on BLIN 35 line is higher than voltage VRSTRH(L) on VROUT 55 line then COMLATQ 40 remains at logic low and COMLATQB 41 at logic high. Otherwise, COMLAT 40 is at logic high and COMLATQB 41 at logic low. At this time, if ALGOCNTRL 164 latches a logic low in the RESTORE HIGH latch in INPUT LOGIC 160 block by looking at the status of the COMPOR line 32, then a restore high flag condition is reached.

At this time, 4 bits from every cell with the page being read are latched into the respective data latches within each YDRVS 110S, SYDRVS 114S and RYDRVS 112S. Next under the control of the READ CLOCK data is sequentially read on IO[0:7]. If after READ CLOCK the RED_ADD_TRUE=Y condition is true then the data is read from the addressed RYDRVS 112S otherwise data is read from the addressed YDRVS 110S or SYDRVS 114S.

Figure 19B:
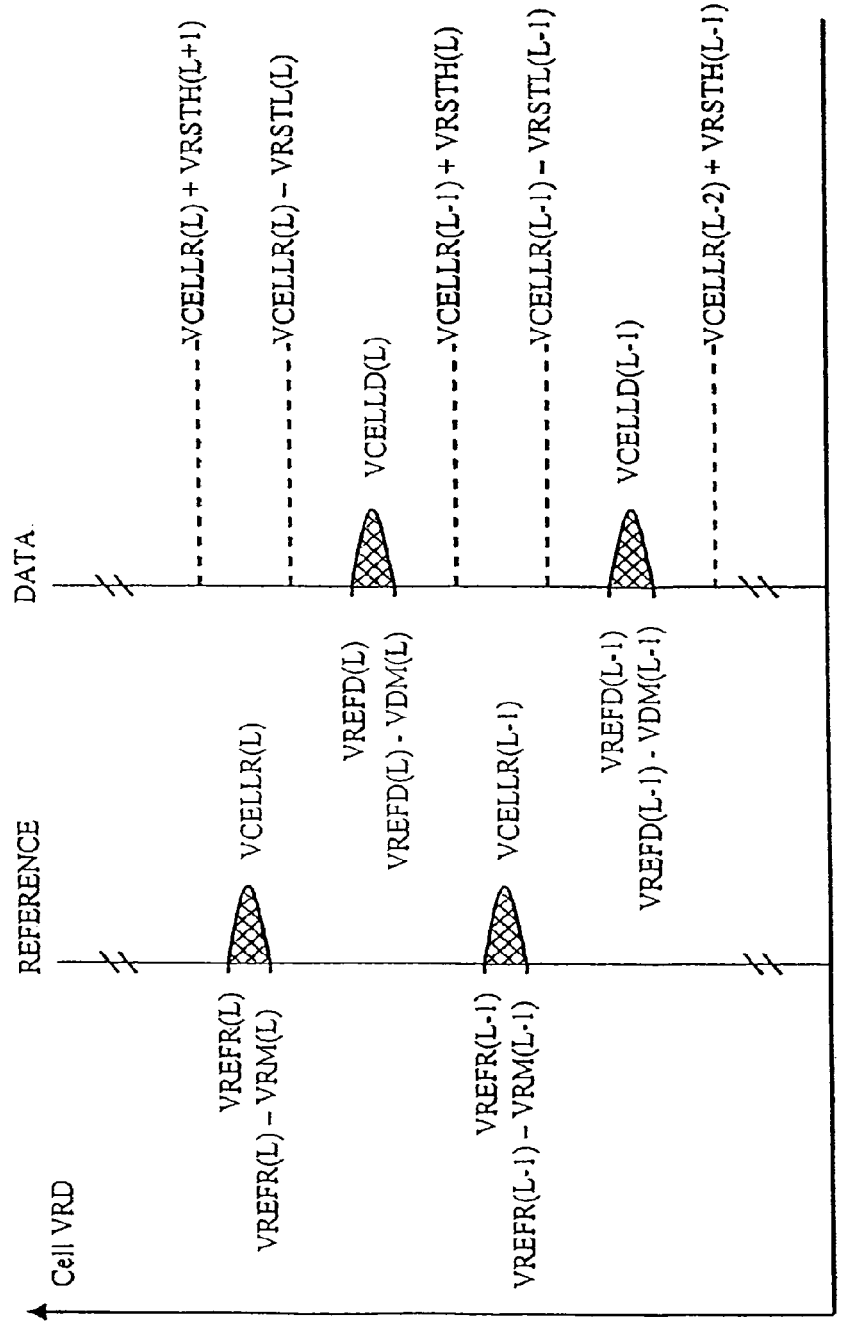
FIG. 19B shows voltage levels for program verify, margin, read, and restore for an alternative embodiment of the current invention.

FIG. 19B shows various voltages generated and used in another embodiment of the current invention for program verifying, program margin verifying, read sensing and restore high or low margin verifying. In this embodiment the program margin verify voltage VREFR(L)-VRM(L) and VREFD(L)-DM(L) for a level L of a reference cell and a data cell respectively, are generated by the block V&IREF 172 independent of the voltages VCELLR(L) and VCELLD(L) programmed into the reference cell and data cell respectively. The voltage VRM(L) for a level L of the reference cells can be unique for each level or the same for all levels. The voltage VDM(L) for a level L of the data cells can be unique for each level or the same for all levels.

FIG. 22B shows the portion of the flow for the page programming cycle that uses the voltages as shown in FIG. 19B. In the flow shown in FIG. 22B, only one program margin verify comparison is made instead of two as shown in FIG. 22A. This has the advantage of reducing the total time for completion of a page programming cycle.

Figure 22C:
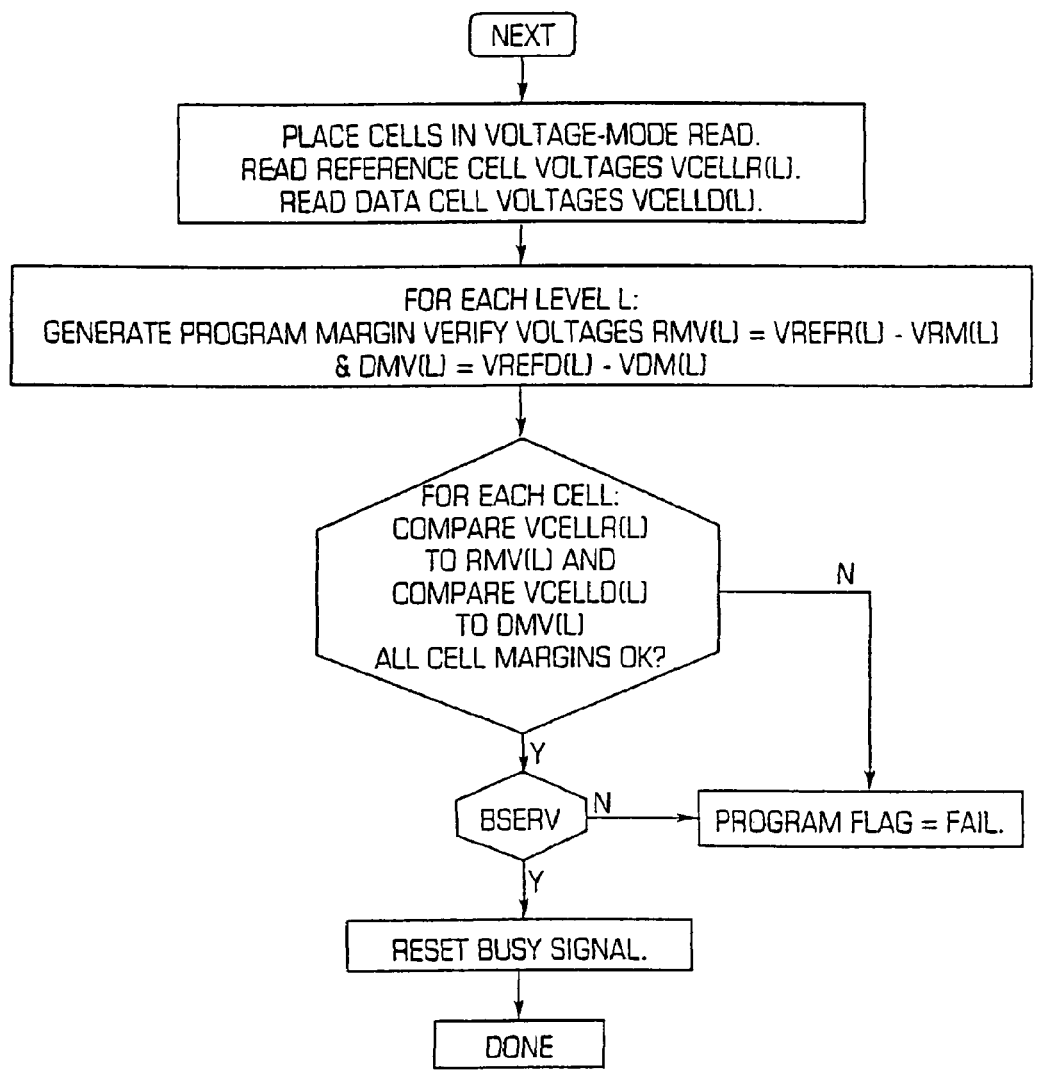
FIG. 22C shows an alternate embodiment of the flow diagram shown in FIG. 22B.

FIG. 22C shows an alternative embodiment of the flow shown in FIG. 22B. At the end of the programming, a BSERV operation is done to verify that the read operation is operational versus the data in. The BSERV operation is a binary search read verification operation that is substantially the same as described in FIGS. 23 and 24 with the additional step of comparing resulting digital bits BR<3:0> from the binary search with a stored digital bits B<3:0> from loading data in. If the comparison is not true, the program flag is set to indicate program failure. The operation further ensures that all cells are within an operational range, for example not out of range due to programming overshoot to the next levels.

The embodiment shown in FIGS. 19B and 22B can be used in combination with the embodiment shown in FIGS. 19A and 22A. As discussed in the multilevel reference system section above, the embodiment shown in FIGS. 19B and 22B can be used when a selected page programs for the first time after block erase. For subsequent page programming cycles on the same page, the embodiment shown in FIGS. 19A and 22A is advantageous since the VCELLR(L) values may shift between initial page programming and subsequent page programming.

Figure 28:
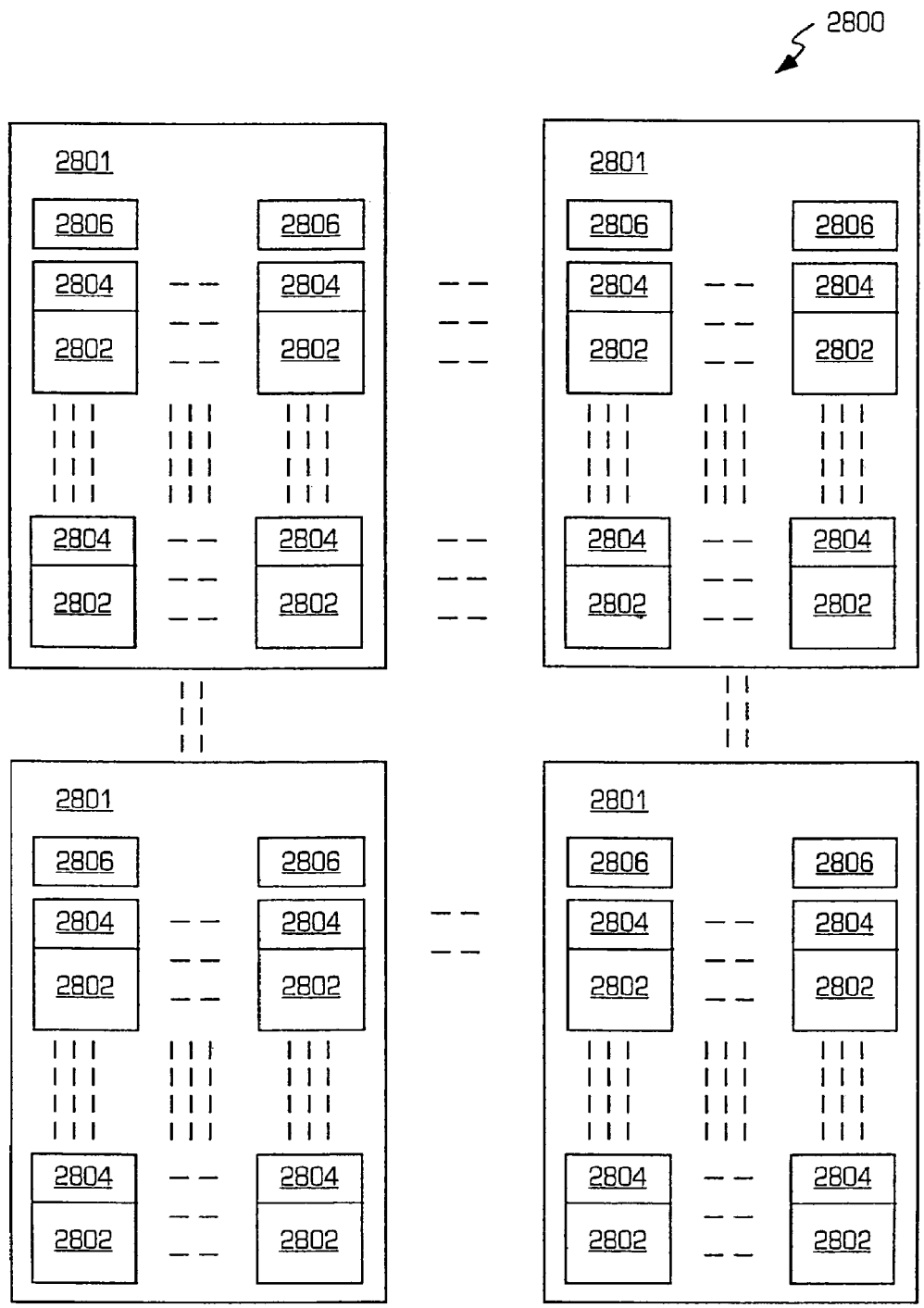
FIG. 28 is a block diagram illustrating a memory system for a multilevel memory.

FIG. 28 is a block diagram illustrating a memory system 2800 for a multilevel memory.

The memory cell 2800 comprises a plurality of memory arrays 2801 arranged in rows and columns of memory arrays 2801. Each memory array 2801 comprises a plurality of memory subarrays 2802, a plurality of local sense amplifiers 2804, and a plurality of global sense amplifiers 2806. In one embodiment, a local sense amplifier 2804 is disposed adjacent to a memory subarray 2802. In another embodiment, the local sense amplifier 2804 is shared between a plurality of memory subarrays 2802. The local sense amplifier 2804 reads the contents of the memory cells with the corresponding memory subarray 2802. The memory subarrays 2802 are arranged in rows and columns. The local sense amplifiers 2804 coupled to a column of memory subarrays 2802 are coupled to a global sense amplifier 2806. The memory cells may include redundant cells, reference cells or spare cells.

Figure 29A:
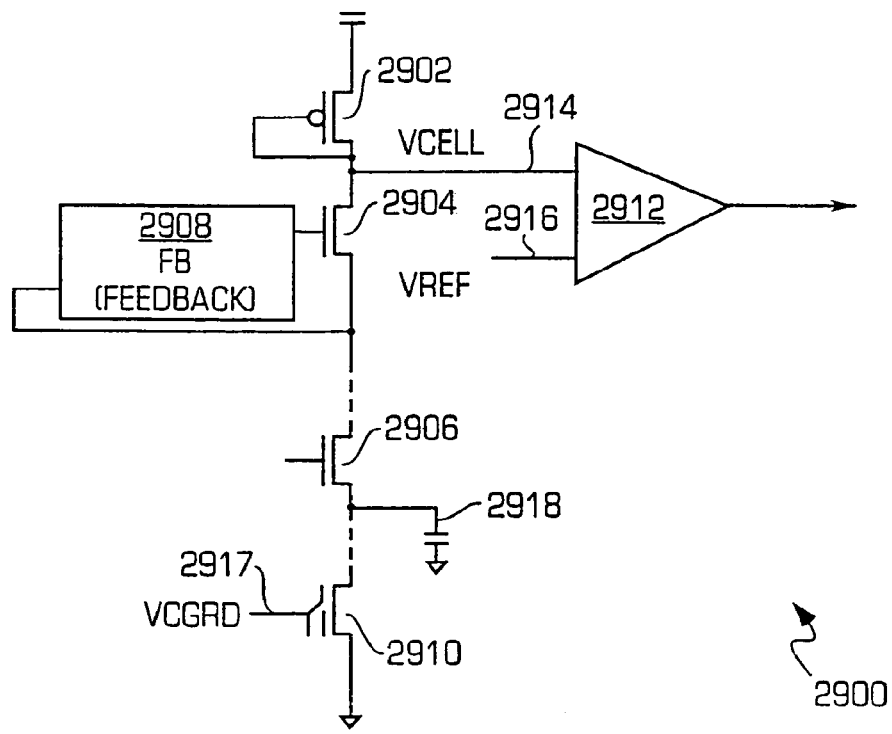
FIG. 29A is a block diagram illustrating an inverter mode sensing circuit.

FIG. 29A is a block diagram illustrating an inverter mode sensing circuit 2900.

The inverter mode sensing circuit 2900 comprises a PMOS transistor 2902, a plurality of NMOS transistors 2904 and 2906, a feedback circuit 2908, a plurality of memory cells 2910, and a comparator 2912. For clarity, only one memory cell 2910 and one NMOS transistor 2906 are shown for a subarray, but the subarray comprises a plurality of memory cells 2910 arranged in columns. Each column has a corresponding NMOS transistor 2906 or a plurality of NMOS transistors 2906 arranged in series. Only one column with one memory cell 2910 is shown.

The comparator 2912 determines the voltage of the memory cell by comparing the cell voltage (VCELL) 2914 to a reference voltage (VREF) 2916 in a manner described above. The PMOS transistor 2902, the NMOS transistors 2904 and 2906 and the memory cells 2910 are coupled in series between the supply voltage and ground. The selected memory cell 2910 is read by applying a control gate reference voltage (VCGRD) 2917 on the control gate of the memory cell 2910. The column of memory cells 2910 and an associated bit line has a capacitance 2918 that slows the sensing of the memory cells 2910. The NMOS transistor 2906 functions as a switch to couple the column of memory cells 2910 to the sensing portion of the circuit. The feedback circuit 2908 controls biasing of the NMOS transistor 2904 to stabilize the cell voltage 2914. The drain of the diode connected PMOS transistor 2902 is coupled to the cell voltage 2914. Inverter mode sensing may also be referred to as current mode sensing or common source sensing.

Figure 29B:
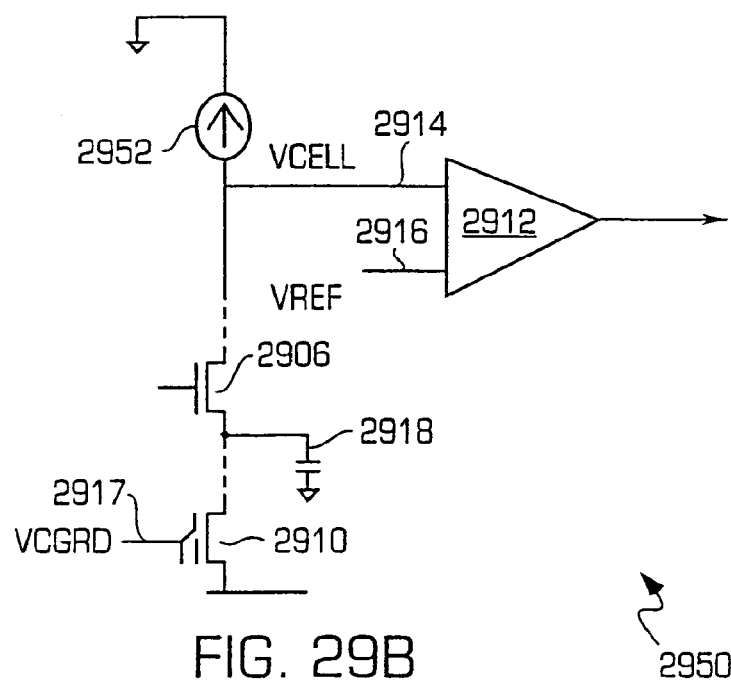
FIG. 29B is a block diagram illustrating a voltage mode sensing circuit.

FIG. 29B is a block diagram illustrating a voltage mode sensing circuit 2950.

The voltage sensing circuit 2950 is similar to the inverter mode sensing circuit 2900 except that a current source 2952 replaces the PMOS transistor 2902 and is coupled to ground, the memory cell 2910 is coupled to a reference bias, and the NMOS transistor 2904 and the feedback circuit 2908 are omitted. The voltage mode sensing may also be referred to as source follower sensing.

Figure 30:
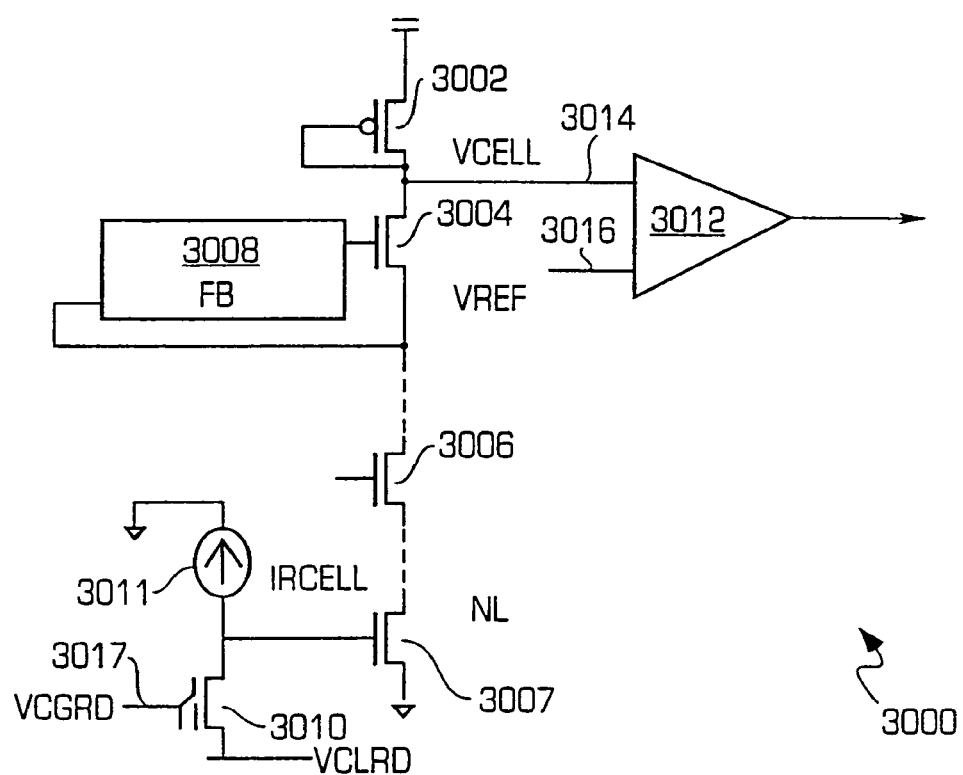
FIG. 30 is a block diagram illustrating a wide range, high speed voltage mode sensing circuit.

FIG. 30 is a block diagram illustrating a wide range, high speed voltage mode sensing circuit 3000.

The memory array 2800 includes a plurality of voltage mode sensing circuits 3000. The voltage mode sensing circuit 3000 comprises a PMOS transistor 3002, a plurality of NMOS transistors 3004, 3006, 3007, a feedback circuit 3008, a plurality of memory cells 3010, a current source (IRCELL) 3011, and a comparator 3012. For clarity, only one memory cell 3010, one NMOS transistor 3006, and one NMOS transistor 3007 are shown for a subarray, but the subarray comprises a plurality of memory cells 3010 arranged in columns. Each column has a corresponding NMOS transistor 3006. Only one column with one memory cell 3010 is shown. Possible decoding circuitry between the current source 3011 and the memory cell 3010 and between the current source 3011 and the NMOS transistor 3007 is not shown.

The comparator 3012 determines the voltage of the memory cell by comparing a cell voltage (VCELL) 3014 to a reference voltage (VREF) 3016 in a manner described above. The PMOS transistor 3002, the NMOS transistors 3004, 3006 and 3007 are coupled in series between the supply voltage and ground. The current source 3011 is coupled between the gate of the NMOS transistor 3002 and ground. The memory cell 3010 is coupled between a reference voltage (VCLRD) and the common node formed of the current source 3011 and the gate of the NMOS transistor 3007.

The selected memory cell 3010 is read by applying a control gate reference voltage (VCGRD) 3017 on the control gate of the memory cell 3010. The biasing of the gate of the NMOS transistor 3007 by the current source 3011 and the memory cell 3010 controls the voltage on the bit line.

The NMOS transistor 3006 functions as a switch to couple the column of NMOS transistors 3007 and the associated memory cells 3010 to the sensing portion of the circuit. The feedback circuit 3008 controls biasing of the NMOS transistor 3004 to stabilize the cell voltage 3014. The drain of the diode connected PMOS transistor 3002 is coupled to the cell voltage 3014.

Figure 31:
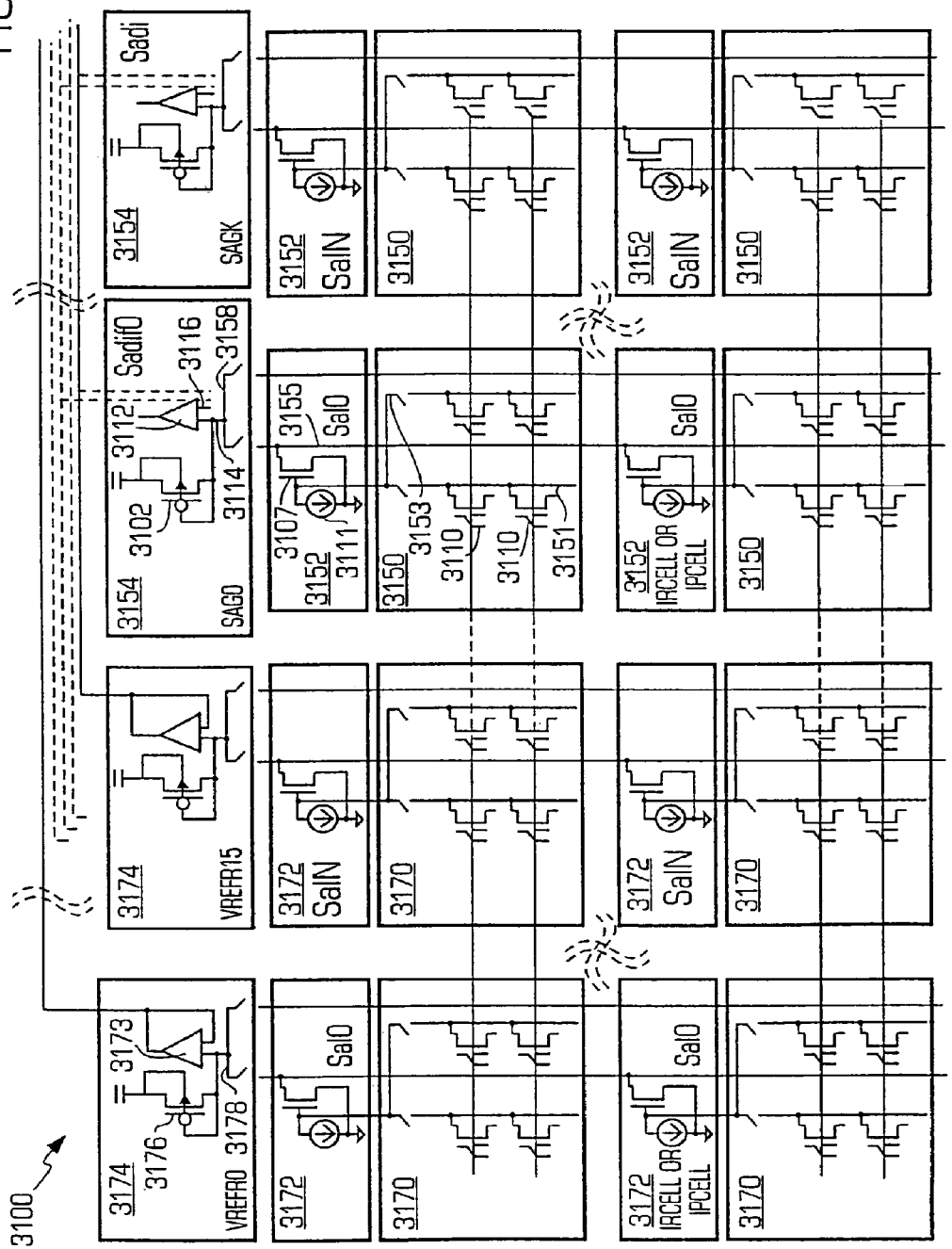
FIG. 31 is a block diagram illustrating a wide range, high speed mode sensing circuit having a local source follower stage and a global common source stage.

FIG. 31 is a block diagram illustrating a voltage mode sensing circuit 3100.

The voltage mode sensing circuit 3100 comprises a plurality of memory subarrays 3150, a plurality of local sense amplifiers 3152, and a plurality of global sense amplifiers 3154. The local sense amplifier 3152 includes a local source follower stage. The global sense amplifier 3154 includes a common source stage.

The memory array 3150 includes columns of memory cells 3110 coupled to first bitlines 3151.

Each local sense amplifier 3152 is coupled to a memory subarray 3150. In one embodiment, the local sense amplifier 3152 is disposed adjacent the memory subarray 3150. The local sense amplifier 3152 includes a selection circuit 3153 that couples a selected bitline 3151 to a bitline 3155. In one embodiment, the selection circuit 3153 comprises transistors. The local sense amplifier 3152 senses the selected memory cell on the bitline 3151 and provides a voltage to a global sense amplifier 3154.

The local sense amplifier 3152 comprises an NMOS transistor 3107 coupled between the bitline 3155 and ground, and includes a gate coupled to the bitline 3151. A current source 3111 is coupled between the gate of the NMOS transistor 3107 and ground.

The global sense amplifier 3154 comprises a comparator 3112, a PMOS transistor 3102 and a selection circuit 3158. The selection circuit 3158 couples the selected one of the bitlines 3155 to a common node formed of a voltage cell input 3114 of the comparator 3112 and the drain of the diode connected PMOS transistor 3102. A reference voltage 3116 is applied to the second input of the comparator 3112.

The local sense amplifier 3152 provides a larger voltage range by using optimally low current bias. The global sense amplifier 3154 includes a common source stage with a PMOS transistor 3114 as a load, and buffers the column capacitance.

The voltage mode sensing circuit 3100 further comprises a plurality of reference subarrays 3170, a plurality of local sense amplifiers 3172, and a plurality of global sense amplifiers 3174. The reference subarrays 3170 comprise a plurality of reference cells for storing reference signals. In one embodiment, the reference subarrays 3170 are similar to the memory subarrays 3150. The local sense amplifiers 3172 read the reference subarrays 3170. In one embodiment, the local sense amplifiers 3172 are similar to the local sense amplifiers 3152. The global sense amplifiers 3174 detect and amplify the voltage from the local sense amplifiers 3172.

The global sense amplifier 3174 comprises a comparator 3173, a PMOS transistor 3174 and a selection circuit 3178, which are arranged in similar manner as the comparator 3112, the PMOS transistor 3102 and the selection circuit 3158 of the global sense amplifier 3154, except the comparator 3173 is configured as a buffer. The comparator 3173 serves as a comparator in sensing the reference cells and serves as a buffer for driving the reference level.

Figure 32:
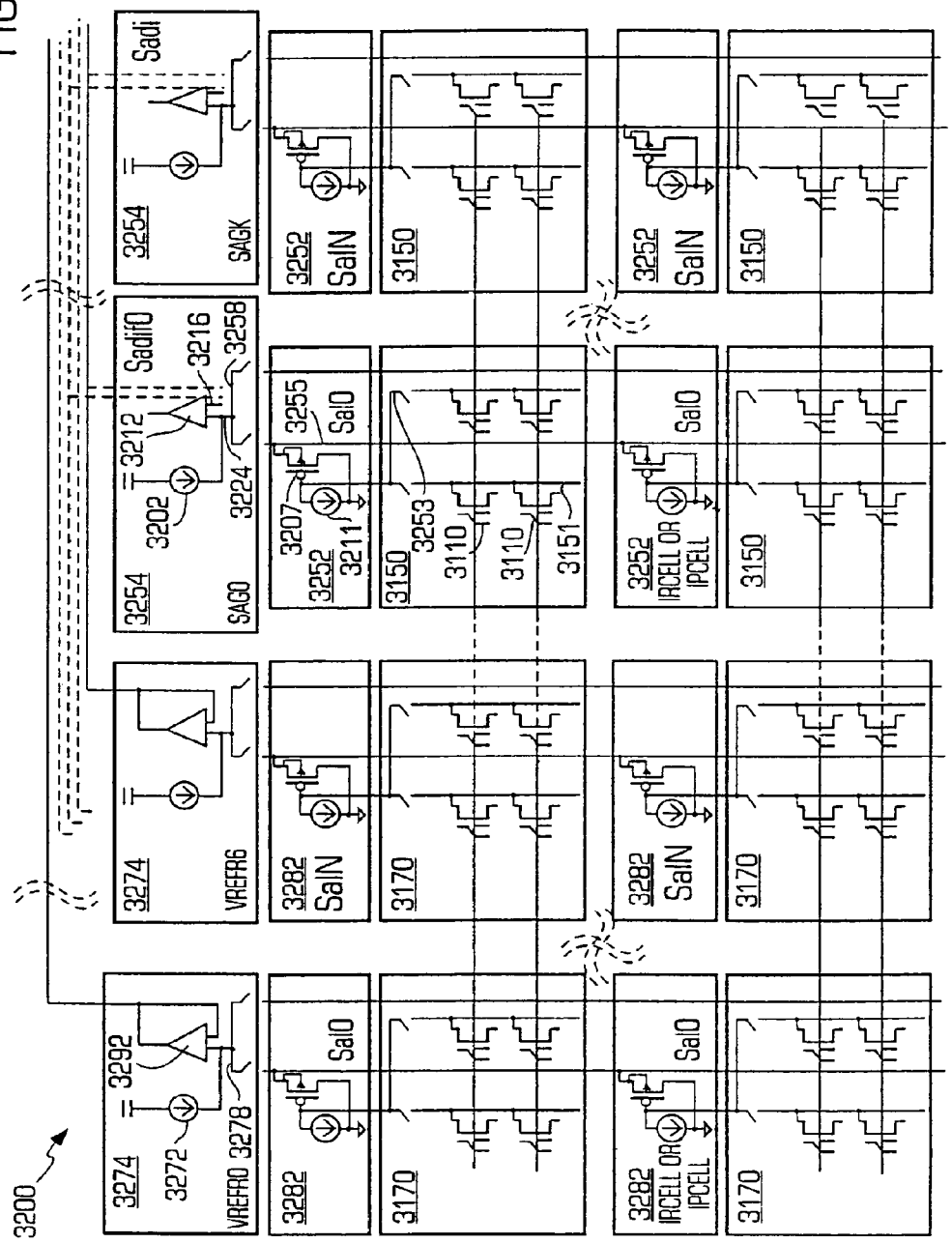
FIG. 32 is a block diagram illustrating a wide range, high speed mode sensing circuit with a local PMOS source follower stage and a global source follower stage.

FIG. 32 is a block diagram illustrating a voltage mode sensing circuit 3200.

The voltage mode sensing circuit 3200 includes like elements as the voltage mode sensing circuit 3100 (FIG. 31) and are given like reference numbers. The voltage mode sensing circuit 3200 comprises a memory array 3150, a plurality of local sense amplifiers 3252 and a plurality of global sense amplifiers 3254. The local sense amplifier 3252 includes a local source follower stage and includes a PMOS source follower as part of the global sense amplifier. The global sense amplifier 3254 includes a source follower stage.

Each local sense amplifier 3252 is coupled to a memory subarray 3150. In one embodiment, the local sense amplifier 3252 is disposed adjacent the memory subarray 3150. The local sense amplifier 3252 includes a selection circuit 3253 that couples a selected bitline 3151 to a bitline 3255. In one embodiment, the selection circuit 3253 comprises transistors.

The local sense amplifier 3252 senses the selected memory cell on the bitline 3151 and provides a voltage to a global sense amplifier 3254.

The local sense amplifier 3252 comprises a PMOS transistor 3207 coupled between the bitline 3255 and ground, and includes a gate coupled to the bitline 3151. A current source 3211 is coupled between the gate of the PMOS transistor 3207 and ground. The local sense amplifier 3252 provides a maximum voltage range by using low current bias.

The global sense amplifier 3254 comprises a comparator 3212, a current source 3202 and a selection circuit 3258. The current source 3202 couples the supply voltage to the cell voltage terminal 3214 of the comparator 3212 to ground. The selection circuit 3258 couples the selected one of the bitlines 3255 to a common node formed of a voltage cell input 3214 of the comparator 3212 and the current source 3202. A reference voltage 3216 is applied to the second input of the comparator 3212.

The global sense amplifier 3254 buffers the column capacitance.

The voltage mode sensing circuit 3200 further comprises a plurality of reference subarrays 3170, a plurality of local sense amplifiers 3282, and a plurality of global sense amplifiers 3274. The reference subarrays 3170 comprise a plurality of reference cells for storing reference signals. In one embodiment, the reference subarrays 3170 are similar to the memory subarrays 3150. The local sense amplifiers 3282 read the reference subarrays 3170. In one embodiment, the local sense amplifiers 3282 are similar to the local sense amplifiers 3252. The global sense amplifiers 3274 detect and amplify the voltage from the local sense amplifiers 3282.

The global sense amplifier 3274 comprises a comparator 3292, a current source 3272 and a selection circuit 3278, which are arranged in similar manner as the comparator 3212, the current source 3202 and the selection circuit 3258 of the global sense amplifier 3254, except the comparator 3292 is configured as a buffer. The comparator 3292 serves as a comparator in sensing the reference cells and serves as a buffer for driving the reference level.

Figure 33:
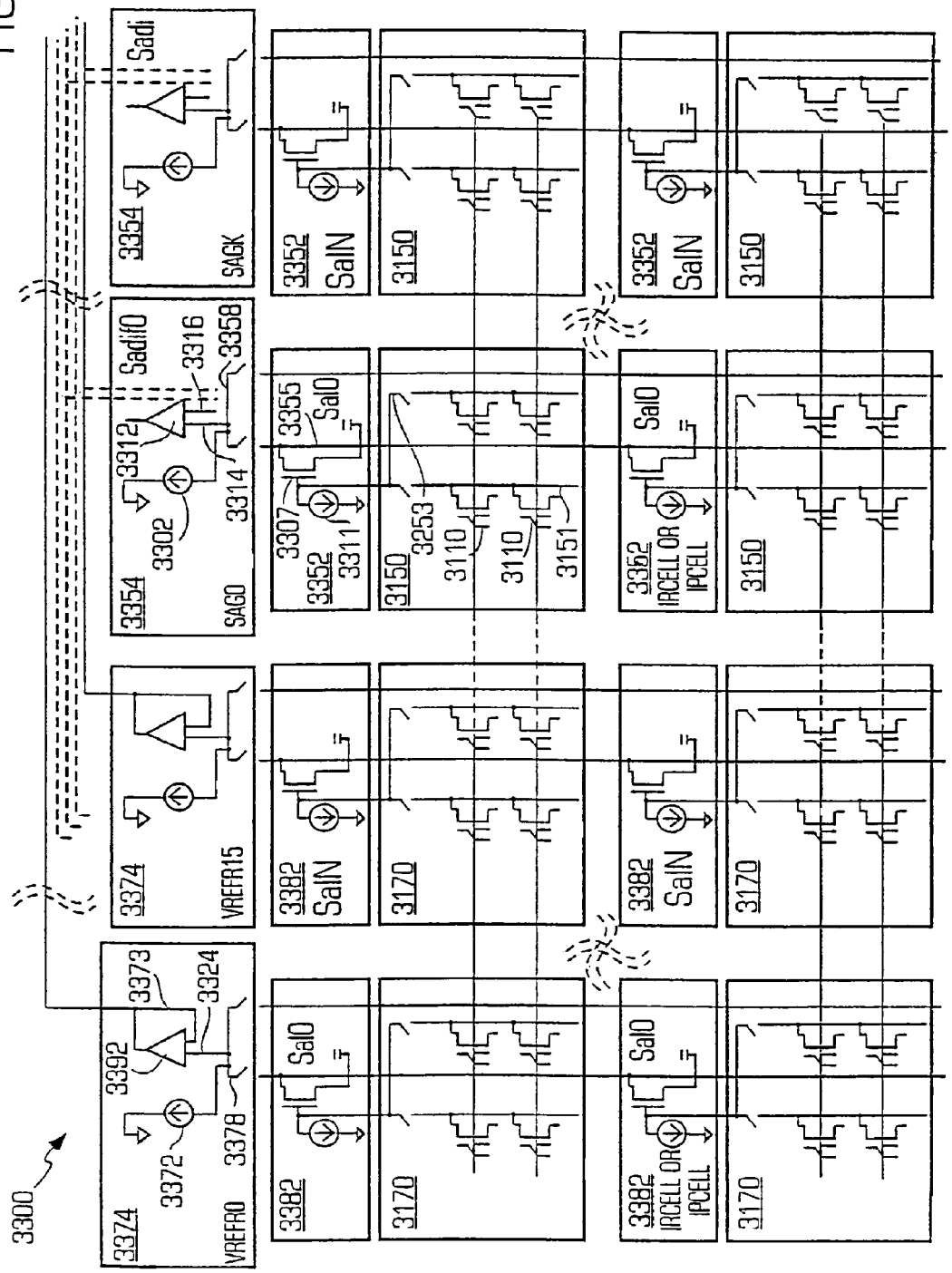
FIG. 33 is a block diagram illustrating a wide range, high speed mode sensing circuit with a local NMOS source follower stage and a global source following stage.

FIG. 33 is a block diagram illustrating voltage mode sensing circuit 3300.

The voltage mode sensing circuit 3300 includes like elements as the voltage mode sensing circuit 3200 (FIG. 32) and are given like reference numbers. The voltage mode sensing circuit 3300 comprises a memory array 3150, a plurality of local sense amplifiers 3352 and a plurality of global sense amplifiers 3354. The local sense amplifier 3352 includes a local source follower stage and includes an NMOS source follower as part of the global sense amplifier. The global sense amplifier 3354 includes a source follower stage.

Each local sense amplifier 3352 is coupled to a memory subarray 3150. In one embodiment, the local sense amplifier 3352 is disposed adjacent the memory subarray 3150. The local sense amplifier 3352 includes a selection circuit 3253 that couples a selected bitline 3151 to a bitline 3355. In one embodiment, the selection circuit 3253 comprises transistor. The local sense amplifier 3252 senses the selected memory cell on the bitline 3151 and provides a voltage to a global sense amplifier 3254.

The local sense amplifier 3352 comprises an NMOS transistor 3307 coupled between the bitline 3355 and a supply voltage terminal, and includes a gate coupled to the bitline 3151. A current source 3311 is coupled between the gate of the NMOS transistor 3307 and ground. The local sense amplifier 3252 provides a maximum voltage range by using low current bias.

The global sense amplifier 3354 comprises a comparator 3312, a current source 3302 and a selection circuit 3358. The current source 3302 couples the voltage terminal 3314 of the comparator 3312 to a ground terminal. The selection circuit 3358 couples the selected one of the bitlines 3355 to a common node formed of a voltage cell input 3314 of the comparator 3312 and the current source 3302. A reference voltage 3316 is applied to the second input of the comparator 3312. The global sense amplifier 3354 is selectively coupled to the bitline to compare the cell voltage to a reference voltage 3316. The global sense amplifier 3354 buffers the column capacitance.

The voltage mode sensing circuit 3300 further comprises a plurality of reference subarrays 3170, a plurality of local sense amplifiers 3382, and a plurality of global sense amplifiers 3374. The reference subarrays 3170 comprise a plurality of reference cells for storing reference signals. In one embodiment, the reference subarrays 3170 are similar to the memory subarrays 3150. The local sense amplifiers 3382 read the reference subarrays 3170. In one embodiment, the local sense amplifiers 3382 are similar to the local sense amplifiers 3352. The global sense amplifiers 3374 detect and amplify the voltage from the local sense amplifiers 3382.

The global sense amplifier 3374 comprises a comparator 3392, a current source 3372 and a selection circuit 3378, which are arranged in similar manner as the comparator 3312, the current source 3302 and the selection circuit 3358 of the global sense amplifier 3354, except the comparator 3392 is configured as a buffer. The comparator 3392 serves as a comparator in sensing the reference cells and serves as a buffer for driving the reference level.

In another embodiment, the local sense amplifier is a common source amplifier, and the global sense amplifiers are NMOS source follower stages or PMOS source follower stages.

In another embodiment, the local sense amplifier is a common source amplifier, and the global sense amplifiers are common source amplifiers.

Figure 34:
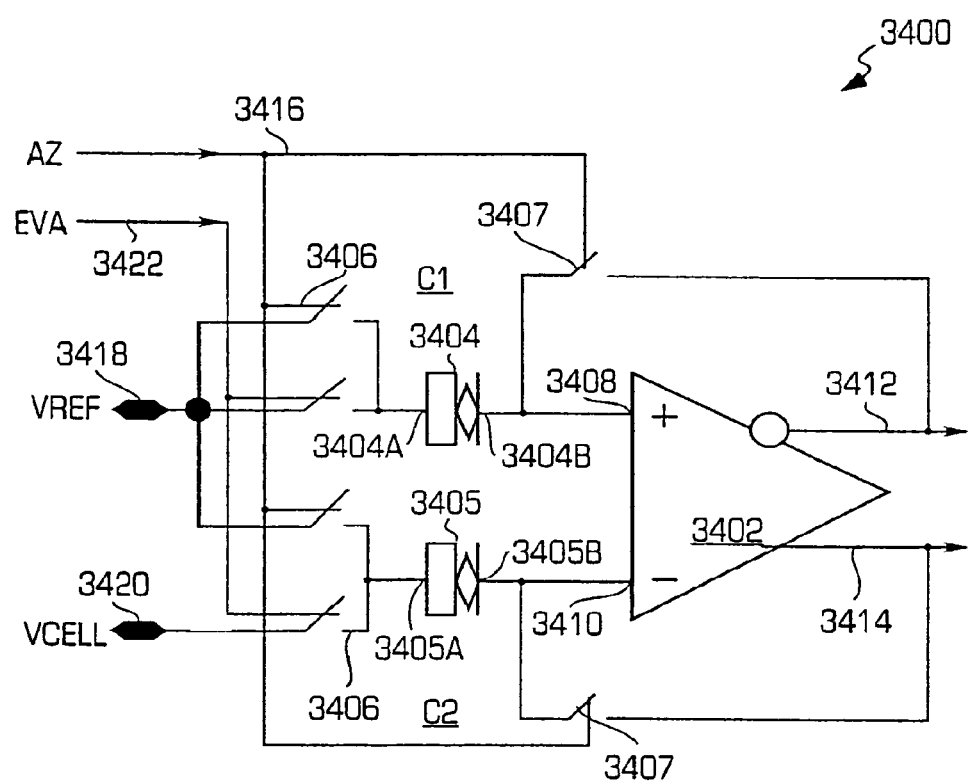
FIG. 34 is a block diagram illustrating a global sense amplifier having an auto zeroing function.

FIG. 34 is a block diagram illustrating a global sense amplifier 3400 having an auto zeroing function.

The comparators 3012, 3112, 3212, and 3312 of FIGS. 30-33 may be the global sense amplifier 3400.

The sense amplifier 3400 comprises an operational amplifier 3402, a pair of capacitors 3404 and 3405, and a plurality of switches 3406 and 3407.

The capacitors 3404 and 3405 couples respective inputs 3408 and 3410 of the operational amplifier 3402 to the switch 3406.

In response to an auto zero (AZ) command 3416, the switches 3407 selectively couples an output 3412 of the operational amplifier 3402 to the input 3408 to equalize the voltages on the output 3412 and input 3408, and selectively couples an output 3414 of the operational amplifier 3402 to the input 3410 to equalize the output 3414 and the input 3410. In the auto zero mode, the voltage on A terminals of the capacitors 3404 and 3405 are set equal to the reference voltage (VREF) 3418, and the B terminals of the capacitors 3404 and 3405 are equalized to the complementary outputs of the operational amplifier 3402. The switch 3406 is switched by an evaluation (EVA) command 3422 to connect the cell voltage (VCELL) 3420 to the other end of the capacitor 3405 for comparison from the operational amplifier 3402.

The switch 3406 selectively applies the reference voltage (VREF) 3418 to the capacitor 3404 in response to the evaluation (EVA) command 3422. The switch 3406 also selectively applies either the reference voltage (VREF) 3418 or a cell voltage (VCELL) 3420 to the capacitor 3405 in response to the evaluation (EVA) command 3422. The evaluation command 3422 equalizes the signals on terminals 3404A and 3505A of the capacitors 3404 and 3405.

In an alternate embodiment, the nodes 3404B and 3405B of the capacitors 3404 and 3405 are reset to a fixed bias voltage. In another embodiment, the nodes 3404B and 3405B of the capacitors 3404 and 3405 are shorted together.

By using a capacitor for sensing, the input common load range to the operational amplifier (or comparator) is substantially constant and independent of the memory cell voltage or current.

Figure 35:
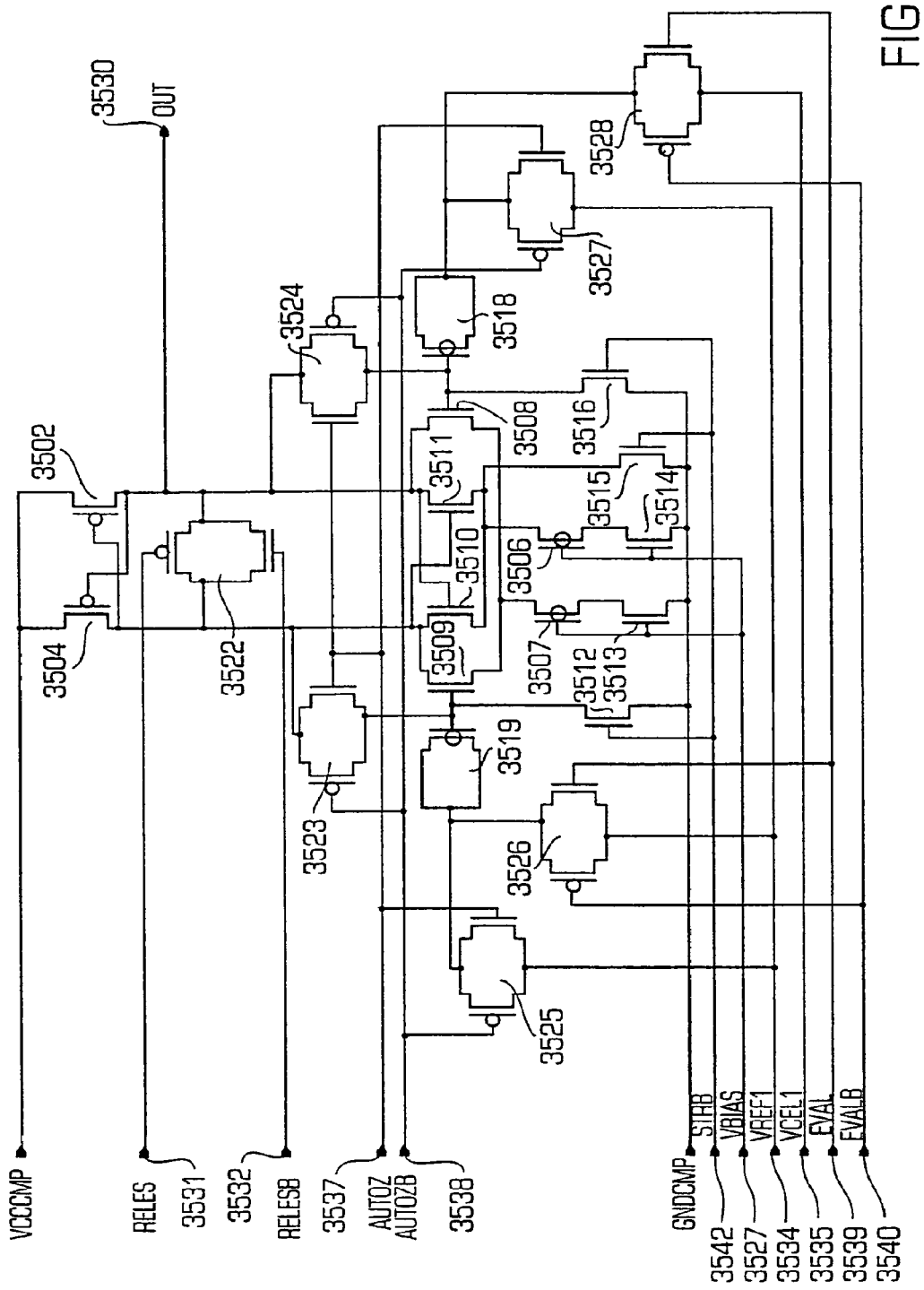
FIG. 35 is a block diagram illustrating an auto zero sense amplifier.

FIG. 35 is a block diagram illustrating an auto zero sense amplifier 3500.

The autozero sense amplifier 3500 comprises a plurality of PMOS transistors 3502 and 3504, a plurality of NZ NMOS transistors 3506 and 3507, a plurality of NMOS transistors 3508 through 3516, a plurality of capacitors 3518 and 3519 and a plurality of transfer gates 3522 through 3528.

The PMOS transistors 3502 and 3504 and the NMOS transistors 3508, 3509 and 3513 and the NZ NMOS transistor 3507 are arranged as a differential pair. The NMOS transistors 3508 and 3509 provide the differential input pair. The NZ NMOS transistor 3507 and the NMOS transistor 3513 provide bias for the NMOS transistor 3508 and 3509. The PMOS transistors 3502 and 3504 are coupled for cross-coupled loading. The PMOS transistor 3502 is coupled between the supply voltage and an output terminal 3530. A bias voltage 3529 is applied to the gates of the NZ NMOS transistors 3506 and 3507 and the NMOS transistors 3513 and 3514.

The NMOS transistors 3510 and 3511 provide an NMOS coupled internal latch, which is active while the differential input pair is on. The drain of the NMOS transistor 3510 is coupled to the drain of the NMOS transistor 3509 and the gate of the NMOS transistor 3511. The drain of the NMOS transistor 3511 is coupled to a common node formed of the drain of the NMOS transistor 3508 and gate of the NMOS transistor 3510. The NZ NMOS transistor 3506 and the NMOS transistor 3514 provide bias for the NMOS transistors 3510 and 3511 and are coupled between the common node formed of the sources of the NMOS transistors 3510 and 3511, and ground.

The transfer gate 3522 couples the drains of the PMOS transistors 3502 and 3504 and the output 3530 to each other for equalization and quick recovery for the next comparison in response to a release signal 3531 and an inverted release signal 3532.

The capacitor 3519 couples the gate of the NMOS transistor 3509 to first terminals of the transfer gates 3525 and 3526 which include a second terminal coupled to a reference voltage 3534. The capacitor 3518 couples the gate of the NMOS transistor 3508 into first terminals of the transfer gates 3527 and 3528, which have second terminals coupled to the reference voltage 3534 and a cell voltage 3535, respectively. The transfer gates 3525 and 3527 are controlled by a auto zero signal 3537 and an inverted auto zero signal 3538. The transfer gates 3526 and 3528 are controlled by evaluation signals 3539 and 3540.

The transfer gates 3523 and 3524 couple the drains of the PMOS transistors 3504 and 3502, respectively, to the gates of the NMOS transistors 3509 and 3508, respectively, in response to the auto zero signal 3537 and inverted auto zero signal 3538. The NMOS transistors 3512 and 3516 couple the gates of the NMOS transistors 3509 and 3508, respectively, to ground in response to a strobe signal 3542 to pull down the transistors 3509 and 3508 to turn off the differential pair. The NMOS transistor 3515 couples the sources of the NMOS transistors 3510 and 3511 to the ground in response to the strobe signal 3542 for full level latching.

The array architectures described herein may enable multilevel parallel operation.

A pipelined read operation may be as follows. A first row is selected in a selected subarray, such as subarray 2802 or subarray 3150/3170, and the content of selected memory cells are coupled to the local bitline and to the global bitlines while a second row in another subarray 2802 or 3150/3170 is selected and the content of the selected memory cells are coupled to the local bitlines but not yet coupled to the global bitlines. After the read operation completes processing the data of the first row, the data of the second row is enabled to couple to the global bitlines to continue the read operation, and a third row in a different subarray 2802 or 3150/3170 is selected to enable the content of the selected memory cells to couple to the local biltines but not yet to the global bitlines. This cycle continues until all desired data are read out. This, for example, enables continuous read of multilevel memory cells.

In another embodiment, pipelined read operation is performed by operating on memory cells in a row in an array, such as memory array 2801, while another row in another memory array 2801 is selected to enable the contents of the memory cells to be ready.

A read-while-read operation may be as follows. A read operation operates on both arrays, such as memory array 2801 (or memory subarrays 2802 or 3150), simultaneously and the data are available from both arrays possibly at the same time. In this case, for example, data latches are used to latch the data from both arrays. In another embodiment, two sets of data lines may be used to transfer the data from both arrays to an on-chip controller.

A read/write-while-write/read operation may be as follows. Similarly while one operation, e.g., read, is executed on an array, such as subarray 2802 or array 2801 or subarrays 3150/3170, another operation is executed, e.g., write, on another array such as subarray 2802 or 2801 or subarray 3150/3170. This is possible because control circuits associated with decoding and sensing and/or writing may be embedded for each array.

A read/erase-while-erase/read may be as follows. Similarly while one operation, e.g., read, is executed on an array, such as subarray 2802 or 2801 or subarray 3150/3170, another operation is executed, e.g., erase, on another array such as subarray 2802 or 2801 or subarray 3150/3170. This is possible because each array may have its own decoders and embedded control circuits associated with sensing.

An erase-while-erase operation may be as follows. Similarly while one erase operation is executed on an array, such as subarray 2802 or 2801 or subarray 3150/3170, another erase operation is executed on another array, such as subarray 2802 or 2801 or subarray 3150/3170. This is possible because each array may have its own decoders.

A write/erase-while-erase/write operation may be as follows. Similarly while one operation, e.g., write, is executed on an array, such as subarray 2802 or array 2801 or subarrays 3150/3170, another operation is executed, e.g., erase, on another array such as subarray 2802 or 2801 or subarray 3150/3170. This is possible because each array may have its own decoders and embedded control circuits associated with sensing and/or writing.

A write-while-write operation may be as follows. Similarly while one write operation is executed on an array, such as subarray 2802 or 2801 or subarray 3150/3170, another write operation is executed on another array, such as subarray 2802 or 2801 or subarray 3150/3170. This is possible because each array may have its own decoders and embedded control circuits associated with sensing and/or writing.

In the foregoing description of various method and apparatus, it was referring to various specific embodiments. However it should be obvious to the one conversant in the art, various alternatives, modifications, and changes may be possible without departing from the spirit and the scope of the invention which is defined by the metes and bounds of the appended claims.

What is claimed is:

1. A method of programming a multilevel memory cell, the method comprising:
determine whether a margin of read said memory cell matches a certain criteria;
setting a program fail flag in the event the margin does not match said criteria;
perform binary search to determine data corresponding to content of read memory cell; and
allowing access to said memory cell.

2. The method of claim 1 further comprising:
processing upper program margin verify voltages; and
comparing the upper program margin verify voltages with read back cell voltages to determine whether to end the page programming sequence for a current page.

3. The method of claim 1 further comprising:
processing lower program margin verify voltages; and
comparing the lower program margin verify voltages with read back cell voltages to determine whether to end the page programming sequence for a current page.

4. The method of claim 1 further comprising entering an upper margin verify mode.

5. The method of claim 1 further comprising entering a lower margin verify mode.

6. The method of claim 1 further comprising autozeroing an input and output in order to zero out offset in an amplifier.

7. The method of claim 1 further comprising capacitively sensing an output of a memory cell via selective coupling of the reference sense amplifier to one or more reference memory subarrays.

8. The method of claim 1 further comprising selectively coupling the reference sense amplifier to a group of sense amplifiers to capacitively sense an output associated with the group of sense amplifiers.

9. The method of claim 1 further comprising:
coupling a reference array to reference memory subarrays; and
provide stored reference signals used for reading reference memory cells, the stored reference signals corresponding to detected reference signals.

10. A system comprising:
one or more circuits configured for programming a multilevel memory cell, the one or more circuits configured to:
determine whether a read margin of said memory cell matches a certain criteria;
set a program fail flag in the event the margin does not match said criteria;
perform binary search to determine data corresponding to content of read memory cell; and
allow access to said memory cell.

11. The system of claim 10 wherein the system is configured to:
process upper program margin verify voltages; and
compare the upper program margin verify voltages with read back cell voltages to determine whether to end the page programming sequence for a current page.

12. The system of claim 10 further configured to:
process lower program margin verify voltages; and
compare the lower program margin verify voltages with read back cell voltages to determine whether to end the page programming sequence for a current page.

13. The system of claim 10 wherein the system is configured to enter an upper margin verify mode.

14. The system of claim 10 wherein the system is configured to enter a lower margin verify mode.

15. The system of claim 10 wherein the system is configured to:
apply an erase algorithm programmed via fuses upon one selected erase block of memory cells at a time.

16. The system of claim 15 wherein erase blocks include a plurality of pages of memory cells.

17. The system of claim 15 wherein quantities of pages within the erase blocks are programmable via fuses for different user requirements and/or applications.

18. The system of claim 10 wherein the system is configured to:
apply a read algorithm programmed via fuses upon one selected page of memory cells at a time.

19. The system of claim 18 wherein quantities of memory cells within a page is programmable via fuses to optimize power consumption and/or data rate.

20. A method of reading and/or programming a multilevel memory cell, the method comprising:
determine whether a margin of said memory cell matches a certain criteria;
setting a program fail flag in the event the margin does not match said criteria;
perform binary search to determine data corresponding to content of read memory cell; and
allowing access to said memory cell.

* * * * *